(12) United States Patent
D'Evelyn et al.

(10) Patent No.: US 9,404,197 B2
(45) Date of Patent: Aug. 2, 2016

(54) LARGE AREA, LOW-DEFECT GALLIUM-CONTAINING NITRIDE CRYSTALS, METHOD OF MAKING, AND METHOD OF USE

(75) Inventors: Mark P. D'Evelyn, Santa Barbara, CA (US); Dirk Ehrentraut, Santa Barbara, CA (US); Wenkan Jiang, Corona, CA (US); Bradley C. Downey, Santa Barbara, CA (US)

(73) Assignee: Soraa, Inc., Fremont, CA (US)

( * ) Notice: Subject to any disclaimer, the term of this patent is extended or adjusted under 35 U.S.C. 154(b) by 752 days.

(21) Appl. No.: 13/600,191

(22) Filed: Aug. 30, 2012

(65) Prior Publication Data

US 2014/0065360 A1 Mar. 6, 2014

Related U.S. Application Data

(63) Continuation-in-part of application No. 13/160,307, filed on Jun. 14, 2011, now abandoned, and a continuation-in-part of application No. 12/988,772, filed as application No. PCT/US2010/052175 on Oct. 11, 2010, now Pat. No. 9,175,418, application No. 13/600,191, which is a continuation-in-part of application No. 12/497,969, filed on Jul. 6, 2009, now abandoned.

(60) Provisional application No. 61/386,879, filed on Sep. 27, 2010, provisional application No. 61/356,489, filed on Jun. 18, 2010, provisional application No. 61/250,476, filed on Oct. 9, 2009, provisional application No. 61/078,704, filed on Jul. 7, 2008.

(51) Int. Cl.
 *C30B 29/40* (2006.01)
 *C30B 25/02* (2006.01)

(52) U.S. Cl.
 CPC .............. *C30B 29/406* (2013.01); *C30B 25/02* (2013.01); *Y10T 428/24355* (2015.01)

(58) Field of Classification Search
 CPC  H01L 21/02433; C30B 29/406; C30B 25/02; Y10T 428/24355
 See application file for complete search history.

(56) References Cited

U.S. PATENT DOCUMENTS

| | | | |
|---|---|---|---|
| 4,030,966 | A | 6/1977 | Hornig et al. |
| 4,065,688 | A | 12/1977 | Thornton |
| 4,066,868 | A | 1/1978 | Witkin et al. |

(Continued)

FOREIGN PATENT DOCUMENTS

| | | |
|---|---|---|
| CN | 101061570 | 10/2007 |
| JP | 2005-289797 | 10/2005 |

(Continued)

OTHER PUBLICATIONS

USPTO Notice of Allowance for U.S. Appl. No. 13/419,325 dated Dec. 4, 2012.

(Continued)

*Primary Examiner* — Laura Auer
(74) *Attorney, Agent, or Firm* — Saul Ewing LLP

(57) ABSTRACT

An ultralow defect gallium-containing nitride crystal and methods of making ultralow defect gallium-containing nitride crystals are disclosed. The crystals are useful as substrates for light emitting diodes, laser diodes, transistors, photodetectors, solar cells, and photoelectrochemical water splitting for hydrogen generators.

11 Claims, 28 Drawing Sheets

(56) References Cited

U.S. PATENT DOCUMENTS

| | | |
|---|---|---|
| 4,350,560 A | 9/1982 | Helgeland et al. |
| 4,870,045 A | 9/1989 | Gasper et al. |
| 5,098,673 A | 3/1992 | Engel et al. |
| 5,169,486 A | 12/1992 | Young et al. |
| 6,129,900 A | 10/2000 | Satoh et al. |
| 6,273,948 B1 | 8/2001 | Porowski et al. |
| 6,398,867 B1 | 6/2002 | D'Evelyn et al. |
| 6,406,540 B1 | 6/2002 | Harris et al. |
| 6,528,427 B2 | 3/2003 | Chebi et al. |
| 6,596,079 B1 | 7/2003 | Vaudo et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,252,712 B2 | 8/2007 | Dwilinski et al. |
| 7,279,040 B1 | 10/2007 | Wang |
| 7,316,746 B2 | 1/2008 | D'Evelyn et al. |
| 7,368,015 B2 | 5/2008 | D'Evelyn et al. |
| 7,381,391 B2 | 6/2008 | Spencer et al. |
| 7,420,261 B2 | 9/2008 | Dwilinski et al. |
| 7,470,938 B2 | 12/2008 | Lee et al. |
| 7,550,305 B2 | 6/2009 | Yamagata et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,897,988 B2 | 3/2011 | Chen et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,143,148 B1 | 3/2012 | Raring et al. |
| 8,148,180 B2 | 4/2012 | Felker et al. |
| 8,148,801 B2 | 4/2012 | D'Evelyn |
| 8,153,475 B1 | 4/2012 | Shum et al. |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,313,964 B2 | 11/2012 | Sharma et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,802,471 B1 | 8/2014 | Cich et al. |
| 2001/0011935 A1 | 8/2001 | Lee et al. |
| 2001/0043042 A1 | 11/2001 | Murazaki et al. |
| 2002/0155691 A1 | 10/2002 | Lee et al. |
| 2002/0189532 A1 | 12/2002 | Motoki et al. |
| 2003/0027014 A1 | 2/2003 | Johnson et al. |
| 2003/0047076 A1 | 3/2003 | Liu |
| 2003/0127041 A1* | 7/2003 | Xu et al. ............ 117/2 |
| 2003/0138732 A1 | 7/2003 | Nagase |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0080256 A1 | 4/2004 | Hampden-Smith et al. |
| 2005/0087753 A1 | 4/2005 | D'Evelyn et al. |
| 2005/0098095 A1 | 5/2005 | D'Evelyn et al. |
| 2005/0128469 A1 | 6/2005 | Hall et al. |
| 2005/0152820 A1 | 7/2005 | D'Evelyn et al. |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0096521 A1 | 5/2006 | D'Evelyn et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0240585 A1 | 10/2006 | Epler et al. |
| 2006/0256482 A1 | 11/2006 | Araki et al. |
| 2006/0288927 A1 | 12/2006 | Chodelka et al. |
| 2007/0045200 A1 | 3/2007 | Moon et al. |
| 2007/0057337 A1 | 3/2007 | Kano et al. |
| 2007/0105351 A1 | 5/2007 | Motoki et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0218703 A1 | 9/2007 | Kaeding et al. |
| 2007/0231978 A1 | 10/2007 | Kanamoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0121916 A1 | 5/2008 | Teng et al. |
| 2008/0156254 A1 | 7/2008 | Dwilinski et al. |
| 2008/0193363 A1 | 8/2008 | Tsuji |
| 2009/0081857 A1 | 3/2009 | Hanser et al. |
| 2009/0086475 A1 | 4/2009 | Caruso et al. |
| 2009/0092536 A1 | 4/2009 | Kawabata et al. |
| 2009/0140287 A1* | 6/2009 | Fujiwara et al. ............ 257/103 |
| 2009/0218593 A1 | 9/2009 | Kamikawa et al. |
| 2009/0250686 A1 | 10/2009 | Sato et al. |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0315965 A1 | 12/2009 | Yamagata et al. |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |

(56) References Cited

U.S. PATENT DOCUMENTS

| | | | |
|---|---|---|---|
| 2010/0151194 | A1 | 6/2010 | D'Evelyn |
| 2010/0189981 | A1 | 7/2010 | Poblenz et al. |
| 2010/0243988 | A1* | 9/2010 | Kamikawa et al. ............. 257/13 |
| 2011/0062415 | A1 | 3/2011 | Ohta et al. |
| 2011/0064103 | A1 | 3/2011 | Ohta et al. |
| 2011/0100291 | A1 | 5/2011 | D'Evelyn |
| 2011/0101400 | A1 | 5/2011 | Chu et al. |
| 2011/0101414 | A1 | 5/2011 | Thompson et al. |
| 2011/0124139 | A1 | 5/2011 | Chang |
| 2011/0158275 | A1* | 6/2011 | Yoshizumi et al. ...... 372/44.011 |
| 2011/0183498 | A1 | 7/2011 | D'Evelyn |
| 2011/0186860 | A1 | 8/2011 | Enya et al. |
| 2011/0220912 | A1 | 9/2011 | D'Evelyn |
| 2011/0256693 | A1 | 10/2011 | D'Evelyn et al. |
| 2011/0260189 | A1 | 10/2011 | Kim |
| 2011/0262773 | A1 | 10/2011 | Poblenz et al. |
| 2011/0309373 | A1 | 12/2011 | Sharma et al. |
| 2012/0000415 | A1 | 1/2012 | D'Evelyn et al. |
| 2012/0073494 | A1 | 3/2012 | D'Evelyn |
| 2012/0091465 | A1 | 4/2012 | Krames et al. |
| 2012/0104359 | A1 | 5/2012 | Felker et al. |
| 2012/0104412 | A1 | 5/2012 | Zhong et al. |
| 2012/0118223 | A1 | 5/2012 | D'Evelyn |
| 2012/0119218 | A1 | 5/2012 | Su |
| 2012/0135553 | A1 | 5/2012 | Felker et al. |
| 2012/0137966 | A1 | 6/2012 | D'Evelyn et al. |
| 2012/0178198 | A1 | 7/2012 | Raring et al. |
| 2012/0199952 | A1 | 8/2012 | D'Evelyn et al. |
| 2013/0112987 | A1 | 5/2013 | Fu et al. |
| 2013/0119401 | A1 | 5/2013 | D'Evelyn et al. |
| 2013/0126902 | A1 | 5/2013 | Isozaki et al. |
| 2013/0251615 | A1 | 9/2013 | D'Evelyn et al. |
| 2013/0323490 | A1 | 12/2013 | D'Evelyn et al. |
| 2014/0050244 | A1 | 2/2014 | Ohno et al. |
| 2014/0147650 | A1 | 5/2014 | Jiang et al. |

FOREIGN PATENT DOCUMENTS

| | | |
|---|---|---|
| WO | WO 2006/038467 | 4/2006 |
| WO | 2006/057463 | 6/2006 |
| WO | 2007/004495 | 1/2007 |
| WO | WO 2010/068916 | 6/2010 |
| WO | WO 2011044554 A1 * | 4/2011 |
| WO | 2012/016033 | 2/2012 |

OTHER PUBLICATIONS

USPTO Office Action for U.S. Appl. No. 13/472,356 dated Dec. 9, 2013 (11 pages).
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
Choi et al., '2.51 microcavity InGaN light-emitting diodes fabricated by a selective dry-etch thinning process', Applied Physics Letters, 2007, 91(6), 061120, 4 pgs.
D'Evelyn et al., 'Bulk GaN Crystal Growth by The High-Pressure Ammonothermal Method,' Journal of Crystal Growth, vol. 300, 2007, pp. 11-16.
Fukuda et al., 'Prospects for The Ammonothermal Growth of Large GaN Crystal,' Journal of Crystal Growth, vol. 305, 2007, pp. 304-310.
Lide et al., 'Thermal Conductivity of Ceramics and Other Insulating Materials,' CRC Handbook of Chemistry and Physics, 91st Edition, 2010-2011, pp. 12-203 and 12-204.
http://www.matbase.com/material/non-ferrous-metals/other/molybdenum/properties, Data Table For: Non-Ferrous Metals: Other Metals: Molybdenum, Mar. 28, 2011, pp. 1.
Pattison et al., 'Gallium Nitride Based Microcavity Light Emitting Diodes With 2λ, Effective Cavity Thickness', Applied Physics Letters, vol. 90, Issue 3, 031111 (2007) 3pg.
Sarva et al., 'Dynamic Compressive Strength of Silicon Carbide Under Uniaxial Compression,' Material Sciences and Engineering, vol. A317, 2001, pp. 140-144.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
Communication from the Polish Patent Office re P394857 dated Jan. 22, 2013, 2 pages.
USPTO Office Action for U.S. Appl. No. 12/133,364 dated Nov. 26, 2010.
USPTO Office Action for U.S. Appl. No. 12/133,364 dated Jun. 1, 2011.
USPTO Notice of Allowance for U.S. Appl. No. 12/133,364 dated Oct. 11, 2011.
USPTO Office Action for U.S. Appl. No. 12/133,365 dated Jun. 9, 2011.
USPTO Office Action for U.S. Appl. No. 12/133,365 dated Oct. 18, 2011.
USPTO Office Action for U.S. Appl. No. 12/334,418 dated Apr. 5, 2011.
USPTO Office Action for U.S. Appl. No. 12/634,665 dated Oct. 1, 2012.
USPTO Notice of Allowance for U.S. Appl. No. 12/634,665 dated Feb. 15, 2013.
USPTO Office Action for U.S. Appl. No. 12/724,983 dated Mar. 5, 2012.
USPTO Office Action for U.S. Appl. No. 12/785,404 dated Mar. 6, 2012.
USPTO Notice of Allowance for U.S. Appl. No. 12/785,404 dated Jul. 16, 2012.
USPTO Office Action for U.S. Appl. No. 12/891,668 dated Sep. 25, 2012.
USPTO Office Action for U.S. Appl. No. 13/041,199 dated Nov. 30, 2012.
USPTO Office Action for U.S. Appl. No. 13/041,199 dated Mar. 12, 2013.
USPTO Office Action for U.S. Appl. No. 13/175,739 dated Dec. 7, 2012.
USPTO Office Action for U.S. Appl. No. 13/226,249 dated Oct. 10, 2012.
USPTO Notice of Allowance for U.S. Appl. No. 13/226,249 dated Feb. 21, 2013.
USPTO Notice of Allowance for U.S. Appl. No. 13/425,304 dated Aug. 22, 2012.
USPTO Office Action for U.S. Appl. No. 12/334,418 dated Oct. 19, 2011.
USPTO Office Action for U.S. Appl. No. 12/478,736 dated Sep. 27, 2011.
USPTO Office Action for U.S. Appl. No. 12/478,736 dated Feb. 7, 2012.
USPTO Notice of Allowance for U.S. Appl. No. 12/478,736 dated Apr. 23, 2012.
USPTO Notice of Allowance for U.S. Appl. No. 12/478,736 dated Oct. 9, 2012.
USPTO Office Action for U.S. Appl. No. 12/484,095 dated Nov. 10, 2010.
USPTO Office Action for U.S. Appl. No. 12/484,095 dated Jul. 8, 2011.
USPTO Office Action for U.S. Appl. No. 12/497,969 dated Feb. 2, 2012.
USPTO Office Action for U.S. Appl. No. 12/497,969 dated Jul. 5, 2012.
USPTO Office Action for U.S. Appl. No. 12/534,843 dated Sep. 10, 2012.
USPTO Notice of Allowance for U.S. Appl. No. 12/534,843 dated Jan. 24, 2013.
USPTO Office Action for U.S. Appl. No. 12/534,844 dated Sep. 16, 2010.
USPTO Office Action for U.S. Appl. No. 12/534,844 dated Feb. 4, 2011.
USPTO Notice of Allowance for U.S. Appl. No. 12/534,849 dated Jul. 31, 2012.

(56) References Cited

OTHER PUBLICATIONS

USPTO Office Action for U.S. Appl. No. 12/534,857 dated Sep. 1, 2010.
USPTO Notice of Allowance for U.S. Appl. No. 12/534,857 dated May 27, 2011.
USPTO Office Action for U.S. Appl. No. 12/546,458 dated Jul. 20, 2011.
USPTO Notice of Allowance for U.S. Appl. No. 12/546,458 dated Nov. 28, 2011.
USPTO Office Action for U.S. Appl. No. 12/556,558 dated Sep. 16, 2010.
USPTO Notice of Allowance for U.S. Appl. No. 12/556,558 dated Mar. 22, 2011.
USPTO Office Action for U.S. Appl. No. 12/556,562 dated Sep. 15, 2010.
USPTO Office Action for U.S. Appl. No. 12/556,562 dated Mar. 21, 2011.
USPTO Notice of Allowance for U.S. Appl. No. 12/556,562 dated Jul. 27, 2011.
USPTO Office Action for U.S. Appl. No. 12/569,337 dated May 9, 2012.
USPTO Notice of Allowance for U.S. Appl. No. 12/569,337 dated Nov. 15, 2012.
USPTO Office Action for U.S. Appl. No. 12/634,665 dated Apr. 25, 2012.
Aguilar, 'Ohmic n-contacts to Gallium Nitride Light Emitting Diodes', National Nanotechnologhy Infrastructure Network, 2007, p. 56-81.
Lu et al., 'Etch-Pits of GaN Films with Different Etching Methods', Journal of the Korean Physical Society, vol. 45, Dec. 2004, p. 673-675.
Rickert et al., 'n-GaN Surface Treatments for Metal Contacts Studied Via X-ray Photoemission Spectroscopy', Applied Physics Letters, vol. 80, No. 2, Jan. 14, 2002, p. 204-206.
Selvanathan et al., 'Investigation of Surface Treatment Schemes on n-type GaN and Al 0.20Ga0.80N', Journal of Vacuum Science and Technology B, vol. 23, No. 6, May 10, 2005, p. 2538-2544.
Semendy et al., 'Observation and Study of Dislocation Etch Pits in Molecular Beam Epitaxy Grown Gallium Nitride with the use of Phosphoric Acid and Molten Potassium Hydroxide', Army Research Laboratory, Jun. 2007, 18 pages.
USPTO Office Action for U.S. Appl. No. 13/723,968 dated Nov. 29, 2013 (23 pages).
USPTO Notice of Allowance for U.S. Appl. No. 13/723,968 dated Apr. 28, 2014 (8 pages).
Altoukhov et al., 'High reflectivity airgap distributed Bragg reflectors realized by wet etching of AlInN sacrificial layers', Applied Physics Letters, vol. 95, 2009, pp. 191102-1-1911023.
Callahan et al., 'Synthesis and Growth of Gallium Nitride by the Chemical Vapor Reaction Process (CVRP)', MRS Internet Journal Nitride Semiconductor Research, vol. 4, No. 10, 1999, pp. 1-6.
Dorsaz et al., 'Selective oxidation of AlInN Layers for current confinement III-nitride devices', Applied Physics Letters, vol. 87, 2005, pp. 072102.
Ehrentraut et al., 'The ammonothermal crystal growth of gallium nitride—A technique on the up rise', Proceedings IEEE, 2010, 98(7), pp. 1316-1323.
Fang., 'Deep centers in semi-insulating Fe-doped native GaN substrates grown by hydride vapour phase epitaxy', Physica Status Solidi, vol. 5, No. 6, 2008, pp. 1508-1511.
Fujito et al., 'Development of bulk GaN crystals and nonpolar/semipolar substrates by HVPE', MRS Bulletin, 2009, 34, 5, pp. 313-317.
Gladkov et al., 'Effect of Fe doping on optical properties of freestanding semi-insulating HVPE GaN:Fe', Journal of Crystal Growth, 312, 2010, pp. 1205-1209.

Grzegory, 'High pressure growth of bulk GaN from Solutions in gallium', Journal of Physics Condensed Matter, vol. 13, 2001, pp. 6875-6892.
Moutanabbir, 'Bulk GaN Ion Cleaving', Journal of Electronic Materials, vol. 39, 2010, pp. 482-488.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, 2005, pp. 103509-1-103509-4.
International Search Report of PCT Application No. PCT/US2009/067745, dated Feb. 5, 2010, 1 page total.
Porowski, 'High Resistivity GaN Single Crystalline Substrates', Acta Physica Polonica A, vol. 92, No. 5, 1997, pp. 958-962.
Porowski, 'Near Defect Free GaN Substrates', Journal of Nitride Semiconductor, 1999, pp. 1-11.
Sharma et al., 'Vertically oriented GaN-based air-gap distributed Bragg reflector structure fabricated using band-gap-selective photoelectrochemical etching', Applied Physics Letters, vol. 87, 2005, pp. 051107.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Wang et al, 'Ammonothermal Growth of GaN Crystals in Alkaline Solutions', Journal of Crystal Growth, vol. 287, 2006, pp. 376-380.
USPTO Office Action for U.S. Appl. No. 12/133,365 dated May 13, 2013.
USPTO Office Action for U.S. Appl. No. 12/497,969 dated May 16, 2013.
USPTO Office Action for U.S. Appl. No. 12/636,683 dated Jun. 12, 2013.
USPTO Office Action for U.S. Appl. No. 12/891,668 dated Jan. 10, 2013.
USPTO Notice of Allowance for U.S. Appl. No. 12/891,668 dated Mar. 20, 2013.
USPTO Notice of Allowance for U.S. Appl. No. 13/175,739 dated Mar. 21, 2013.
USPTO Office Action for U.S. Appl. No. 13/272,981 dated Mar. 20, 2013.
USPTO Office Action for U.S. Appl. No. 13/346,507 dated Dec. 21, 2012.
USPTO Notice of Allowance for U.S. Appl. No. 13/346,507 dated Apr. 22, 2013.
USPTO Notice of Allowance for U.S. Appl. No. 13/548,931 dated Jun. 3, 2013.
USPTO Office Action for U.S. Appl. No. 12/858,379 dated Apr. 14, 2011.
USPTO Notice of Allowance for U.S. Appl. No. 12/858,379 dated Dec. 6, 2011.
USPTO Notice of Allowance for U.S. Appl. No. 13/163,498 dated Jul. 23, 2012.
USPTO Notice of Allowance for U.S. Appl. No. 13/184,160 dated Dec. 12, 2011.
USPTO Office Action for U.S. Appl. No. 13/465,976 dated Aug. 16, 2012.
Copel et al., 'Surfactants in Epitaxial Growth', Physical Review Letters, Aug. 7, 1989, vol. 63, No. 6, p. 632-635.
Lu et al., 'Structure of the Cl-passivated GaAs(111) surface', Physical Review B, Nov. 15, 1998, vol. 58, No. 20, pp. 13820-13823.
Massies et al., 'Surfactant mediated epitaxial growth of InxGal—xAs on GaAs (001)', Applied Physics Letters, vol. 61, No. 1, Jul. 6, 1992, pp. 99-101.
Sumiya et al., 'High-pressure synthesis of high-purity diamond crystal', Diamond and Related Materials, 1996, vol. 5, pp. 1359-1365.
Communication from the Chinese Patent Office re 200980134876.2 dated Jul. 3, 2013, 14 pages.
Communication from the Polish Patent Office re P394857 dated Aug. 14, 2013, 2 pages.
USPTO Office Action for U.S. Appl. No. 12/133,365 dated Aug. 21, 2013, 29 pages.

(56) References Cited

OTHER PUBLICATIONS

USPTO Office Action for U.S. Appl. No. 12/334,418 dated Sep. 17, 2013, 27 pages.
USPTO Office Action for U.S. Appl. No. 12/497,969 dated Sep. 6, 2013, 21 pages.
USPTO Office Action for U.S. Appl. No. 12/569,844 dated Oct. 12, 2012, 12 pages.
USPTO Office Action for U.S. Appl. No. 12/636,683 dated Aug. 16, 2013, 16 pages.
USPTO Office Action for U.S. Appl. No. 12/697,171 dated Jun. 20, 2013, 17 pages.
USPTO Office Action for U.S. Appl. No. 12/697,171 dated Aug. 20, 2013, 17 pages.
USPTO Office Action for U.S. Appl. No. 13/025,833 dated Jul. 12, 2012, 16 pages.
USPTO Office Action for U.S. Appl. No. 13/179,346 dated Dec. 13, 2012, 24 pages.
USPTO Office Action for U.S. Appl. No. 13/272,981 dated Aug. 15, 2013, 13 pages.

\* cited by examiner (b)

(d)

(a)

(c)

(b)

(d)

(a)

(c)

1500

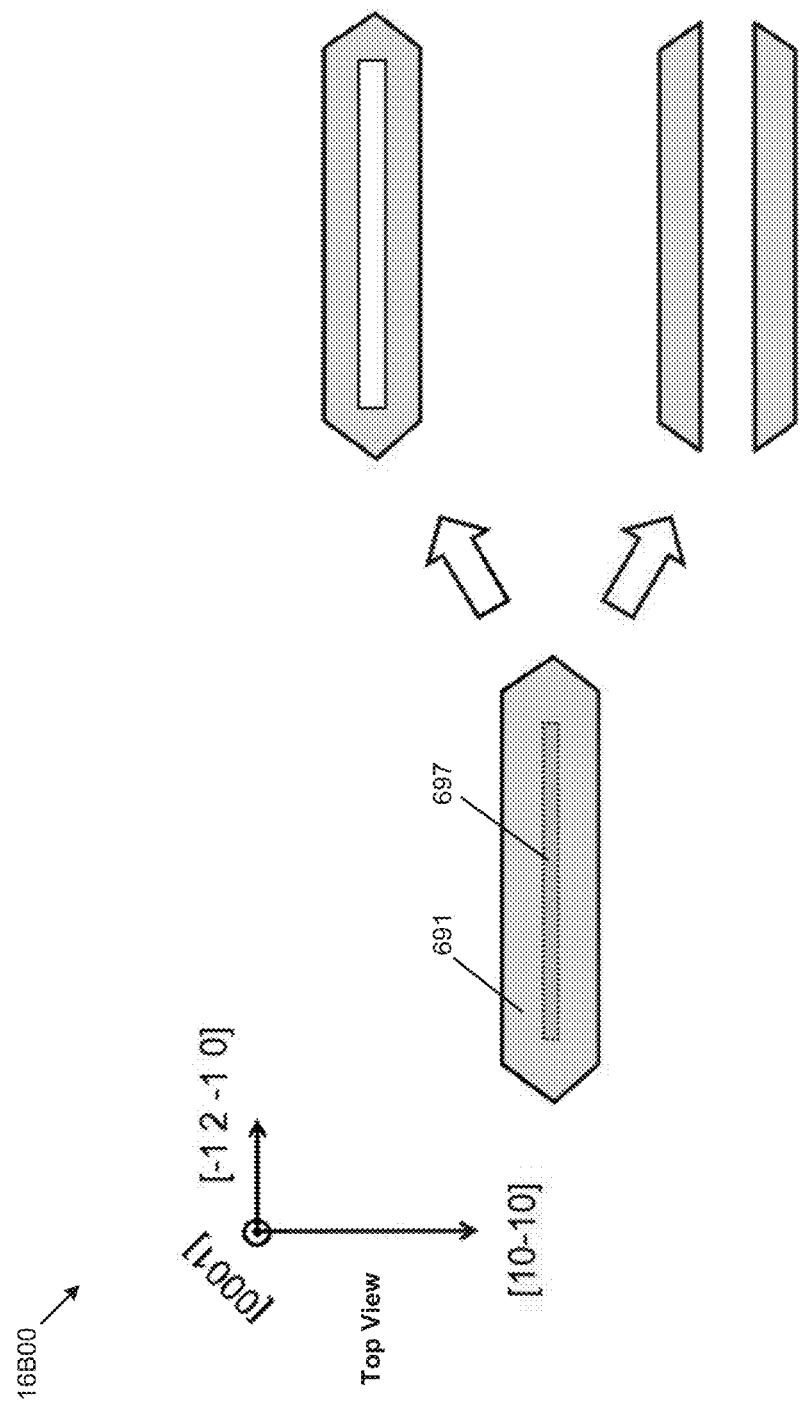

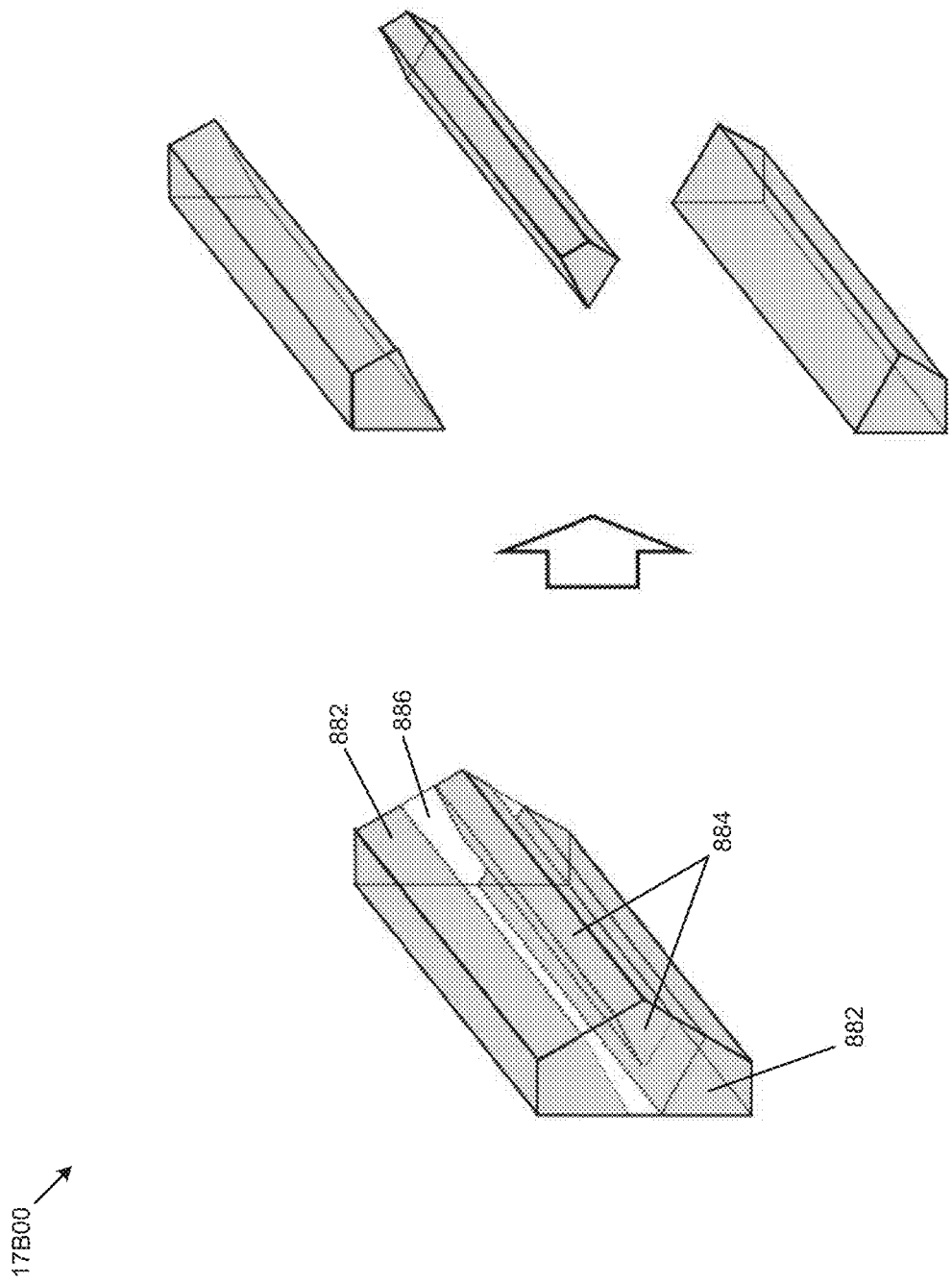

LARGE AREA, LOW-DEFECT GALLIUM-CONTAINING NITRIDE CRYSTALS, METHOD OF MAKING, AND METHOD OF USE

This application is a continuation-in-part of U.S. application Ser. No. 12/497,969 filed on Jul. 6, 2009, which claims the benefit under 35 U.S.C. §119(e) of U.S. Provisional Application No. 61/078,704 filed on Jul. 7, 2008; and this application is a continuation-in-part of U.S. application Ser. No. 12/988,772, filed on Jun. 30, 2011, which is the National Stage of International Application No. PCT/US2010/52175 filed on Oct. 11, 2010, which claims the benefit under 35 U.S.C. §119(e) of U.S. Provisional Application No. 61/250,476 filed on Oct. 9, 2009; and this application is a continuation-in-part of U.S. application Ser. No. 13/160,307 filed on Jun. 14, 2011, which claims the benefit under 35 U.S.C. §119(e) of U.S. Provisional Application No. 61/356,489 filed on Jun. 18, 2010, and U.S. Provisional Application No. 61/386,879 filed on Sep. 27, 2010, each of which is incorporated by reference in its entirety.

GOVERNMENT LICENSE RIGHTS

This invention was made with government support under Grant IIP-1026896, awarded by the U.S. National Science Foundation. The government has certain rights in the invention.

BACKGROUND OF THE DISCLOSURE

This disclosure relates generally to techniques for processing materials for manufacture of gallium-containing nitride substrates. More specifically, embodiments of the disclosure include techniques for growing large area substrates using a combination of processing techniques. The disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photo detectors, integrated circuits, and transistors, and others.

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth method of the layers.

The presence of defects has a deleterious effect on epitaxially-grown layers. Such effect includes compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area c-plane gallium nitride crystals, typically with a (0001) orientation. The large-area c-plane gallium nitride crystals generally come in 2 inch diameter, free-standing (0001) GaN substrates and are generally available commercially. However, for certain applications other crystallographic orientations may be preferred.

There has been considerable interest in GaN-based devices fabricated on nonpolar and semipolar crystallographic orientations for at least a decade. Much of this interest derives from the reduction or elimination of piezoelectric and strain-related electric fields that can be very large in conventional c-plane GaN-based devices. However, cost-effective manufacturing of devices generally requires relatively large area substrates, for example, larger than 2", 4", or 6". Efforts to grow such substrates heteroepitaxially has generally produced large concentrations of stacking faults, a particular type of extended defect, at least $10^3$-$10^5$ cm$^{-1}$ or even larger. In addition, very low concentrations of threading dislocations are highly desirable, for example, for laser diode lifetimes, and heteroepitaxy of nonpolar or semipolar GaN wafers generally produces dislocation densities of $10^8$-$10^{11}$ cm$^{-2}$. Methods for homoepitaxial growth of nonpolar and semipolar wafers are known, for example, growth of thick c-plane boules by HVPE or ammonothermally following by slicing at a transverse or oblique angle with respect to the growth direction, but it is difficult to make large area wafers by such methods.

In addition, metrology of both threading dislocations and stacking faults presents some challenges. Characterization of high-dislocation and/or high-stacking-fault GaN material, for example, grown heteroepitaxially by hydride vapor phase epitaxy (HVPE), has generally relied on transmission electron microscopy (TEM) or photoluminescence (PL). However, TEM, because of the small sampled area, has insufficient sensitivity to quantify dislocation densities below about $10^8$ cm$^{-2}$ or stacking fault concentrations below about $10^3$ cm$^{-1}$, and luminescence-based methods such as PL and CL may not be reliable for detection and quantification of dislocations or stacking faults in GaN grown by ammonothermal techniques.

From the above, it is seen that techniques for improving crystal growth and crystal characterization are highly desirable.

BRIEF SUMMARY OF THE DISCLOSURE

Disclosed herein is an ultralow defect gallium-containing nitride crystal, where the crystal comprises gallium and nitrogen and has a wurtzite crystal structure. The crystal comprises a first large area surface and a second large area surface, the two large-area surfaces being substantially parallel to one another and having a maximum dimension greater than about 10 millimeters, and the first large-area surface has a crystallographic orientation that is miscut from {10-10} m-plane by between about −60 degrees and about +60 degrees toward [0001] +c-direction and by up to about 10 degrees toward an orthogonal <1-210> a-direction. At least one large area surface is characterized by a dislocation density below about 104 cm−2 and a stacking fault concentration below about 10 cm−1, as determined by etching in a solution comprising one or more of $H_3PO_4$, $H_3PO_4$ that has been conditioned by prolonged heat treatment to form polyphosphoric acid, and $H_2SO_4$, at temperatures between about 100 degrees Celsius and about 500 degrees Celsius for times between about 5 minutes and about 5 hours. The processing temperature and time are selected so as to cause formation of etch pits with diameters between about 1 micrometer and about 25 micrometers.

Another disclosed embodiment forms an ultralow defect gallium-containing nitride crystal, the crystal comprising gallium and nitrogen and has a wurtzite crystal structure, where the crystal comprises a first large area surface and a second large area surface, the two large-area surfaces being substantially parallel to one another and having a maximum dimension greater than about 10 millimeters. The first large-area surface has a root-mean-square surface roughness measured over a 10-micrometer by 10-micrometer area that is less than about 1 nanometer, and a crystallographic orientation within 5 degrees of an orientation selected from (0001) +c-plane and (000-1) −c-plane, and the large-area surface closest in orientation to (0001) is characterized by a dislocation density below about $10^4$ $cm^{-2}$, as determined by a first etching process in a melt comprising at least one of NaOH and KOH at a temperature between about 300 degrees Celsius and about 500 degrees Celsius for a time between about 30 seconds and about one hour, wherein the processing time and temperature of the first etching process are selected so as to cause formation of c-plane etch pits with diameters between about 1 micrometer and about 25 micrometers. An m-plane surface is prepared from the ultralow defect crystal or wafer having a surface area of at least about 3 square millimeters and is characterized by a dislocation density below about $10^4$ $cm^{-2}$ and is free of stacking faults, as determined by a second etching process comprising etching in a solution comprising one or more of $H_3PO_4$, $H_3PO_4$ that has been conditioned by prolonged heat treatment to form polyphosphoric acid, and $H_2SO_4$, at temperatures between about 100 degrees Celsius and about 500 degrees Celsius for times between about 5 minutes and about 5 hours. The processing temperature and time for the second etching process are selected so as to cause formation of m-plane etch pits with diameters between about 1 micrometer and about 25 micrometers with minimal overlap between etch features, and the (000-1) −c surface is protected by contact with an etch-resistant material such as a fluoropolymer, for example, Teflon® during the second etching process.

According to the present disclosure, further techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

In a specific embodiment, the present disclosure provides a method for forming a gallium based crystal. The method includes providing a proto-seed, which has a gallium based crystal with a maximum length of at least 25 mm and a first thickness substantially orthogonal to a first direction of the maximum length and a second thickness orthogonal to the first direction of the maximum length. In a specific embodiment, each of the first thickness and the second thickness is at least 0.5 mm. In a specific embodiment, the method also includes subjecting the proto-seed to an ammonothermal growth of a gallium based crystalline material to cause the proto-seed to grow in a second direction lateral to the first direction of maximum length by a distance of at least 5 mm to form at least one a-wing, comprising a c+ surface and a c-surface. In a specific embodiment, each of the c+ surface and the c-surface has an area of at least 25 $mm^2$. As used herein, the term "lateral" is used in conjunction with a reference direction as shown or other interpretations known by one of ordinary skill in the art. As an example, the term lateral means a direction normal to the original crystal growth direction or other interpretations known by one of ordinary skill in the art. As an example, the proto-seed is a type of seed formed by removing a seed crystal structure from a thick gallium and nitrogen containing substrate made using HVPE growth, is formed by removing a seed crystal structure from a thick gallium and nitrogen containing substrate made using ammonothermal growth, or other techniques.

In a specific embodiment, the present method and resulting device combines several bulk growth methods to grow large area non-polar and semi-polar GaN substrates with high crystalline quality without the characteristic defects associated with epitaxial lateral overgrowth.

In an alternative specific embodiment, the present disclosure provides a method for forming a gallium based crystal, which may be used for other applications. The method includes providing a laterally grown gallium based seed crystal, which has a maximum length of at least 25 mm and a first thickness substantially orthogonal to a first direction of the maximum length and a second thickness orthogonal to the first direction of the maximum length. Each of the first thickness and the second thickness is at least 0.3 mm. The method includes subjecting the laterally grown gallium based seed crystal to an ammonothermal growth of a gallium based crystalline material to cause the laterally grown gallium based seed crystal to grow in a second direction lateral to the first direction of maximum length by a distance of at least 5 mm to form a c-grown crystal comprising two large-area m-orientation surfaces. Each of the m-surfaces has an area of at least 25 $mm^2$ in a specific embodiment.

In other embodiments, the present disclosure provides a gallium based crystal device comprising at least four m-plane faces and two c-plane faces; wherein the two c-plane faces are substantial major planes in association with any of the four m-plane faces. In other embodiments, the device also has at least two {1 0 −1 ±1} facets.

Still further, the present disclosure provides a seed crystal device for use in electronic or optical devices. The seed crystal device includes a seed crystal structure removed from a thickened gallium and nitrogen containing substrate provided from an HVPE grown material; wherein the thickened gallium and nitrogen substrate is at least 500 micrometers thick. Preferably, the device has at least a pair of major c-plane surfaces.

Moreover, the present disclosure provides a gallium and nitrogen crystalline structure comprising a laterally grown gallium and nitrogen containing material having a dislocation density of $10^5$ $cm^{-2}$ and less for a major surface and a major length of 12 mm and greater, the major length associated with the major surface, e.g., a c-plane, an m-plane.

A further understanding of the nature and advantages of the present disclosure may be realized by reference to the specification and attached drawings.

BRIEF DESCRIPTION OF THE DRAWINGS

FIG. 16A, FIG. 16B, FIG. 17A, and 17B are schematic diagrams illustrating first and second operations associated with separating ultralow defect gallium-containing nitride sectors from higher-defect regions according to embodiments of the present disclosure.

DETAILED DESCRIPTION OF THE DISCLOSURE

Figure 1A:
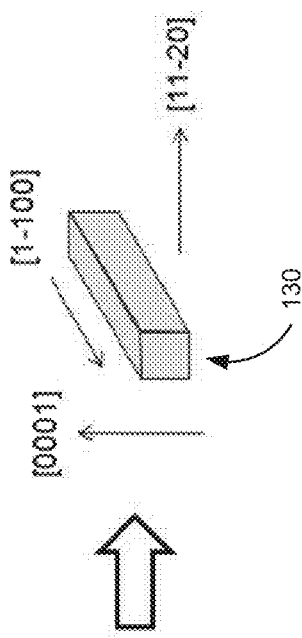
FIG. 1A is a simplified diagram illustrating a method of forming a proto-seed crystal according to an embodiment of the present disclosure.
Figure 1A:
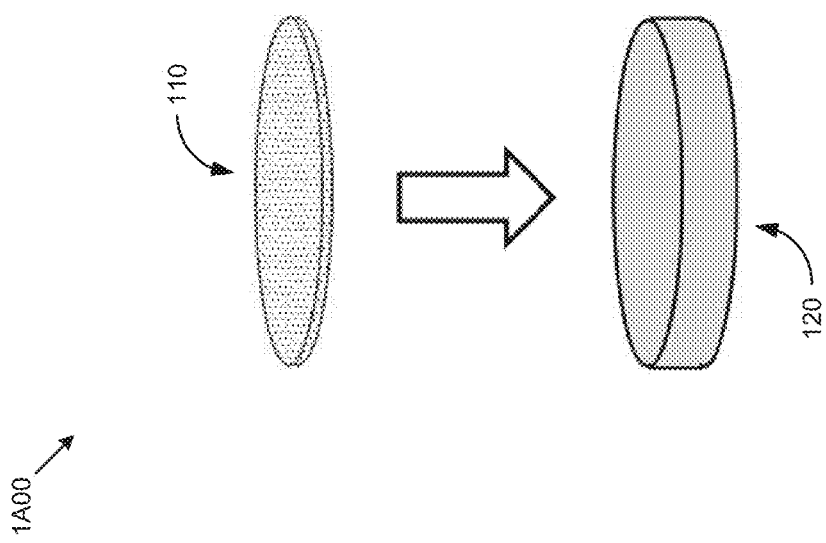

According to the present disclosure, techniques related to techniques for processing materials for manufacture of gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

D'Evelyn et al., in U.S. Application Publication No. 2011/0256693, which is incorporated by reference in its entirety, taught methods for growing gallium nitride crystals. However, these inventors may not have been aware of issues associated with the formation and detection of stacking faults in ammonothermally-grown GaN and the negative device performance implications of the presence of stacking faults. Consequently, we have discovered improved methods for detecting of extended defects in ammonothermally-grown gallium-containing nitride crystals and for synthesis of large area, high quality bulk gallium-containing nitride crystals, including crystals and wafers with nonpolar or semipolar orientations.

We have discovered that that threading dislocations and stacking faults can be reliably detected and quantified in both HVPE GaN and ammonothermal GaN of a range of nonpolar and semipolar crystallographic orientations by etching of polished surfaces in phosphoric acid ($H_3PO_4$) or its mixtures with sulfuric ($H_2SO_4$) acid at temperatures above about 100 degrees Celsius. Threading dislocations and stacking faults can also be detected and quantified, albeit with less precision, on as-grown surfaces. Both threading dislocations and stacking faults can also be reliably detected by deposition of InGaN-containing quantum well structures on a polished GaN substrate and performing PL or CL characterization of the quantum well emission. Dislocations can be quantified by deposition of Schottky contacts and performing electron beam induced current (EBIC) imaging, but reliable detection of stacking faults by EBIC appears to be very difficult. For at least ammonothermal GaN, neither CL, PL, or x-ray diffraction appear to be capable of reliably quantifying dislocation densities below about $10^5$ cm$^{-2}$ or stacking fault concentrations below about $10^2$ cm$^{-1}$.

Using the aforementioned etching metrology, we find that ammonothermal GaN growth grown in on nonpolar and/or semipolar directions, that is, laterally with respect to c-direction growth, often produces crystalline GaN material with stacking fault concentrations of the order of $10^2$ cm$^{-1}$, even when no stacking faults can be detected in the seed crystal.

We have discovered that, under certain conditions, low-dislocation-density, stacking-fault-free GaN crystals can be fabricated by lateral growth from nonpolar or semipolar seed crystals. Large area, low-dislocation-density, stacking-fault-free crystals can be formed either by prolonged growth of low-dislocation-density, stacking-fault-free, ammonothermally-grown GaN crystals or by tiling of small low-dislocation-density, stacking-fault-free, ammonothermally-grown GaN wafers followed by coalescence into a large single crystal.

Dislocations in GaN are known to act as strong non-radiative recombination centers which can severely limit the efficiency of GaN-based LEDs and laser diodes (Speck and Rosner, *Physica B: Condensed Matter*, 273-274(0), 24-32 (1999); Jiang et al., *Physica status solidi* (b), 244(8), 2878-2891 (2007); and Yonenaga et al., *Journal of Crystal Growth*, 318(1), 415-417 (2011). Non-radiative recombination generates local heating which may lead to faster device degradation (Cao et al., *Microelectronics Reliability*, 43(12), 1987-1991 (2003)). In high-power applications, GaN-based devices suffer from decreased efficiency with increasing current density, known as droop. There is evidence suggesting a correlation between dislocation density and the magnitude of droop in LEDs (Schubert et al., *Applied Physics Letters*, 91(23), 231114 (2007)). For GaN-based laser diodes there is a well-documented negative correlation between dislocation density and mean time to failure (MTTF) (Tomiya et al., *IEEE Journal of Selected Topics in Quantum Electronics*, 10(6), 1277-1286 (2004), which appears to be due to impurity diffusion along the dislocations (Orita et al., *IEEE International Reliability Physics Symposium Proceedings* (pp. 736-740 (2009). For electronic devices, dislocations have been shown to markedly degrade the leakage current (Kaun et al., Applied Physics Express, 4(2), 024101 (2011)) and the device lifetime (Tapajna et al., *Applied Physics Letters*, 99(22), 223501-223503 (2011)) in HEMT structures. One of the primary advantages of using bulk GaN as a substrate material for epitaxial thin film growth is the greatly reduced threading dislocations in the film. Therefore, the dislocation density in the bulk GaN substrate will have a significant impact on the device efficiency and the reliability and it is very important to have good metrology for it. Such methodology is much better developed for c-plane HVPE GaN than it is for nonpolar, semipolar, and/or ammonothermal GaN.

Cathodoluminescence (CL) is a widely-used technique to map the dislocation density in HVPE GaN over large areas. However, in ammonothermally grown GaN the CL spectrum may be dominated by broad blue and/or yellow luminescence peaks with relatively little band-edge emission and little or no contrast at dislocations, at room temperature and, we find, at liquid nitrogen temperature.

Selective wet chemical etching is another widely used technique to reveal threading dislocations in c-plane GaN (Kamler et al., *The European Physical Journal Applied Physics*, 27(1-3), 247-249 (2002); Kozawa et al., *Journal of The Electrochemical Society*, 143(1), L17-L19 (1996); Lu et al., *Journal of Applied Physics*, 104(12), 123525 (2008); Shiojima et al., *Journal of Vacuum Science & Technology B: Microelectronics and Nanometer Structures*, 18(June 1999), 37-40 (2000); and Xu et al., *Journal of Electronic Materials*, 31(5), 402-405 (2002)). Few papers exist regarding the proper etching conditions for the m-plane surface (Stocker et al., *Physica status solidi* (c), 8(7-8), 2113-2116 (1998); Wei et al., *Japanese Journal of Applied Physics*, 47, 3346 (2008)). For example, Swider and co-workers reported that no etch pits were formed on m-plane surfaces prepared from ammonothermally-grown bulk GaN crystals, despite formation of copious etch pits on c-plane surfaces (Swider et al., *Physica status solidi* (c), 8(7-8), 2113-2116 (2011)). We found that acid treatment conditions severe enough to form etch pits on m-plane surfaces may cause massive destruction of other surfaces, e.g., the (000-1) or N face.

Another technique that can be applied to quantify dislocation density is electron channeling contrast imaging (ECCI) microscopy (Kamaladasa et al., *Journal of Microscopy*, 244 (3), 311-319 (2011); Picard et al., *Applied Physics Letters*, 91(9), 094106 (2007); and Picard and Kamaladasa, *Microscopy: Science, Technology, Applications and Education*, 1583 (2008)), which uses a small area backscattered diode detector in a scanning electron microscope (SEM). At low magnification, collection of backscattered electrons over a large angular width is obtained by rastering the incoming electron beam, obtaining a Kikuchi diffraction pattern. By centering the beam onto a particular Kikuchi band (representing a particular set of atomic planes) and bringing the sample into high magnification, a single diffraction condition is isolated. A structural defect such as a dislocation locally distorts the atomic planes, altering the backscattered electron signal and giving rise to contrast, even at off-peak-diffraction orientations. We found that the dislocation distribution imaged by ECCI on HVPE GaN agrees very well with that obtained from standard CL mapping, except that ECCI has markedly higher resolution (~50 nm versus ~2 µm for CL). We also find that ECCI is able to reliably detect threading dislocations on nonpolar and semipolar ammonothermal GaN crystals and wafers.

We have been able to identify etch conditions with mixtures of $H_2SO_4$ and $H_3PO_4$ for defect-selective etching of m-plane and semipolar planes of HVPE and SCoRA GaN. This technique can be applied to as-grown bulk GaN boules and also to polished GaN crystals or wafers. The −c N face can be heavily etched under conditions that provide good defect-selective etching of the m-plane, but wrapping the −c N end or face of a crystal with Teflon®, clamping the −c N end or face of a crystal against Teflon®, or painting with Teflon® tape can protect it against massive erosion. In the case of HVPE GaN, we have been able to establish an approximately one-to-one relationship between pit formation and dark spots in CL images, validating the technique.

Quantification of the concentration of threading dislocations at concentrations below about $10^7$ cm$^{-2}$ in c-plane GaN, particularly on the (0001) +c face, appears to be best performed using molten NaOH, KOH, or a NaOH/KOH eutectic melt, with the optional addition of MgO powder, at temperatures between about 300 degrees Celsius and about 500 degrees Celsius for times between about 30 seconds and about one hour (Kamler et al., *The European Physical Journal Applied Physics*, 27(1-3), 247-249 (2004); Kamler et al., *Journal of Crystal Growth*, 246(1-2), 21-24 (2002); Shiojima, *Journal of Vacuum Science & Technology B: Microelectronics and Nanometer Structures*, 18(June 1999), 37-40 (2000); Swider et al., (2011); and Weyher et al., *Journal of Crystal Growth*, 210(1-3), 151-156 (2000)).

Method development is also desirable for quantification of stacking faults at low concentrations, particularly in m-plane or semipolar GaN. While stacking faults may not be readily obvious in n-type GaN grown in the c-direction, m-plane growth is often plagued with the generation and expansion of basal plane stacking faults (BSF), often reaching a line density as high as $10^6$ cm$^{-1}$ heteroepitaxially-grown films (Cho et al., *Applied Physics Letters,* 93(11), 111904 (2008); and Hirai et al., *Applied Physics Letters,* 90(12), 121119 (2007)). The BSFs create an internal electric field along the c-direction whose magnitude is proportional to the BSF density (Metcalfe et al., *Applied Physics Letters,* 92(24), 241106 (2008)), which can reduce the radiative recombination efficiency of a quantum well (QW). In addition, BSFs cause locally-elevated indium uptake, giving rise to red-shifted emission and optical absorption at the nominal emission wavelength, which is particularly deleterious for lasers. A high BSF density in a GaN substrate can also result in QW structures with a very broad or a double peaked emission characteristic (Fischer et al., *Applied Physics Express,* 2, 041002 (2009)).

The most common type of BSF ($I_1$) has an emission peak at ~3.41 eV above the valence band (Liu et al., *Journal of Applied Physics,* 104(12), 123525 (2005); and Rebane et al., *Physica status solidi (a),* 164(1), 141-144 (1997)), too close to the band-edge emission (3.48 eV) to resolve at room temperature. We have not been able to identify conditions whereby EBIC measurements are able to reliably detect stacking faults. While ECCI is capable in principle of imaging stacking faults, the sample must be polished and oriented to a precise diffraction condition to reveal its contrast. This is because unlike dislocations, stacking faults do not exhibit strong surface relaxation, and therefore their diffraction contrast is highly sample orientation dependent.

We have found, however, that conditions producing good dislocation-selective etching in mixtures of $H_2SO_4$ and $H_3PO_4$ may also reliably produce etched linear features associated with stacking faults on nonpolar and semipolar surfaces. We were able to establish an approximately one-to-one relationship between stacking faults detected by defect-selective etching with those detected by low temperature cathodoluminescence in HVPE GaN, as long as the faulted region is significantly longer than etch pits associated with threading dislocations.

FIG. 1A is a simplified diagram 1A00 illustrating a method for forming a GaN proto-seed crystal. A thick GaN layer is grown on substrate 110 using hydride vapor phase epitaxy (HVPE) or another method that is known in the art, forming boule 120. Substrate 110 may comprise sapphire, silicon carbide, gallium arsenide, $MgAl_2O_4$ spinel, gallium nitride, aluminum nitride, or the like. In a specific embodiment, substrate 110 may be selected from c-plane GaN, c-plane AlN, c-plane sapphire, spinel $MgAl_2O_4$ (111), GaAs(111), Si(111), any combination of these, or the like. Substrate 110 may have a hexagonal crystal structure, with a (0001) c-plane large-area surface orientation. In a specific embodiment, portions of substrate 110 are masked prior to growth of boule 120, enabling growth of material with a reduced dislocation density. In a specific embodiment, boule 120 has a c-plane orientation and is at least 1 millimeter, at least 2 millimeters, at least 5 millimeters, at least 10 millimeters, at least 15 millimeters, or at least 20 millimeters thick. Substrate 110 and boule 120 may have a diameter that is larger than 25 millimeters, larger than 50 millimeters, larger than 100 millimeters, larger than 150 millimeters, larger than 200 millimeters, or larger than 300 millimeters. Boule 120 may be separated from substrate 110 by self-separation, by laser liftoff, by void-assisted separation, by selective dissolution of substrate 110, or by another method that is known in the art. The top surface of the boule may have a (0001) Ga-face, c-plane orientation, may have an x-ray diffraction ω-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. In some embodiments, the threading dislocations in the top surface of boule 120 are approximately uniformly distributed. In other embodiments, the threading dislocations in the top surface of boule 120 are arranged inhomogenously as a one-dimensional array of rows of relatively high- and relatively low-concentration regions or as a two-dimensional array of high-dislocation-density regions within a matrix of low-dislocation-density regions. The crystallographic orientation may be constant to less than about 2 degrees, less than about 1 degree, less than about 0.5 degree, less than about 0.2 degree, less than about 0.1 degree, or less than about 0.05 degree across the top surface of the boule. An example of a suitable thick GaN boule is described by Fujito et al., *J. Cryst. Growth,* 311, 3011 (2009), and by Fujito et al., *Mater. Res. Soc. Bull.* 34, 313 (2009).

One or more proto-seeds 130 may be prepared from boule 120 by sawing, slicing, cleaving, or the like. In certain embodiments, sawcutting is performed substantially parallel to an m-direction, creating strips with long {11-20} surfaces. In certain embodiments, sawcutting is performed substantially parallel to an a-direction, creating strips with long {10-10} surfaces. In some embodiments, the long surfaces prepared by the sawcutting operation have a crystallographic orientation within 10 degrees, within 5 degrees, within 2 degrees, or within 1 degree of an a-plane, {11-20} orientation or of an m-plane, {10-10} orientation. In some embodiments, the sawcut or a-plane or m-plane surfaces are lapped, polished, electrochemically polished, photoelectrochemically polished, reactive-ion-etched, and/or chemical-mechanically polished. The small-area ends of the proto-seeds may have an m-plane, {1-100} orientation, an a-plane, {11-20} orientation, or may have a semi-polar orientation. The proto-seed may contain several crystallites separated by low-angle grain boundaries but may be substantially free from coalescence fronts of the type observed in epitaxial lateral overgrowth. In certain embodiments, substantially parallel means within about 2 degrees, within about 1 degrees, within about 0.5 degrees and in certain embodiments, within less than 0.5 degrees.

Figure 1B:
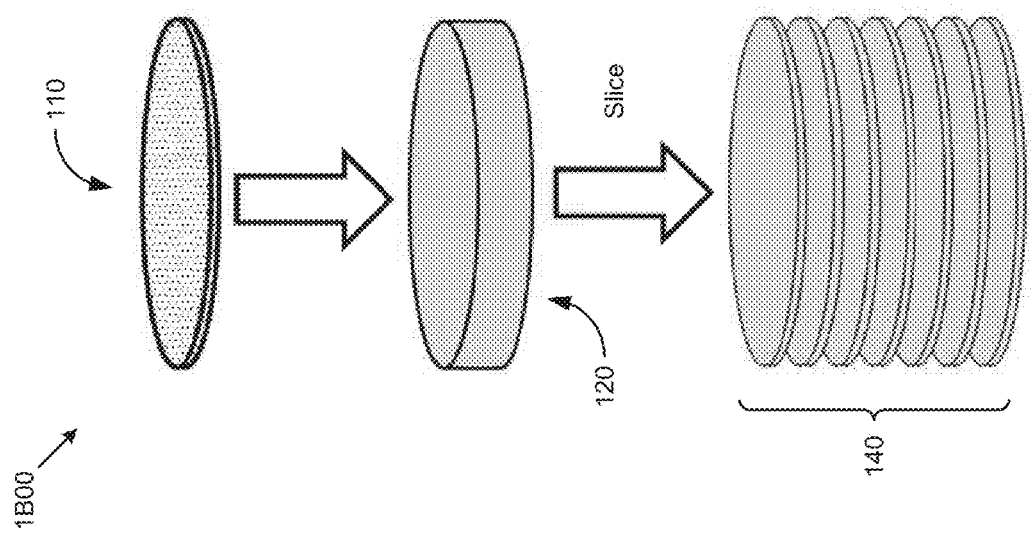
FIG. 1B is a simplified diagram illustrating a method of forming a proto-seed crystal according to an embodiment of the present disclosure.
Figure 1B:
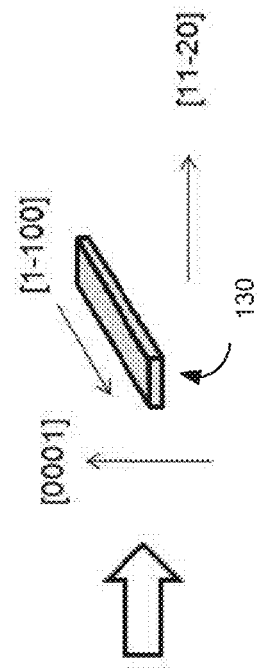

FIG. 1B is a simplified diagram 1B00 that illustrates an alternative embodiment for preparation of a proto-seed. After growing a thick GaN layer on substrate 110 using hydride vapor phase epitaxy (HVPE) or another method that is known in the art, forming boule 120, boule 120 is sliced into two or more wafers 140. Wafer 140 may have a thickness between about 0.1 millimeter and about 1 millimeter, or between about 0.3 millimeter and about 0.6 millimeter. Wafer 140 may be lapped, polished, electrochemically polished, photoelectrochemically polished, reactive-ion-etched, and/or chemical-mechanically polished. The top surface of at least one wafer 140, and of proto-seed 150, may have a (0001) Ga-face, c-plane orientation, may have an x-ray diffraction ω-scan rocking curve full-width-at-half-maximum (FWHM) less than about 50 arcsec or less than about 40 arcsec for the (0002) and/or the (10-12) reflections and may have a dislocation density less than about $10^7$ cm$^{-2}$, less than about $10^6$ cm$^{-2}$, or less than about $10^5$ cm$^{-2}$. The crystallographic orientation may be constant to less than about 2 degrees, less than about 1 degree, less than about 0.5 degree, less than about 0.2 degree, less than about 0.1 degree, or less than about 0.05 degree across the top surface of the boule. One or more proto-seeds 150 may be prepared from wafer 140 by sawing, slicing, cleaving, or the like. In certain embodiments, sawcutting is performed substantially parallel to an m-direction, creating strips with long {11-20} surfaces. In certain embodiments, sawcutting is performed substantially parallel to an a-direction, creating strips with long {10-10} surfaces. In some embodiments, the long surfaces prepared by the sawcutting operation have a crystallographic orientation within 10 degrees, within 5 degrees, within 2 degrees, or within 1 degree of an a-plane, {11-20} orientation or of an m-plane, {10-10} orientation. In some embodiments, the sawcut or a-plane or m-plane surfaces are lapped, polished, electrochemically polished, photoelectrochemically polished, reactive-ion-etched, and/or chemical-mechanically polished. The small-area ends of the proto-seeds may have an m-plane, {1-100} orientation, an a-plane, {11-20} orientation, or may have a semi-polar orientation. The proto-seed may contain several crystallites separated by low-angle grain boundaries but may be substantially free from coalescence fronts of the type observed in epitaxial lateral overgrowth.

Figure 2:
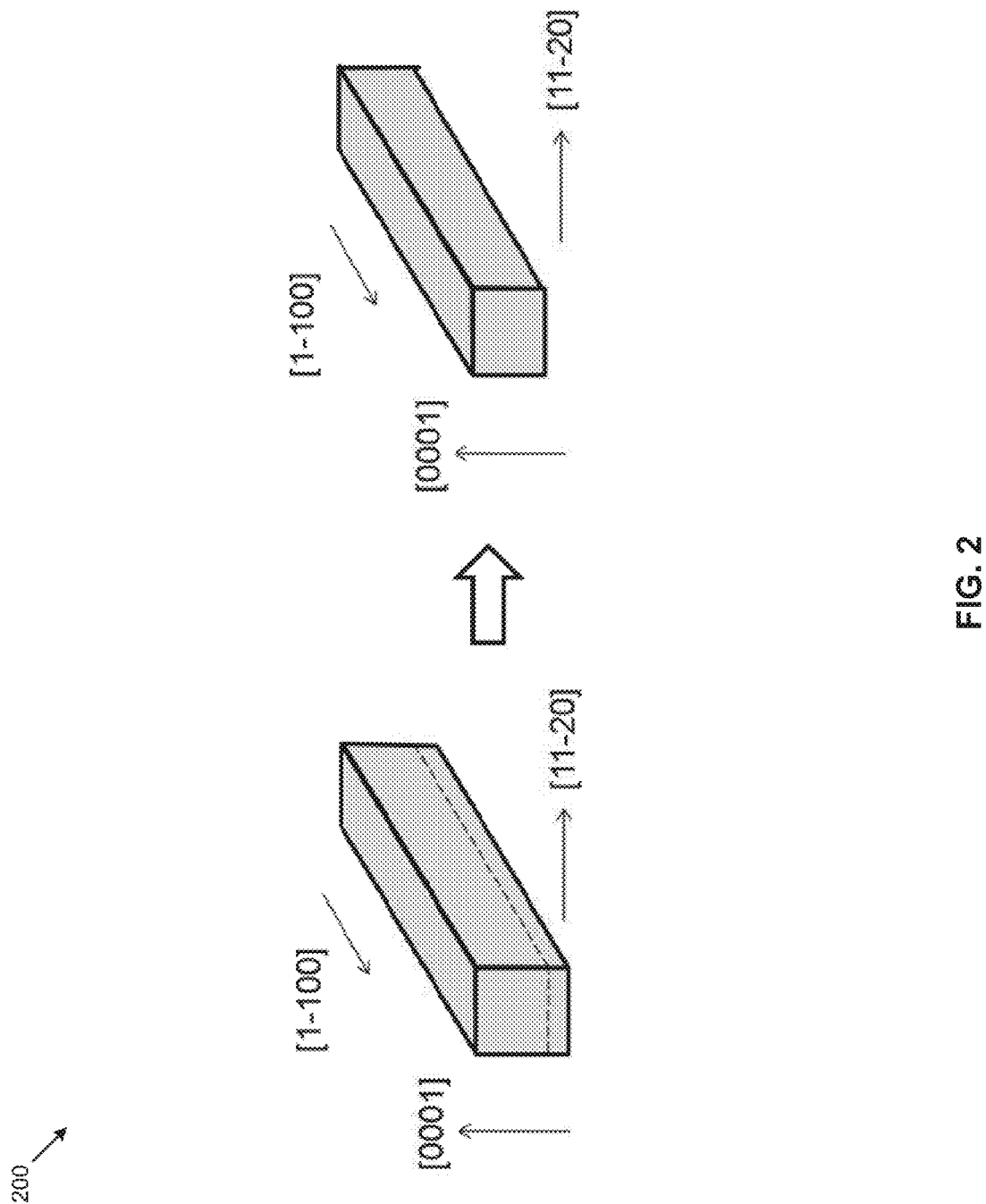
FIG. 2 is a simplified diagram illustrating an optional step of forming a large area GaN crystal according to an embodiment of the present disclosure.

Referring to the simplified diagram 200 of FIG. 2, the N-face or −c edge of the proto-seed may be trimmed by sawing, laser cutting, cleavage, lapping, or the like, among other techniques. Removal of 0.1-2 mm of the (000-1) edge may allow for removal of the region with the highest dislocation density, so that subsequent crystal growth may start with a dislocation density in the $10^7$ cm$^{-2}$ range or below, rather than in the $10^8$ cm$^{-2}$ to $10^9$ cm$^{-2}$ range. After removal of the edges, the newly formed edges may be lapped, polished, electrochemically polished, photoelectrochemically polished, reactive-ion-etched, and/or chemical-mechanically polished. At least one of the Ga-face (0001) and N-face (000-1) surfaces may be lapped, polished, electrochemically polished, photoelectrochemically polished, reactive-ion-etched, and/or chemical-mechanically polished. The proto-seed may be at least 25 mm, at least 40 mm, at least 50 mm, at least 75 mm, at least 100 mm, at least 125 mm, at least 150 mm, at least 200 mm, or at least 250 mm long in the longest direction, which may be in an m-direction. The proto-seed may be at least 0.3 millimeter, at least 1 millimeter, at least 2 millimeters, at least 5 millimeters, at least 10 millimeters, at least 15 millimeters, or at least 20 millimeters thick in the c-direction. The proto-seed may be at least 0.3 millimeter, at least 1 millimeter, at least 2 millimeters, at least 5 millimeters, at least 10 millimeters, at least 15 millimeters, or at least 20 millimeters wide in the a-direction.

The proto-seed may have a total impurity concentration below $1 \times 10^{18}$ cm$^{-3}$. The proto-seed may have impurity concentrations of oxygen (O), hydrogen (H), carbon (C), sodium (Na), and potassium (K) below $1 \times 10^{17}$ cm$^{-3}$, $2 \times 10^{17}$ cm$^{-3}$, $1 \times 10^{17}$ cm$^{-3}$, $1 \times 10^{16}$ cm$^{-3}$, and $1 \times 10^{16}$ cm$^{-3}$, respectively, as quantified by calibrated secondary ion mass spectrometry (SIMS), glow discharge mass spectrometry (GDMS), interstitial gas analysis (IGA), or the like. In some embodiments the impurity concentration of oxygen is less than $3 \times 10^{16}$ cm$^{-3}$ or less than $1 \times 10^{16}$ cm$^{-3}$. In some embodiments the impurity concentration of hydrogen is less than $1 \times 10^{17}$ cm$^{-3}$ or less than $3 \times 10^{16}$ cm$^{-3}$. In some embodiments the impurity concentration of carbon is less than $3 \times 10^{16}$ cm$^{-3}$, less than $1 \times 10^{16}$ cm$^{-3}$, or less than $3 \times 10^{15}$ cm$^{-3}$. In some embodiments the impurity concentrations of sodium and of potassium are less than $3 \times 10^{15}$ cm$^{-3}$ or less than $1 \times 10^{15}$ cm$^{-3}$. The proto-seed may have impurity concentrations of fluorine (F) and chlorine (Cl) below $1 \times 10^{15}$ cm$^{-3}$ and $1 \times 10^{15}$ cm$^{-3}$, respectively. The proto-seed is substantially free of stacking faults, with a concentration below 100 cm$^{-1}$. Other characteristics may also exist depending upon the specific embodiment.

In crystal growth processes, the impurity levels in seed crystals are similar to those in the crystal that is grown upon the seed. Such a process minimizes strains and possible deleterious effects such as misfit dislocation generation, unstable surface morphologies, and crack formation. Surprisingly, growth of bulk gallium nitride layers with a significant variation in impurity levels does not lead to severe consequences, as long as the variations are not too large, and offers significant benefits. In particular, this relative insensitivity to impurity gradients within a grown, composite gallium nitride crystal enables the crystal grower to take advantage of the different crystallographic growth-rate ratios achievable with different growth techniques and chemistries in order to grow large, high quality gallium nitride crystals. The composite gallium containing crystal may comprise at least a first region and a second region, the composite seed crystal being composed of a gallium containing material, the first region being characterized by a first set of impurity levels or concentrations and the second region being characterized by a second set of impurity levels or concentrations. The transition between the first set of impurity levels and the second set of impurity levels may occur within a transition thickness of less than about 100 micrometers, less than about 10 micrometers, or less than about 1 micrometer. In some embodiments, the composite crystal further comprises a third region, with a third set of impurity levels or concentrations. In still other embodiments, the composite crystal further comprises a fourth region, with a fourth set of impurity levels or concentrations. The transition between the second region and the third region, and/or between the third region and the fourth region, may occur within a transition thickness of less than about 100 micrometers, less than about 10 micrometers, or less than about 1 micrometer. In one or more embodiments, a concentration of at least one of hydrogen, oxygen, sodium, potassium, fluorine, or chlorine differs by at least a factor of three between the first region and the second region, between the second region and the third region, and/or between the third region and the fourth region. In one or more embodiments, a concentration of at least one of hydrogen, oxygen, sodium, potassium, fluorine, or chlorine differs by at least a factor of ten between the first region and the second region, between the second region and the third region, and/or between the third region and the fourth region. The composite gallium containing crystal may be formed using at least two, at least three, or at least four different growth chemistries and/or growth conditions.

Figure 3A:
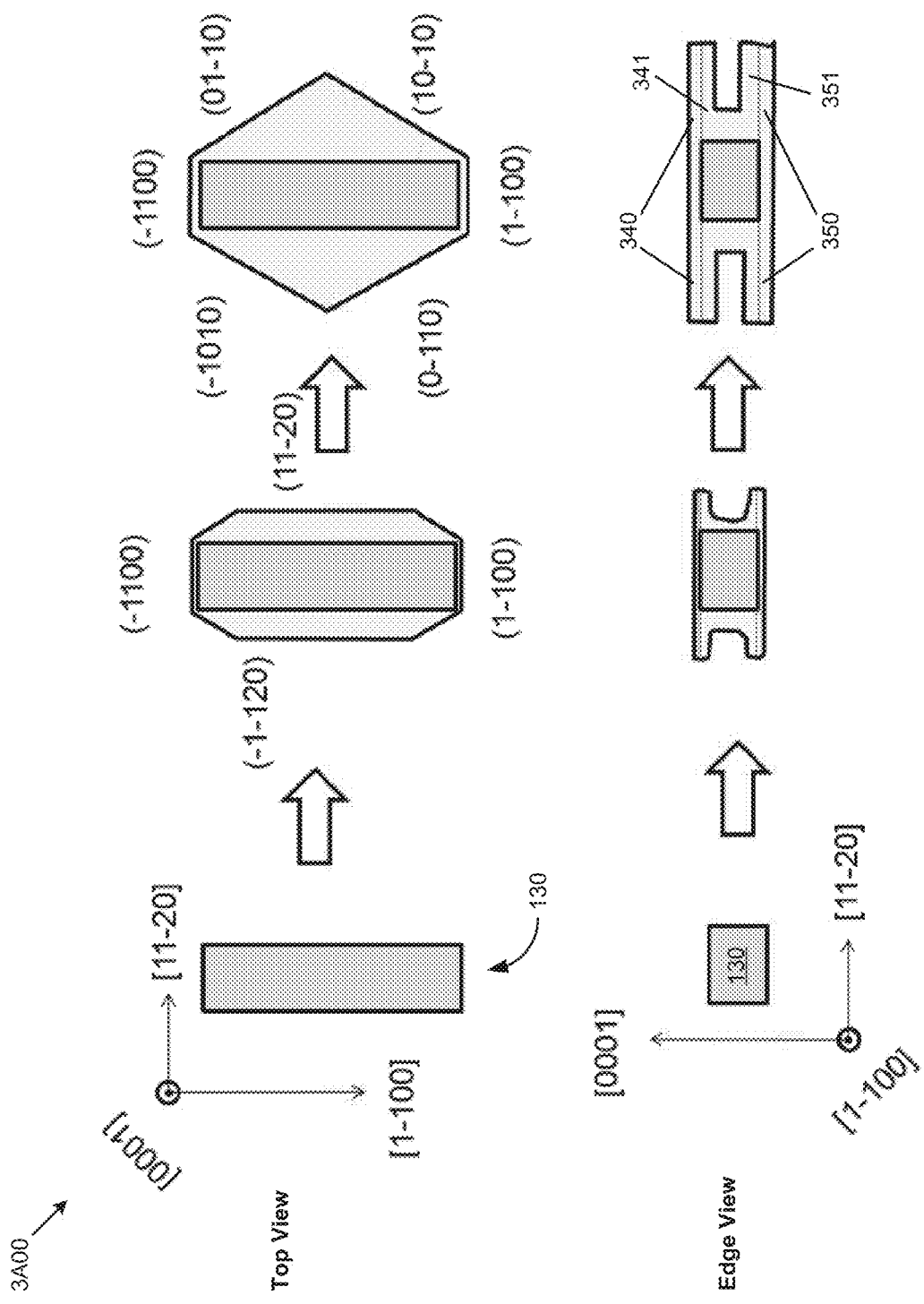
FIG. 3A is a simplified diagram illustrating a lateral growth process in the a-direction for forming a large area GaN crystal according to an embodiment of the present disclosure.

In a specific embodiment, illustrated in the schematic 3A00 of FIG. 3A, proto-seed 130 is used as a seed crystal for ammonothermal growth, under conditions favoring growth in the a direction. In some embodiments, ammonothermal growth is performed using an acidic mineralizer, comprising one or more of F, Cl, Br, or I. In some embodiments, ammonothermal growth is performed using a basic mineralizer, comprising one or more of Li, Na, K, Rb, and Cs. For example, an opening or hole is laser-cut near one end of the non-polar slice seed crystal. The crystal is hung from a silver wire or other suitable technique inside a silver capsule below a baffle. Polycrystalline GaN raw material, NH$_4$F mineralizer, and ammonia are added to the capsule with a ratio of approximately 15:1:8.5, but there can be other ratios according to a specific embodiment. The sealed capsule is placed in a cell in an internally-heated high pressure apparatus or other suitable apparatus. The cell is heated at about 11 degrees Celsius per minute until the temperature of the bottom of the capsule is approximately 700 degrees Celsius and the temperature of the top half of the capsule is approximately 650 degrees Celsius, as measured by type K thermocouples according to a specific embodiment. The temperature of the top half of the heater is then increased until the temperature gradient ΔT decreases to zero. After holding at ΔT=0 for 1 hour, the temperature of the top half of the capsule is decreased at 5 degrees Celsius per hour until ΔT increases to approximately 30 degrees Celsius, and the temperatures are held at these values for a predetermined time.

In a specific embodiment, the cell is then cooled and removed from the high pressure apparatus. The seed crystal grows in the a direction at a rate as high as about 60 micrometer per hour until the edges of the crystal become terminated by m planes, but can be higher or slightly lower in other applications. The m plane edges and the m-plane thickness of the crystal grow at a rate as high as about 17 micrometers per hour or greater, or slightly less according to a specific embodiment. In the example shown in FIG. 3A, growth takes place principally in the [11-20] and [-1-120] directions, with a lesser amount of growth in the [1-100] and [-1100] directions and in the [0001] and [000-1] directions (latter not shown). The edges of the a planes begin to become terminated by m planes, e.g., (01-10) and (10-10) surrounding a (11-20) facet.

In one set of embodiments, growth on the a-planes occurs homogenously and the cross section of the newly-grown a-wing or sector is greater than or approximately equal to the thickness of the proto-seed in the c-direction. In other embodiments, illustrated in the bottom half of FIG. 3A, growth on the a-planes occurs inhomogeneously. Inhomogeneous growth may be favored under conditions when a-direction growth is particularly rapid, which may be desired for cost-effective growth of large-area gallium containing crystals. During inhomogeneous a-direction growth the +c and −c edges of the crystal may grow more rapidly in the a-direction than the middle portions of the a planes, forming upper and lower a-wings 340 and 350, respectively. Without wishing to be bound by theory, we believe that a higher rate of growth may originate at the edges due to convective effects as the supercritical ammonia flows over the at least one proto-seed. As the wings on the +c and −c edges of the a plane overgrow the space between them, transport of supercritical ammonia with dissolved gallium-containing precursors into the space is inhibited, resulting in an even greater differential in the a-direction growth rates of the wings relative to the region in between the wings. Inhomogeneous growth of the a-wings may enable growth of higher-quality gallium-containing crystals, as strain between the +c and −c edges of the wings may be greatly reduced or eliminated, and lateral growth of the upper a-wings 340 may occur from the region of the proto-seed 130 with the highest crystallographic quality. As described in detail below, a-wings 340 and 350 may contain higher-defect regions 341 and 351 that may be desirable to remove.

In another embodiment, ammonothermal growth on the proto-seed is performed in an autoclave. In yet another embodiment, ammonothermal growth is performed in an internally-heated high pressure apparatus, as described in U.S. patent application Ser. Nos. 12/133,364, 12/133,365, and 61/075,723.

Figure 3B:
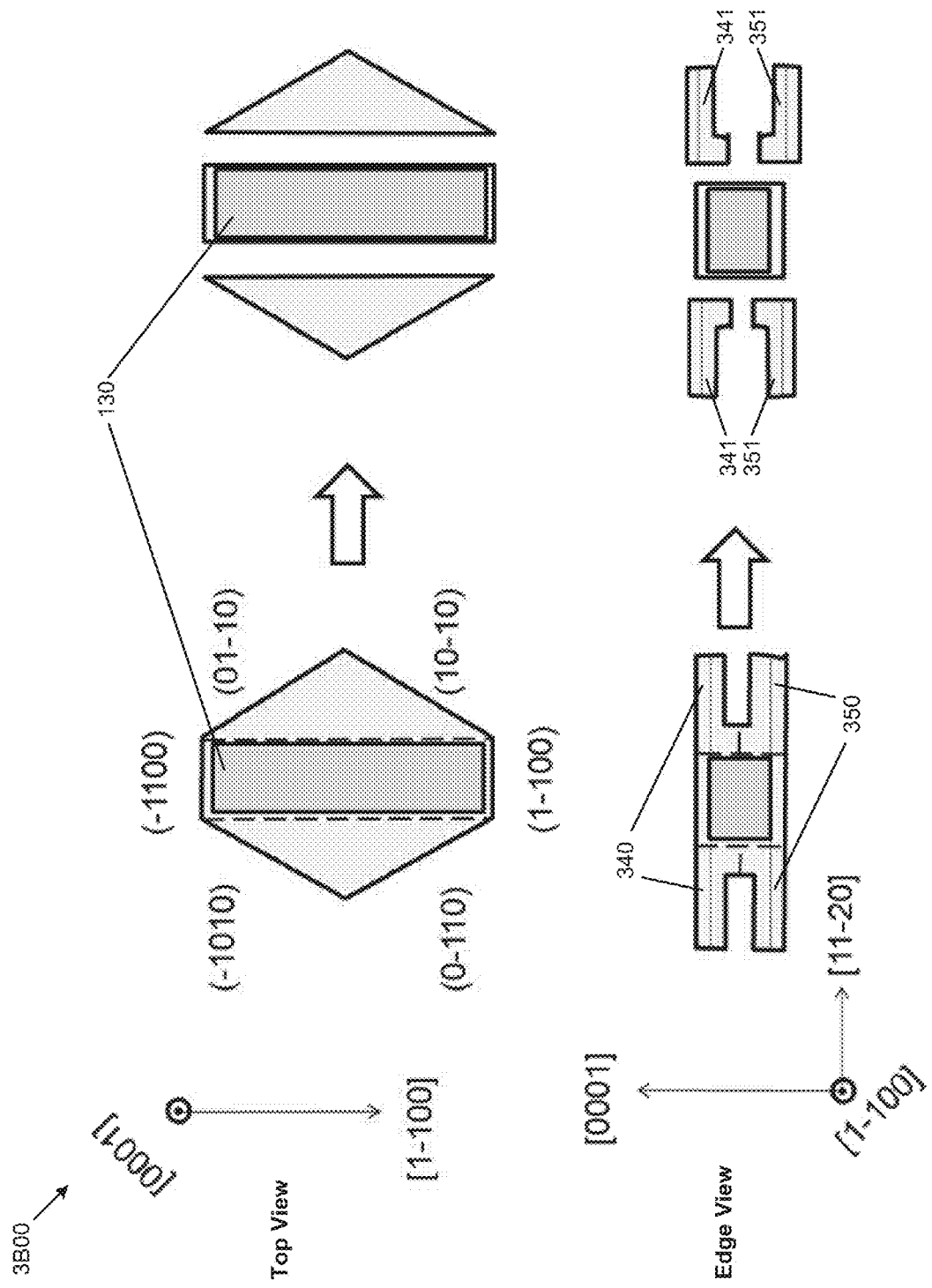
FIG. 3B is a simplified diagram illustrating a separation step for forming a large area GaN crystal according to an embodiment of the present disclosure.

Referring to the simplified diagram 3B00 of FIG. 3B, the a-wings 340 and 350 may be separated from the proto-seed 130 by sawing, laser-cutting, slicing, cleaving, or the like. Cuts or slices may be performed parallel and proximal to the original a faces of the proto-seed 130. If inhomogeneous growth has occurred the +c and −c a-wings 340 and 350 may be separated from each other by sawing, laser-cutting, slicing, cleaving, or the like. The newly exposed surfaces, which may have an a {11-20} or a ±c (0001)/(000-1) orientation, may be lapped, polished, electrochemically polished, photoelectrochemically polished, reactive-ion-etched, and/or chemical-mechanically polished. In some embodiments, as shown in FIG. 4, separation of a-wings 340 and 350 is performed after they are grown out to a half-rhombus shape. In other embodiments, separation of a-wings 340 and 350 from proto-seed 130 is performed before a-wings have fully grown out to a half-rhombus shape. For example, referring to FIG. 3A, the a-wings may be separated after performing an intermediate degree of lateral growth, as shown schematically in the middle panel of FIG. 3A. For example, the a-wings may be separated after performing between about 0.5 mm and about 5 mm of lateral growth from proto-seed 130.

Figure 3C:
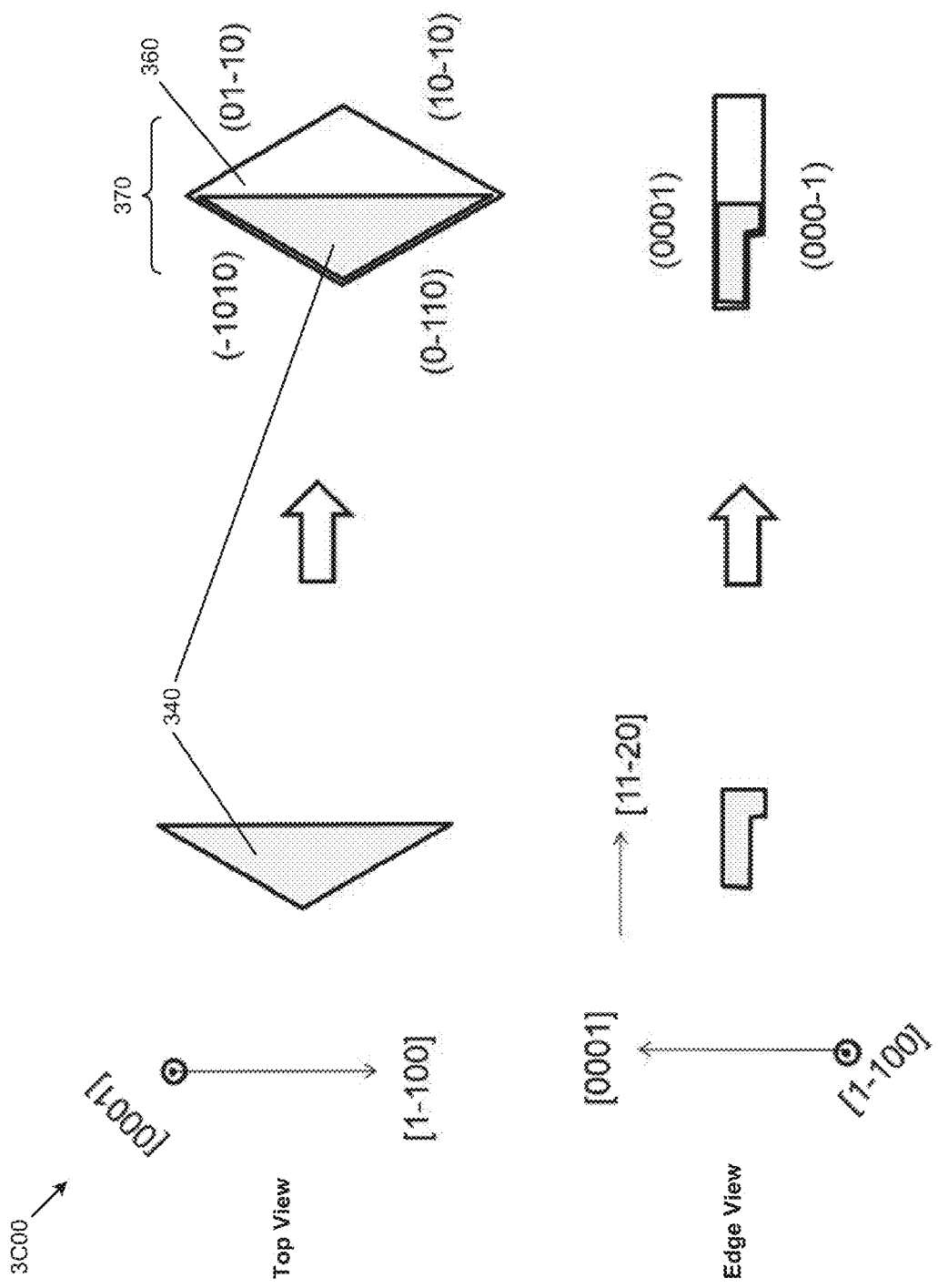
FIG. 3C is a simplified flow diagram illustrating a re-growth step for forming a large area GaN crystal according to an embodiment of the present disclosure.

Referring to the simplified diagram 3C00 of FIG. 3C, one or more a-wings 340 may be used as a seed crystal for ammonothermal growth, under conditions favoring growth in the a direction. The growth rate in the a-direction may be significantly larger than the growth rates in the m-direction or c-directions, resulting in a substantially rhombus-shaped crystal 370 comprising original a-wing 340 and newly-grown a-wing 360. If the thickness of a-wing 340 was non-uniform, for example, due to inhomogeneous growth in the a-direction, the variation in thickness may persist in growth of the rhombus-shaped crystal 370. If a-wing 340 was separated from the proto-seed prior to growing out to a full half-rhombus shape, a-direction growth may occur simultaneously on both a-edges of a-wing 340. The total extent of lateral growth, during at least one growth run, but possibly two, three, or more growth runs, may be greater than about 5 millimeters, greater than about 7.5 millimeters, greater than about 10 millimeters, greater than about 15 millimeters, greater than about 20 millimeters, greater than about 25 millimeters, greater than about 30 millimeters, greater than about 40 millimeters, or greater than about 50 millimeters. The original proto-seed 130, possibly with additional, epitaxially-grown material on the c-faces, a-faces, m-faces, and other faces, if present, may be used as a seed crystal for ammonothermal growth, under conditions favoring growth in the a direction. Ammonothermal growth on the re-grown proto-seed may be performed simultaneously, in the same apparatus, as growth on a-wing 340.

Rhombus crystal 370 may have a longest lateral dimension between about 25 millimeters and about 300 millimeters. Rhombus crystal 370 may have included angles of approximately 60 degrees or 120 degrees between adjacent m-plane facets. Rhombus crystal 370 may have a thickness between about 0.2 millimeter and about 25 millimeters. Rhombus crystal 370, which has been completely grown laterally with respect to the original c-plane proto-seed crystal, may have a c-plane dislocation density of about $10^0$-$10^5$ cm$^{-2}$ and a crystallographic radius of curvature greater than about 10 meters, greater than about 20 meters, greater than about 50 meters, or greater than about 100 meters. Rhombus crystal 370 may have an a-plane dislocation density that is greater by more than a factor of 10, greater by more than a factor of 100, or greater by more than a factor of 1000 than the dislocation density in a c-plane. In a specific embodiment, the top and bottom surfaces of the rhombus crystal may have impurity concentrations of O, H, C, Na, and K between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, below $1 \times 10^{17}$ cm$^{-3}$, below $1 \times 10^{16}$ cm$^{-3}$, and below $1 \times 10^{16}$ cm$^{-3}$, respectively, as quantified by calibrated secondary ion mass spectrometry (SIMS). In another embodiment, the top and bottom surfaces of the rhombus crystal may have impurity concentrations of O, H, C, and at least one of Na and K between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, below $1\times10^{17}$ cm$^{-3}$, and between about $3\times10^{15}$ cm$^{-3}$ and $1\times10^{17}$ cm$^{-3}$, respectively, as quantified by calibrated secondary ion mass spectrometry (SIMS). In still another embodiment, the top and bottom surfaces of the rhombus crystal may have impurity concentrations of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS). In some embodiments, the top and bottom surfaces of the rhombus crystal may have impurity concentrations of H between about $5\times10^{17}$ cm$^{-3}$ and $1\times10^{19}$ cm$^{-3}$, as quantified by calibrated secondary ion mass spectrometry (SIMS). In a specific embodiment, the rhombus crystal has an infrared absorption peak at about 3175 cm$^{-1}$, with an absorbance per unit thickness of greater than about 0.01 cm$^{-1}$. The rhombus crystal may contain several crystallites separated by low-angle grain boundaries but may be free from coalescence fronts of the type observed in epitaxial lateral overgrowth. In some embodiments, one or more corners of rhombus crystal 370 are missing but much of the rhombus outline is present, so that the crystal is substantially rhombus-shaped.

In a specific embodiment, the top surface of the rhombus crystal may be oriented to within 10 degrees, within 5 degrees, within 2 degrees, within 1 degree, within 0.3 degree, or within 0.1 degree of the (0001) Ga-face, c-plane orientation, may have an x-ray diffraction $\omega$-scan rocking curve full-width-at-half-maximum (FWHM) less than about 40 arcsec, less than about 30 arcsec, or less than about 20 arcsec for the (0002) and/or the (10-12) reflections and may have a dislocation density less than about $10^5$ cm$^{-2}$, less than about $10^4$ cm$^{-2}$, less than about $10^3$ cm$^{-2}$, less than about $10^2$ cm$^{-2}$, or less than about 10 cm$^{-2}$. The crystallographic orientation may be constant to less than about less than about 1 degree, less than about 0.5 degree, less than about 0.2 degree, less than about 0.1 degree, or less than about 0.05 degree across the top surface of the rhombus crystal.

Figure 4A:
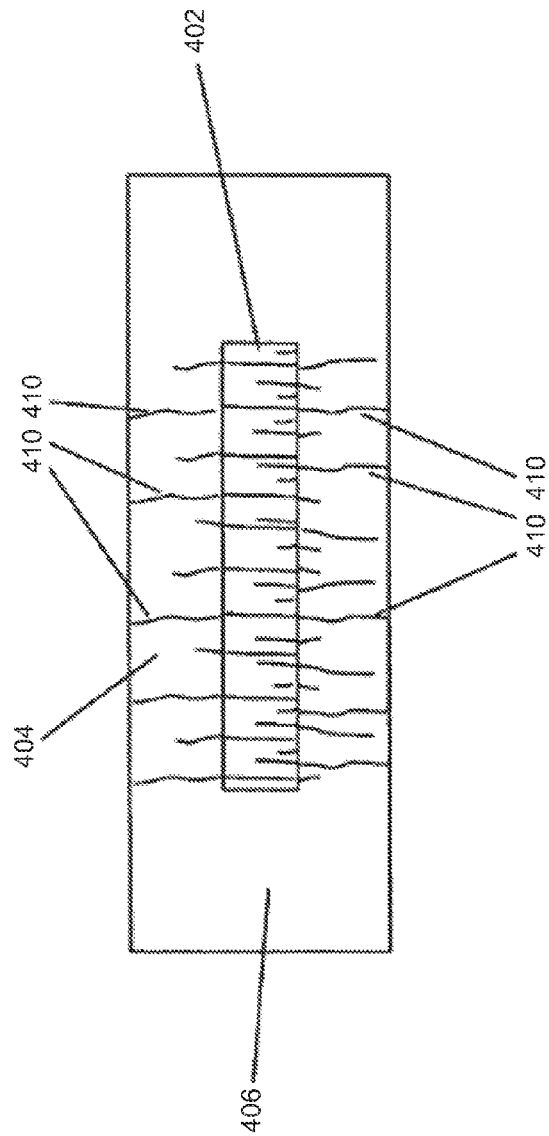
FIG. 4A is a simplified diagram for dislocation propagation during ammonothermal growth according to the prior art.

Referring to the simplified diagram 4A00 of FIG. 4A, as described in U.S. Patent 7,078,731, for example, it has commonly been believed that dislocations 410 in ammonothermally-grown crystals originating from c-plane-grown HVPE seeds 402 propagate in the +c and -c directions during ammonothermal growth but not significantly in lateral growth directions 406. Regions 404 that are free of dislocations are consequently relatively small. It has also been commonly believed that stacking faults present in a seed crystal will propagate into ammonothermally-grown layers grown upon the seed crystal, but that growth from a stacking-fault-free bulk GaN seed will lead to stacking-fault-free material in ammonothermally-grown layers. We find, surprisingly, that both of these beliefs are incorrect.

Figure 4B:
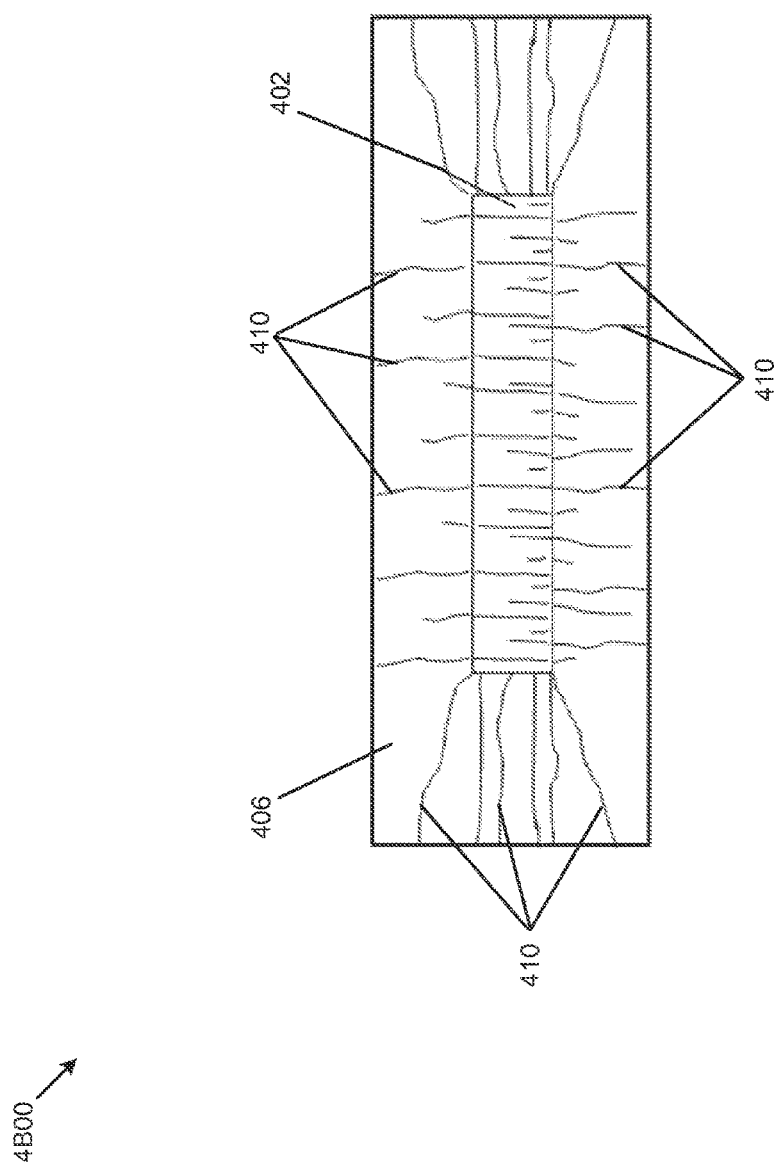
FIG. 4B is a simplified diagram for dislocation propagation during ammonothermal growth according to an embodiment of the present disclosure.

We find, by contrast, as shown in the schematic 4B00 of FIG. 4B, that dislocations 410 can propagate in many directions with respect to seed 402, including both c-plane and m-plane, both vertically and laterally. Region 406, having a reduced dislocation density, has a significantly lower volume than has been realized and, under conditions, may contain significant concentrations of basal stacking faults. However, by judicious selection of seed crystals, growth direction, and growth time, we have discovered conditions whereby ammonothermal GaN material, including nonpolar and semipolar oriented material, with a threading dislocation density below $10^5$ cm$^{-2}$, below $10^4$ cm$^{-2}$, below $10^3$ cm$^{-2}$, or below $10^2$ cm$^{-2}$, can be produced.

Figure 5:
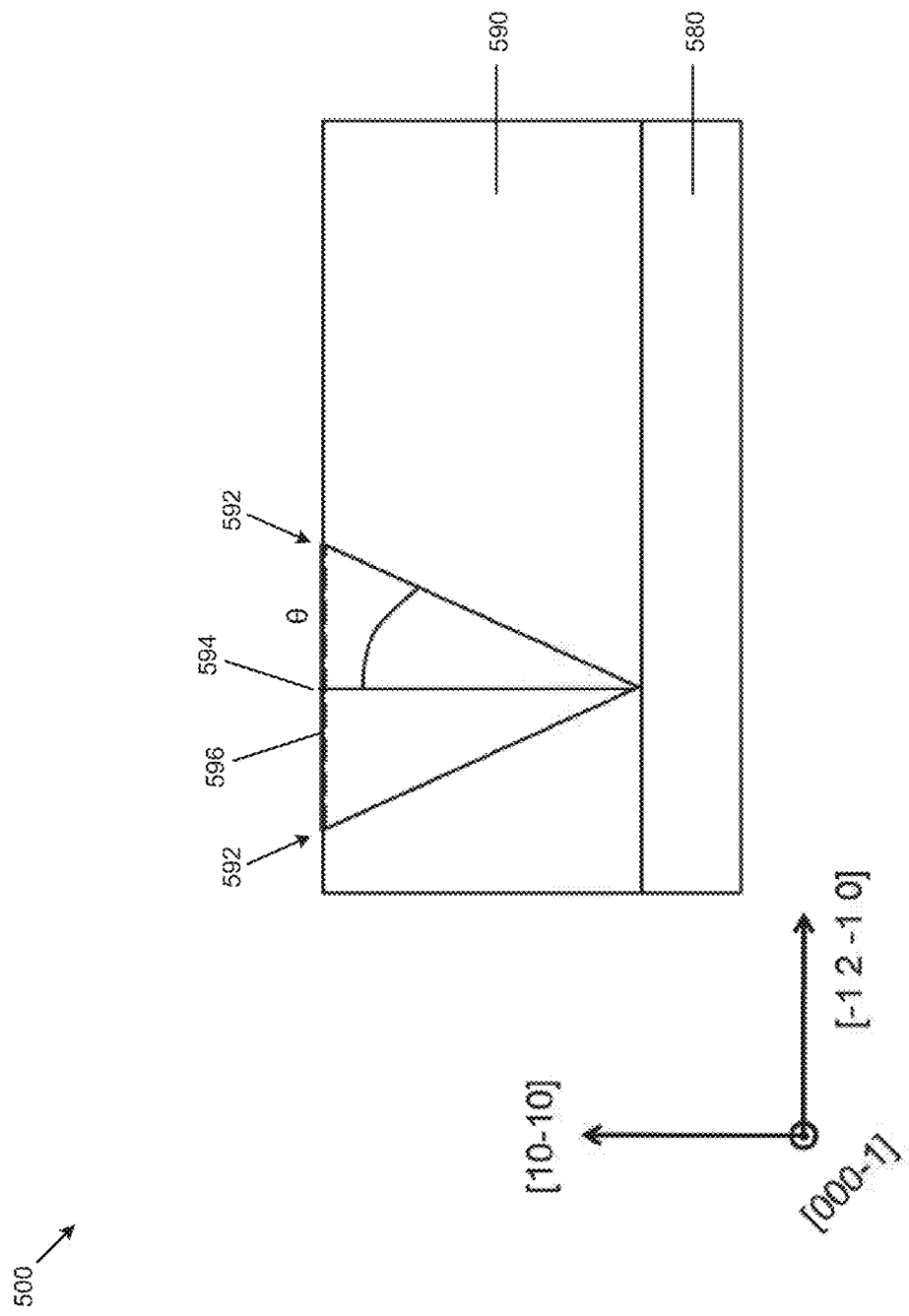
FIG. 5 is a simplified diagram for propagation of basal stacking faults during ammonothermal growth according to an embodiment of the present disclosure.

We also find, as shown in the schematic 500 of FIG. 5, that basal stacking faults may form during ammonothermal growth on stacking-fault-free, HVPE-grown seed crystals 580, particularly when that growth occurs in nonpolar or semipolar orientations, as would be desired for formation of large-area nonpolar or semipolar GaN crystals or wafers. Stacking fault 596 in ammonothermally-grown layer 590 is oriented in the a-direction and is terminated by partial dislocations 592 that form a half-angle $\theta$ with respect to surface normal 594. Half-angle $\theta$ may be between about 0.1 degree and about 30 degrees, or between about 0.4 degree and about 15 degrees. The stacking faults may form as a consequence of residual strain in the seed crystal, a slight lattice mismatch between the seed crystal and the ammonothermally-grown layer, the presence of -c N-face micro- or nanofacets on the surface of the layer during ammonothermal growth, or the like. In certain embodiments the stacking faults form predominantly at or near the interface between the seed crystal and the new ammonothermally-grown layer. In certain embodiments additional stacking faults may nucleate and grow within the ammonthermally-grown layer.

Kamler and co-workers have found that dislocation loops can form during c-plane growth of GaN, with stacking-faulted regions within the loop (Kamler et al., *The European Physical Journal Applied Physics*, 27(1-3), 247-249 (2004)). Similarly, Liliental-Weber and co-workers observed dislocation loops surrounding stacking-faulted regions in bulk GaN crystals of extremely high crystallographic quality (Lilental-Weber et al., *Journal of Electronic Materials*, 25(9), 1545-1550 (1996)). Slicing of such a crystal to expose a nonpolar or semipolar surface may intersect such dislocation loops and give rise to stacking faults on the surface. Consequently, in the absence of data indicating absence of stacking faults in bulk GaN crystals, even bulk GaN crystals grown in the c-direction, one must assume that stacking faults are present.

A method for detecting and quantifying extended defects, including threading dislocations and basal stacking faults, in gallium-containing nitride crystals, wafers, or devices, may be outlined as follows:

Provide one or more gallium-containing nitride crystals, wafers, or devices. The crystals, wafers, or devices may have a maximum dimension between about 0.1 millimeter and about 1000 millimeters.

Optionally, protect one or more surfaces of a gallium-containing nitride crystal, wafer, or device to protect the surface(s) from unwanted attack. For example, a (000-1) -c surface may be protected by tightly wrapping with Teflon® tape, clamping the -c N end or face of a crystal against Teflon®, or by coating with a Teflon®-containing paint and allowing to dry and/or cure. Teflon® may be replaced by an alternative etch-resistant material, if desired.

Prepare an etchant solution. In certain embodiments, a solution of 85% phosphoric acid ($H_3PO_4$) and sulfuric ($H_2SO_4$) acids is prepared. The $H_2SO_4/H_3PO_4$ ratio may vary between 0 and about 1:1. In certain embodiments, a phosphoric acid solution is conditioned to form polyphosphoric acid, increasing its boiling point. For example reagent-grade (85%) $H_3PO_4$ may be stirred and heated in a beaker, at a temperature between about 200 degrees Celsius and about 450 degrees Celsius for between about 5 minutes and about five hours. Polyphosphoric acid, $H_{(n+2)}P_nO_{(3n+1)}$, which may have an apparent $H_3PO_4$ concentration between about 85% and about 120%, may also be referred to as pyrophosphoric acid, tetraphosphoric acid, and superphosphoric acid.

Etch one or more gallium-containing nitride crystals, wafers, or devices in the etchant solution. The etchant solution may be stirred, and the etching treatment may be performed at a temperature between about 100 degrees Celsius and about 500 degrees Celsius for between about 5 minutes and about 5 hours. Etching should be performed at a high enough temperature, for a long enough time, so that etch pits large enough to be detected reliably are formed on the crystallographic plane(s) of interest. However, the conditions should not be so severe that etch pits substantially overlap one another, or quantification may be difficult. For example, the etch pits may have lateral dimensions between about 1 micrometer and about 25 micrometers.

Remove one or more gallium-containing nitride crystals, wafers, or devices from the etchant solution, wash, dry, and examine under a microscope. The etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density. The presence of grooves, with a width similar to that of the etch pits but extended in the <11-20> direction, indicates the presence of stacking faults. The stacking fault concentration within a field of view may be calculated as the sum of the lengths of the stacking-faulted regions divided by the area of the field of view. Improved statistics may be obtained by repeating this measurement in additional fields of view and calculating the average stacking fault density.

We find that this treatment, with adjustments made to the etch temperature and/or the etch time to accommodate differences in etch rates between different crystallographic planes, doping levels (Fermi level), etc., works well to detect and quantify etch pits (threading dislocations) and/or etch grooves (basal stacking faults) on surfaces comprising: (i) on-axis {10-10} m-plane or m-plane surfaces that are miscut towards [000-1] and/or toward <11-20> by about 10 degrees or less; (ii) {10-1-1} semi-polar surfaces; and (iii) {h 0 -h -1} semipolar surfaces. For example, this treatment works well to quantify threading dislocations and stacking faults in surfaces that are miscut from {10-10} m-plane by between about −60 degrees and about +1 degree toward [0001] +c-direction and by up to about 10 degrees toward an orthogonal <1-210> a-direction, or that are miscut from {10-10} m-plane by between about −30 degrees and about +1 degree toward [0001] +c-direction and by up to about 5 degrees toward an orthogonal <1-210> a-direction. We find that, presumably due to crystallographic anisotropy in the etch rates, etching of {10-10} surfaces that are miscut toward [0001] by more than about 0.5 degree or of {h 0 -h +1} semipolar surfaces may not produce any etch pits despite the presence of dislocations and/or stacking faults. The impact of this limitation can be minimized by performing etch evaluation of both the front and back surface of m-plane or semi-polar wafers. By treating the front and back surfaces of gallium-containing nitride crystals, wafers, or devices, which may be substantially parallel to one another, simultaneously, therefore, this treatment works well to quantify threading dislocations and stacking faults crystals, wafers, or devices having surfaces that are miscut from {10-10} m-plane by between about −60 degrees and about +60 degrees toward [0001] +c-direction and by up to about 10 degrees toward an orthogonal <1-210> a-direction, that are miscut from {10-10} m-plane by between about −30 degrees and about +30 degree toward [0001] +c-direction and by up to about 5 degrees toward an orthogonal <1-210> a-direction, or that are miscut from {10-10} m-plane by between about −5 degrees and about +5 degree toward [0001] +c-direction and by up to about 1 degree toward an orthogonal <1-210> a-direction. In certain embodiments, the front and back surfaces may be substantially parallel to within about 2 degrees, within about 1 degrees, within about 0.5 degrees, and in certain embodiments, within less than about 0.5 degrees.

The anisotropy between etching of m-plane surfaces miscut towards [000-1] versus [0001], and the anisotropy of the etch pits themselves, may be decreased by increasing the $H_2SO_4/H_3PO_4$ ratio from 0 to between about 1:10 and about 1:1, or to between about 1:5 and about 1:2. However, addition of $H_2SO_4$ to the etchant solution tends to increase the rate of attack of any (000-1) −c surfaces present, increasing the importance of protecting them against exposure to the etchant solution.

For example, for etch-characterization of n-type (doping level between about $1\times10^{17}$ cm$^{-3}$ and about $3\times10^{18}$ cm$^{-3}$), m-plane GaN, we find that etching in stirred, conditioned $H_3PO_4$ in a beaker on a hot plate, at a hot plate temperature of about 350 degrees Celsius, for a time between about 30 minutes and about 60 minutes, works well. The conditioned $H_3PO_4$ may be prepared by heating reagent-grade (85%) $H_3PO_4$ in a beaker, stirred at about 70 revolutions per minute, at a hot plate temperature of approximately 450 degrees Celsius for about one hour. Etch pits associated with threading dislocations on m-plane GaN may be rectangular, with four facets meeting at a vertex in approximately the center of the pit. The pits may be approximately 2-3 micrometers long along the ±c direction and about 1 micrometer long along the a direction and about 100 nanometers deep. Etch grooves, associated with stacking faults on m-plane GaN may have a width of about 2-4 micrometers in the ±c direction, a length between about 5 micrometers up to about 1 millimeter or even longer, and a depth of about 100 nanometers. Of course, etching at higher temperatures and/or longer times will tend to produce larger, deeper pits, while etching at lower temperatures and/or shorter times will tend to produce smaller, shallower pits. To a good approximation, the lengths of the etch grooves associated with stacking faults is independent of the etching conditions.

In certain embodiments, the surface to be etch-characterized has been polished and chemical-mechanically polished. In certain embodiments, the surface to be etch-characterized is in the as-grown state. Detection and quantification of threading dislocations and basal stacking faults may be more reliable with polished surfaces.

To detect stacking faults in c-plane oriented crystals or wafers, an m-plane surface may be prepared by cleaving, sawing, grinding, slicing, or the like. The prepared m-plane surface may be lapped, polished, and chemical-mechanically polished. The crystal or wafer with the prepared m-plane surface may then be etched characterized as described above.

A method for detecting and quantifying extended defects, including threading dislocations and basal stacking faults, in near-c-plane-oriented gallium-containing nitride crystals, wafers, or devices, may be outlined as follows:

Provide one or more near-c-plane-oriented gallium-containing nitride crystals, wafers, or devices. The crystals, wafers, or devices may have a maximum dimension between about 0.1 millimeter and about 1000 millimeters. The (0001) +c-plane surface, or a surface vicinal to it, optionally, may be subjected to one or more of lapping, polishing, and chemical mechanical polishing in order to render the +c-plane surface smooth and specular.

Prepare a first etchant composition comprising one or more of NaOH and KOH. Optionally, MgO powder may be added.

Etch one or more crystals, wafers, or devices in the first etchant composition at a temperature between about 300 degrees Celsius and about 500 degrees Celsius for a time between about 30 seconds and about one hour. Etching should be performed at a high enough temperature, for a long enough time, so that etch pits large enough to be detected reliably are formed on the (0001) +c plane. However, the conditions should not be so severe that etch pits substantially overlap one another, or quantification may be difficult. For example, the etch pits may have lateral dimensions between about 1 micrometer and about 25 micrometers.

Remove one or more gallium-containing nitride crystals, wafers, or devices from the first etchant composition, wash, dry, and examine under a microscope. The c-plane etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density.

Prepare an m-plane surface on a near-c-plane-oriented gallium-containing nitride crystal, wafer, or device by cleaving, sawing, slicing, or the like. The m-plane surface may have a surface area of at least about 3 square millimeters. The m-plane surface, optionally, may be subjected to one or more of lapping, polishing, and chemical mechanical polishing in order to render the m-plane surface smooth and specular.

Optionally, protect one or more surfaces of a gallium-containing nitride crystal, wafer, or device to protect the surface(s) from unwanted attack. For example, a (000-1) –c surface may be protected by tightly wrapping with Teflon® tape, clamping the –c N end or face of a crystal against Teflon®, or by coating with a Teflon®-containing paint and allowing to dry and/or cure. Teflon® may be replaced by an alternative etch-resistant material, if desired.

Prepare a second etchant composition. In certain embodiments, a solution of 85% phosphoric acid ($H_3PO_4$) and sulfuric ($H_2SO_4$) acids is prepared. The $H_2SO_4/H_3PO_4$ ratio may vary between 0 and about 1:1. In certain embodiments, a phosphoric acid solution is conditioned to form polyphosphoric acid, increasing its boiling point. For example reagent-grade (85%) $H_3PO_4$ may be stirred and heated in a beaker, at a temperature between about 200 degrees Celsius and about 450 degrees Celsius for between about 5 minutes and about five hours.

Etch one or more gallium-containing nitride crystals, wafers, or devices in the second etchant composition. The etchant solution may be stirred, and the etching treatment may be performed at a temperature between about 100 degrees Celsius and about 500 degrees Celsius for between about 5 minutes and about 5 hours. Etching should be performed at a high enough temperature, for a long enough time, so that etch pits large enough to be detected reliably are formed on the m-plane(s) of interest. However, the conditions should not be so severe that etch pits substantially overlap one another, or quantification may be difficult. For example, the etch pits may have lateral dimensions between about 1 micrometer and about 25 micrometers.

Remove one or more gallium-containing nitride crystals, wafers, or devices from the etchant solution, wash, dry, and examine under a microscope. The m-plane etch pit density, which is taken as a measure of the concentration of threading dislocations, may be quantified by counting the number of pits within a field of view and dividing by the area of the field of view. Improved statistics may be obtained by repeating this measurement in additional fields of view and calculating the average etch pit density. The presence of grooves, with a width similar to that of the etch pits but extended in the <11-20> direction, indicates the presence of stacking faults in the m-plane. The stacking fault concentration within a field of view may be calculated as the sum of the lengths of the stacking-faulted regions divided by the area of the field of view. Improved statistics may be obtained by repeating this measurement in additional fields of view and calculating the average stacking fault density.

We have also investigated detection of threading dislocations and stacking faults on m-plane GaN surfaces by etching in molten NaOH/KOH, following Kamler et al. (Kamler et al., *The European Physical Journal Applied Physics*, 27(1-3), 247-249 (2004)). We found, however, that this method has two significant disadvantages relative to etching in $H_3PO_4/H_2SO_4$: (i) the etch pits tend to be broader (higher width/depth ratio), making it more difficult to form pits than can be unambiguously detected without also causing significant overlap between adjacent pits; and (ii) a much more extreme etch anisotropy. We find that pits on m-plane surface mis-oriented by only about 0.1 degree towards [000-1] tend to be highly asymmetric, with clearly defined etch pit boundaries towards [0001] and towards <11-20> but the etch pit boundary towards [000-1] may be difficult to observe. Etching of m-plane surface misoriented by only about 0.1 degree towards [0001] produced no etch pits at all but only formation of macro-steps, whose morphology appeared to be unrelated to the underlying dislocation or stacking fault structure.

We find that lateral ammonothermal growth on non-polar or semi-polar HVPE-grown seed crystals produces some surprising behavior, and that this behavior may be exploited to fabricate large area, low-dislocation-density, stacking-fault free nonpolar and semipolar boules and wafers.

Under certain ammonothermal crystal growth conditions, the relative growth rates in the m-direction, +c-direction, –c-direction, <1 0 –1 +1> directions, and <1 0 –1 –1> directions are such that formation of at least one of {1 0 –1 1} and {1 0 –1 –1} facets are not stable. Under certain ammonothermal crystal growth conditions, the relative growth rates in the m-direction, +c-direction, –c-direction, <1 0 –1 +1> directions, and <1 0 –1 –1> directions are such that formation of at least one of {1 0 –1 1} and {1 0 –1 –1} facets are stable but neither the +c or –c facets grow themselves out. Under certain ammonothermal crystal growth conditions, the relative growth rates in the m-direction, +c-direction, –c-direction, <1 0 –1 +1> directions, and <1 0 –1 –1> directions are such that formation of at least one of {1 0 –1 1} and {1 0 –1 –1} facets are stable and at least one of the +c and –c facets grow themselves out and disappear from the external morphology of the grown crystal. Examples of these behaviors are shown in schematic 6A00, schematic 6B00, schematic 6C00, schematic 6D00, schematic 6E00, and schematic 6F00, of FIG. 6A, FIG. 6B, FIG. 6C, FIG. 6D, FIG. 6E, and FIG. 6F.

Figure 6A:
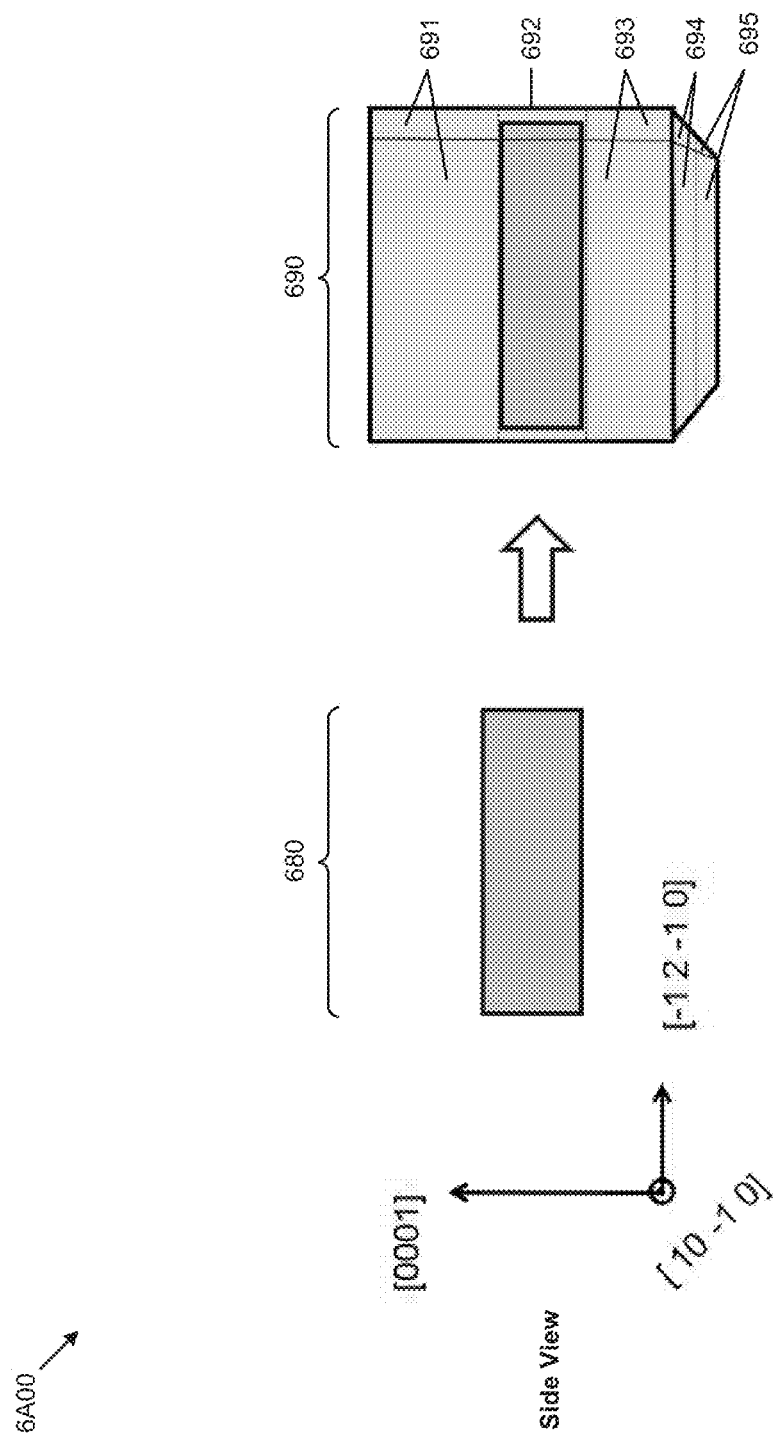
FIG. 6A is a simplified diagram showing a side view of a crystal growth process for forming growth sectors that are substantially free of stacking faults and have ultralow dislocation densities according to an embodiment of the present disclosure.
Figure 6B:
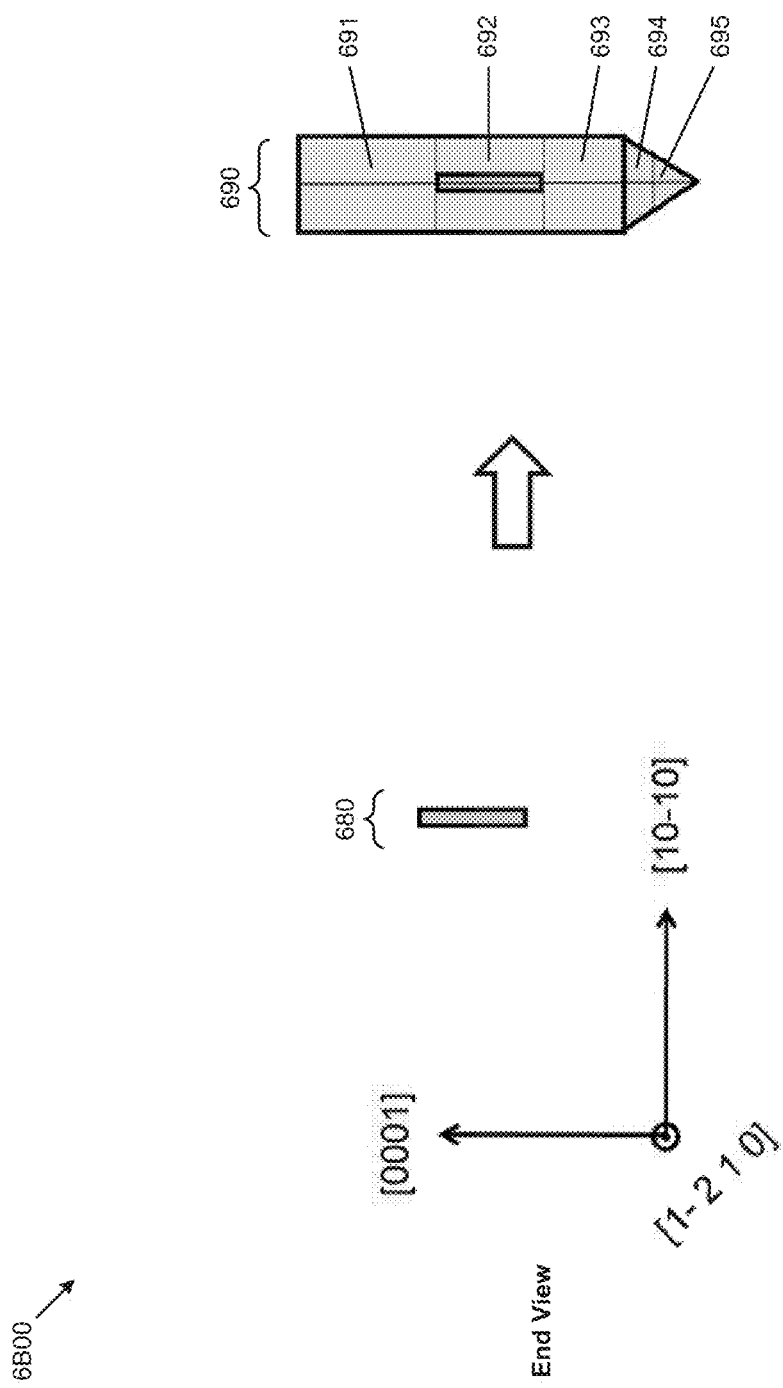
FIG. 6B is a simplified diagram showing an end view of a crystal growth process for forming growth sectors that are substantially free of stacking faults and have ultralow dislocation densities according to an embodiment of the present disclosure.
Figure 6C:
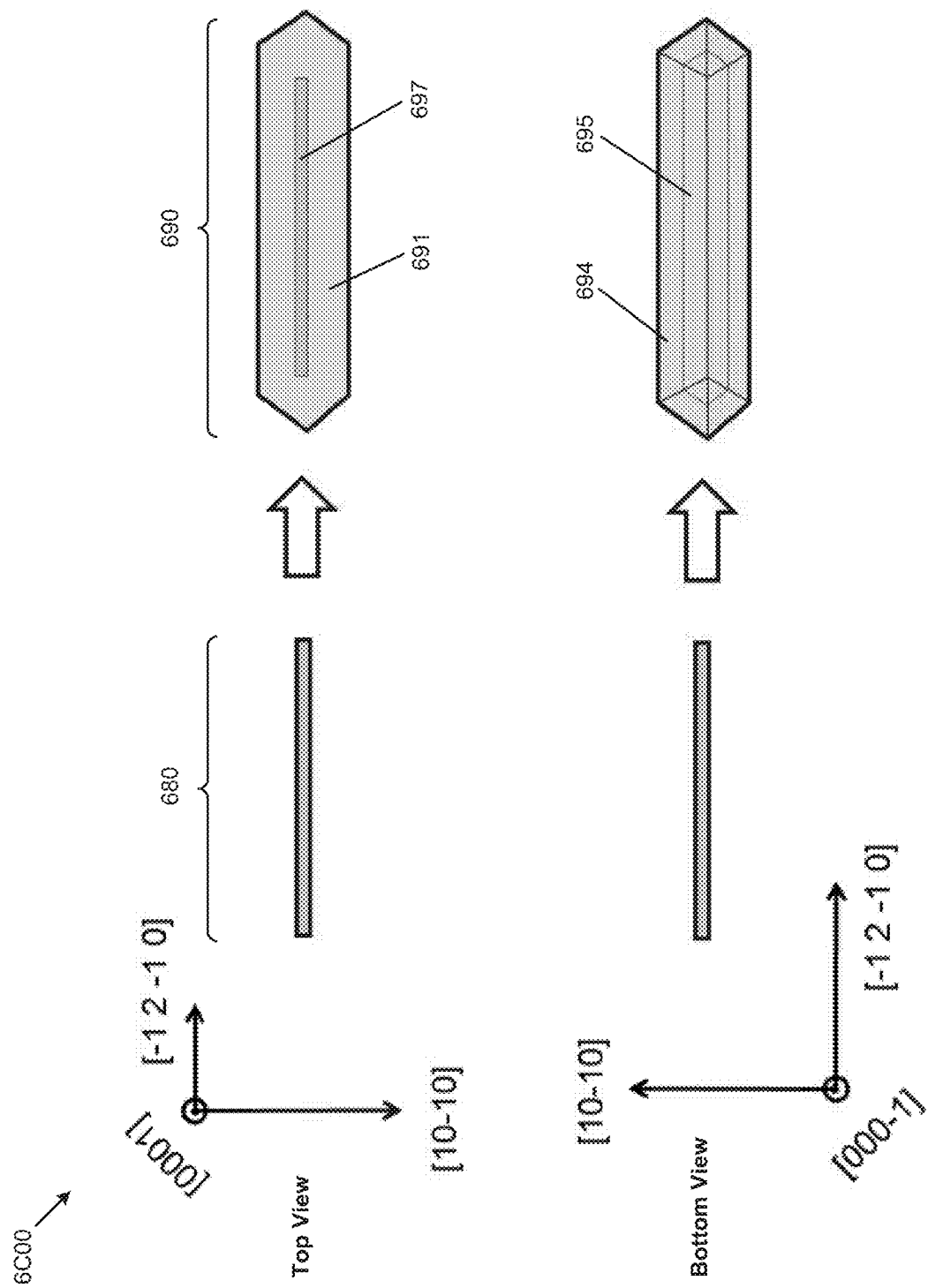
FIG. 6C is a simplified diagram showing top and bottom views of a crystal growth process for forming growth sectors that are substantially free of stacking faults and have ultralow dislocation densities according to an embodiment of the present disclosure.

Referring to the upper portions of FIG. 6A, FIG. 6B, and FIG. 6C, growth of seed crystal 680 in the +c [0001] direction may occur, giving rise to a +c sector 691 in ammonothermally grown crystal 690. The m-surfaces of +c sector 691 may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$. The +c surface of +c sector 691 (FIG. 6C) may similarly be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$, with the exception of a higher-defect region 697 similar in size to the +c edge of seed crystal 680, which may have a dislocation density approximately equal to that of seed crystal 680. Ammonthermally-grown crystal 690 may also have an m-region 692 comprising large-area m-surfaces on either side of the m-surfaces of seed crystal 680 plus newly formed m-faces. The large-area m-surfaces of m-region 692 may have a stacking fault concentration above 10 cm$^{-1}$ and a dislocation density above about $10^3$ cm$^{-2}$. Ammonthermally-grown crystal 690 may also have a −c sector 693, whose m-surfaces may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$. Ammonthermally-grown crystal 690 may also have a first {10-1-1} region 694 adjacent to −c sector 694, which may have intermediate properties, including a dislocation density below about $10^7$ cm$^{-2}$ but greater than about $10^2$ cm$^{-2}$. Ammonthermally-grown crystal 690 may have a second {10-1-1} sector 695, adjacent to region 694 and terminating with a −c edge, the −c surface having grown itself out of existence. The {10-1-1} surfaces of sector 695 may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$.

Figure 6D:
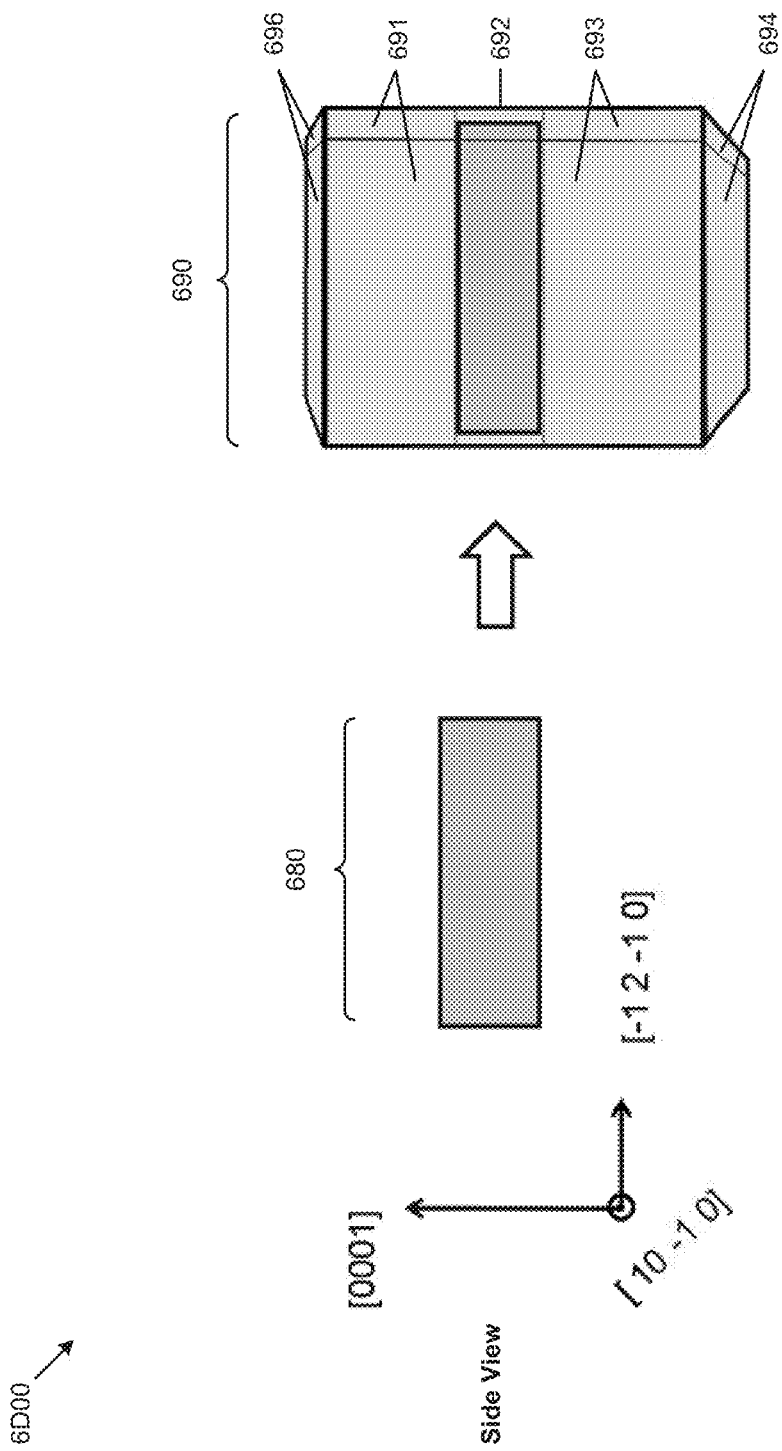
FIG. 6D is a simplified diagram showing a side view of a crystal growth process for forming growth sectors that are substantially free of stacking faults and have ultralow dislocation densities according to an embodiment of the present disclosure.
Figure 6E:
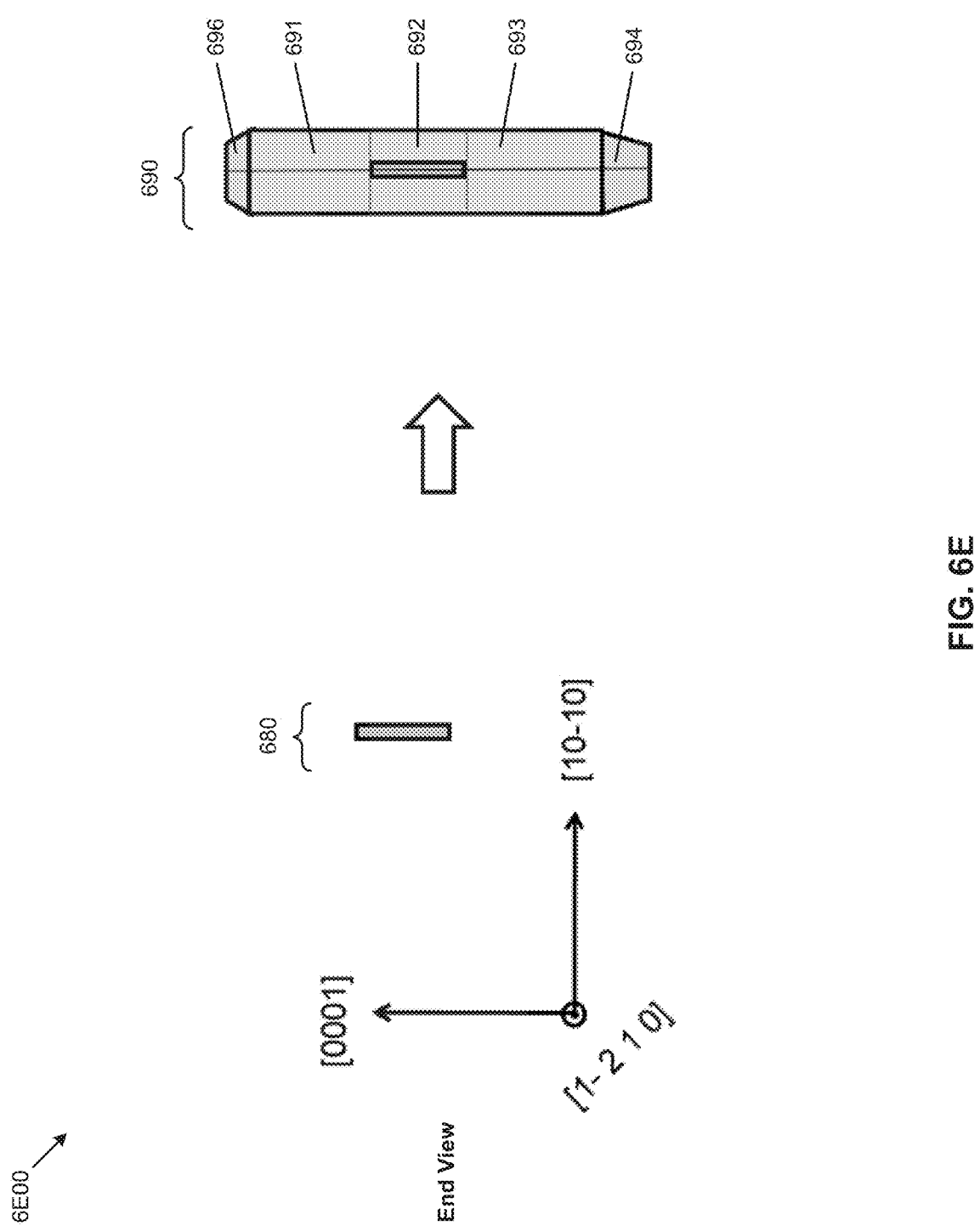
FIG. 6E is a simplified diagram showing an end view of a crystal growth process for forming growth sectors that are substantially free of stacking faults and have ultralow dislocation densities according to an embodiment of the present disclosure.
Figure 6F:
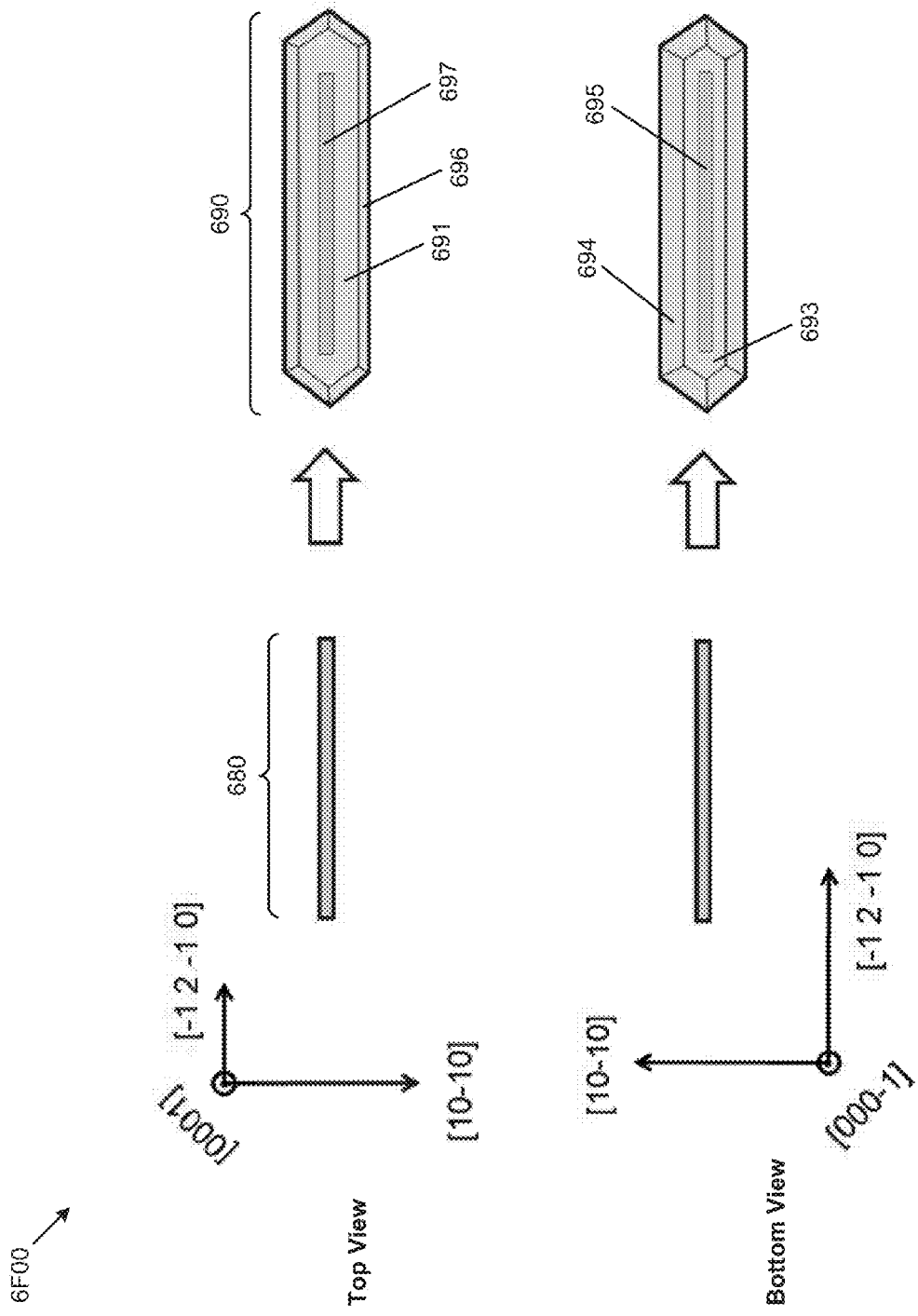
FIG. 6F is a simplified diagram showing top and bottom views of a crystal growth process for forming growth sectors that are substantially free of stacking faults and have ultralow dislocation densities according to an embodiment of the present disclosure.

Referring to FIG. 6D, FIG. 6E, and FIG. 6F, growth in one or more of the +c and −c directions may produce {10-11} and/or {10-1-1} facets but the +c and/or −c facets may not growth themselves out of existence. The m-surfaces of +c sector 691 may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$. Ammonthermally-grown crystal 690 may also have an m-region 692 comprising large-area m-surfaces on either side of the m-edges of seed crystal 680 plus newly formed m-faces. The large-area m-surfaces of m-region 692 may have a stacking fault concentration above 10 cm$^{-1}$ and a dislocation density above about $10^3$ cm$^{-2}$. Ammonthermally-grown crystal 690 may also have a −c sector 693, whose m-surfaces may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$. Ammonthermally-grown crystal 690 may have a {10-11} region 696 adjacent to +c sector 691, which may have intermediate properties, including a dislocation density below about $10^7$ cm$^{-2}$ but greater than about $10^2$ cm$^{-2}$. Ammonthermally-grown crystal 690 may also have a {10-1-1} region 694 adjacent to −c sector 694, which may have intermediate properties, including a dislocation density below about $10^7$ cm$^{-2}$ but greater than about $10^2$ cm$^{-2}$. The +c surface of +c sector 691 (FIG. 6F) may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$, with the exception of a higher-defect region 697 whose +c surface may be similar in size to the +c edge of seed crystal 680 and which may have a dislocation density approximately equal to that of seed crystal 680. The −c surface of −c sector 693 (FIG. 6F) may be essentially free of stacking faults, with a stacking fault concentration below $10^2$ cm$^{-1}$, below 10 cm$^{-1}$, or below 1 cm$^{-1}$, and may have a very low dislocation density, below $10^4$ cm$^{-2}$, below $10^3$ cm$^{-2}$, or below $10^2$ cm$^{-2}$, with the exception of a higher-defect region 695, whose surface may be similar in size to the −c edge of seed crystal 680 and may have a dislocation density approximately equal to that of seed crystal 680.

Ultra-low defect crystals may be prepared from ammonthermally-grown crystal 690 by a two-step operation comprising separation of a growth sector from ammonthermally-grown crystal 690 and removal of residual material containing a higher concentration of threading dislocations and/or stacking faults. For example, referring again to FIG. 6A, FIG. 6B, FIG. 6D, and FIG. 6E, a first step may comprise sawing, slicing, cleaving, or the like along the dotted lines to separate ultralow-defect +c sector 691 from m-region 692, the seed crystal and the balance of the crystal or to separate ultralow-defect −c sector 693 from m-region 692, the seed crystal and the balance of the crystal. Then, referring again to FIG. 6C and FIG. 6F, a second step may comprise removal of higher-defect region 697 and/or higher defect region 695), which may extend between seed crystal 680 and the +c surface and/or −c surface, from ultralow-defect +c sector 691 and/or from ultralow-defect −c sector 693. Removal of higher-defect regions 697 or 695 may be carried out by mechanical drilling, laser drilling, by saw-cutting parallel to higher-defect regions 697 or 695 and/or substantially through the higher-defect regions.

Figure 16A:
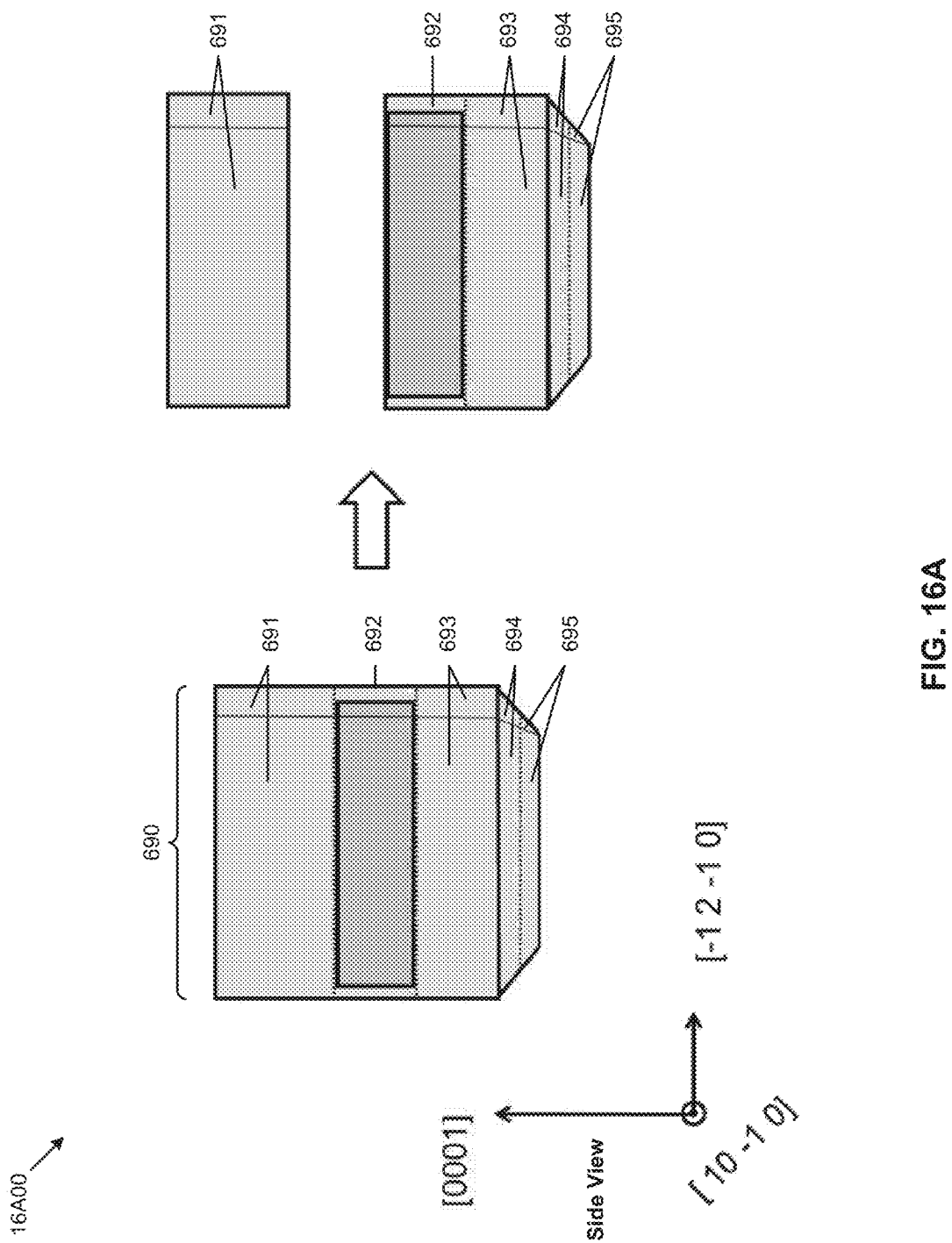

An example of the two-step operation is shown the simplified schematic diagrams 16A00, 16B00, 17A00, and 17B00) of FIG. 16A and FIG. 16B. Referring to FIG. 16A, in a first step, +c sector 691 is separated from m-region 692, the seed, and the balance of Ammonthermally-grown crystal 690 by wire-sawing or the like. Similar operations may be applied to separate −c sector 693 from m-region 692 and from first {10-1-1} region 694.

Referring to FIG. 16B, in a second step, higher-defect region 697 is removed from +c sector 691 by drilling, milling, laser drilling, or the like (upper arrow) or by saw-cutting (lower arrow).

Additional removal steps may also be required. For example, referring to FIG. 6A through FIG. 6F, it may be necessary to remove {10-1-1} region 694 from −c sector 693 and/or {10-11} region 696 from +c sectors 691 in addition to removal of higher-defect regions 697 and/or 695.

Referring again to FIG. 3A, dislocations and/or stacking faults may propagate in the m- and/or a-directions from proto-seed 130, forming regions 341 on the −c side of a-wing 340 and regions 351 on the +c side of a-wing 350 that may be contaminated with stacking faults and/or with significant concentrations of threading dislocations. Accordingly, in addition to the first step of separating wings 340 and 350 from proto-seed 130 (cf. FIG. 3B), a second step of removing higher-defect material may be applied, for example, by removing region 341 from a-wing 340 and/or by removing region 351 from a-wing 350 by sawing, slicing, cleaving, lapping, or the like. This second removal operation may be applied prior to re-growing on the severed wings to form an ultralow defect rhombus crystal 370 (cf. FIG. 3C).

The above described embodiments form ultralow-defect ammonothermal bulk GaN crystal from proto-seeds that may be large in the m- or a-directions but may have maximum c-dimensions less than about 5 millimeters, less than about 2 millimeters, or less than about 1 millimeter. In a certain embodiment, a proto-seed is formed whose maximum dimension lies in the c-direction.

Figure 7:
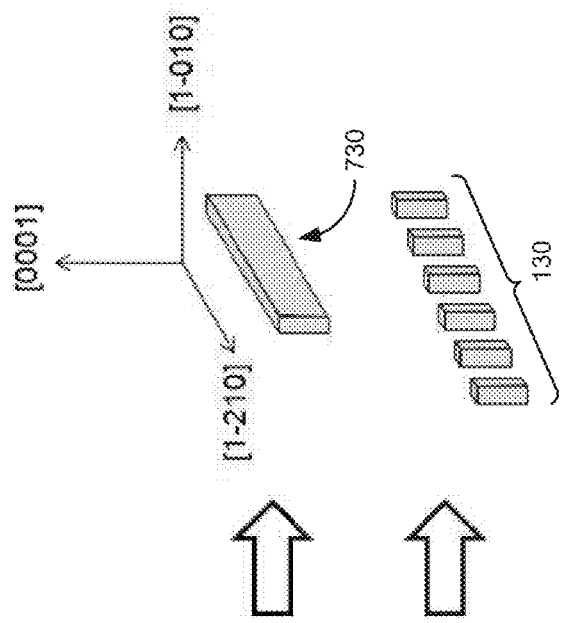
FIG. 7 is a simplified diagram illustrating a method of forming a proto-seed crystal according to an embodiment of the present disclosure.
Figure 7:
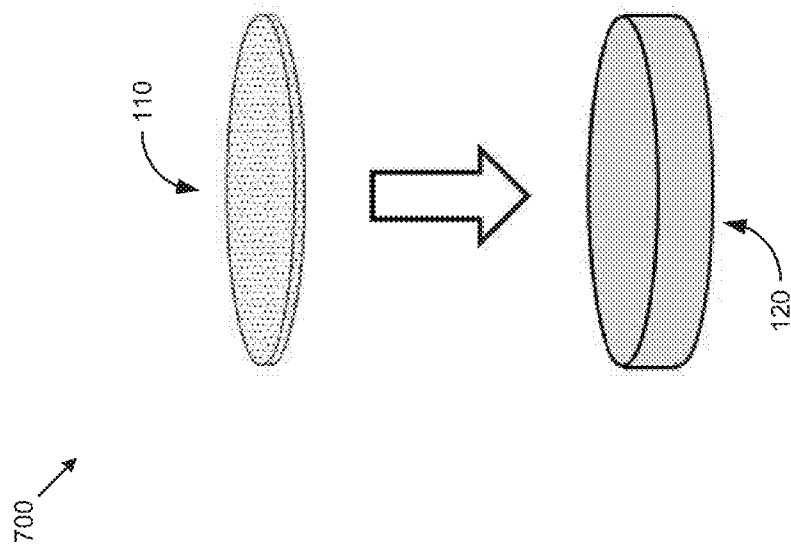

FIG. 7 is a simplified diagram 700 illustrating a method for forming a GaN proto-seed crystal. A thick GaN layer is grown on substrate 110 using hydride vapor phase epitaxy (HVPE) or another method that is known in the art, forming boule 120. In a specific embodiment, boule 120 has a c-plane orientation and is at least 5 millimeters, at least 10 millimeters, at least 15 millimeters, or at least 20 millimeters thick. Substrate 110 and boule 120 may have a diameter that is larger than 25 millimeters, larger than 50 millimeters, larger than 100 millimeters, larger than 150 millimeters, larger than 200 millimeters, or larger than 300 millimeters. Boule 120 may be separated from substrate 110 by self-separation, by laser lift-off, by void-assisted separation, by selective dissolution of substrate 110, or by another method that is known in the art.

One or more proto-seeds 130 may be prepared from boule 120 by sawing, slicing, cleaving, or the like. In certain embodiments, sawcutting is performed substantially parallel to an a-direction, creating strips 730 with long {10-10} surfaces. In some embodiments, the long surfaces prepared by the saw-cutting operation have a crystallographic orientation within 10 degrees, within 5 degrees, within 2 degrees, or within 1 degree of an m-plane, {10-10} orientation. In certain embodiments, additional sawing, slicing, cleaving, or the like is performed to form proto-seeds 130 whose longest dimension is parallel to the c-direction. In some embodiments, one or more surfaces are lapped, polished, electrochemically polished, photoelectrochemically polished, reactive-ion-etched, and/or chemical-mechanically polished. The small-area ends of the proto-seeds may have a c-plane, (0001) or (000-1), orientation. The proto-seed may contain several crystallites separated by low-angle grain boundaries but may be substantially free from coalescence fronts of the type observed in epitaxial lateral overgrowth.

Under certain ammonothermal growth conditions, growth in the a-direction occurs more rapidly than growth in the m-direction and a-oriented edges on nonpolar or semipolar seed crystal grow themselves out relatively quickly. Under such conditions we find that dislocations and/or stacking faults may propagate in ammonothermally-grown GaN during both vertical growth and lateral growth in certain directions. However, as shown schematically in FIG. 8, propagation and/or generation of dislocations and stacking faults is reduced significantly in other directions, leading to formation of bulk GaN material with dislocation densities below about $10^5$ cm$^{-2}$, below about $10^4$ cm$^{-2}$, below about $10^3$ cm$^{-2}$, or below about $10^2$ cm$^{-2}$. In addition, surprisingly, the stacking fault density in these sectors is below about $10^3$ cm$^{-1}$, below about $10^2$ cm$^{-1}$, below about $10^1$ cm$^{-1}$, or below about $10^0$ cm$^{-1}$. The low-defect sectors are located in the vicinity of the boundaries between adjacent m-plane facets. However, substantial regions between these boundaries may have substantial concentrations of threading dislocations and/or stacking faults and may be removed for preparation of large-area, ultralow-defect GaN material.

Figure 8:
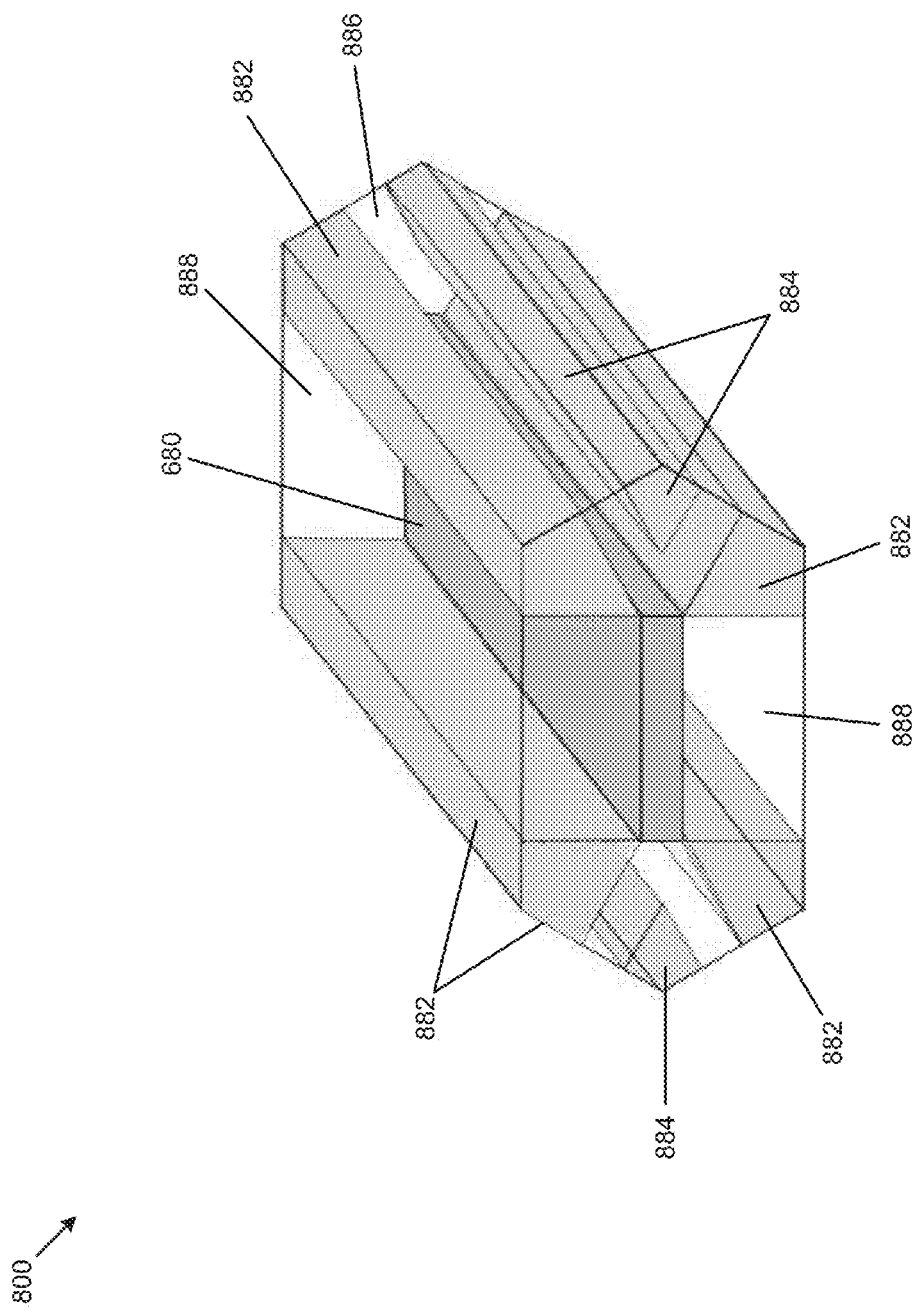
FIG. 8 is a simplified diagram showing a perspective view of a crystal growth process for forming growth sectors that have very low concentrations of stacking faults and have ultralow dislocation densities according to an embodiment of the present disclosure.

Referring to FIG. 8, for simplicity only the material in crystal 800 that has been grown in the m- and a-directions with respect to seed 680 is shown, and possible +c, −c, {10-11}, and {10-1-1} sectors are not shown. M-m'-sectors 882 between vertically-grown m-surfaces and newly-formed m-surfaces, and m'-m'-sectors 884, between adjacent newly-formed m-surfaces, may have a dislocation density below about $10^5$ cm$^{-2}$, below about $10^4$ cm$^{-2}$, below about $10^3$ cm$^{-2}$, or below about $10^2$ cm$^{-2}$, and a stacking-fault concentration below about $10^3$ cm$^{-1}$, below about $10^2$ cm$^{-1}$, or below about $10^1$ cm$^{-1}$. However, regions 886, grown laterally from seed 680 and intermediate in position between sectors 882 and 884 may have a dislocation density above about $10^3$ cm$^{-2}$ and a stacking-fault density above about 10 cm$^{-1}$. Similarly, regions 888, grown vertically, in the m-direction, with respect to seed crystal 680, may have a stacking fault concentration above 10 cm$^{-1}$ and a dislocation density above about $10^3$ cm$^{-2}$.

Ultra-low defect crystals may be prepared from crystal 800 by a two-step operation comprising separation of a growth sector from crystal 800 and removal of residual material containing a higher concentration of threading dislocations and/or stacking faults. For example, referring again to FIG. 8, a first step may comprise sawing, slicing, cleaving, or the like along boundaries between m-regions 888 (including seed crystal 680) and sectors 882 to separate ultralow-defect sectors 882 and 884 from m-region 888 and from the seed crystal.

Then, a second step may comprise removal of higher-defect regions 886 from ultralow-defect sectors 882 and 884. Removal of higher-defect regions 886 may be carried out by saw-cutting parallel to higher-defect regions 886 and/or substantially through the higher-defect regions. Additional removal steps may also be required.

Figure 17A:
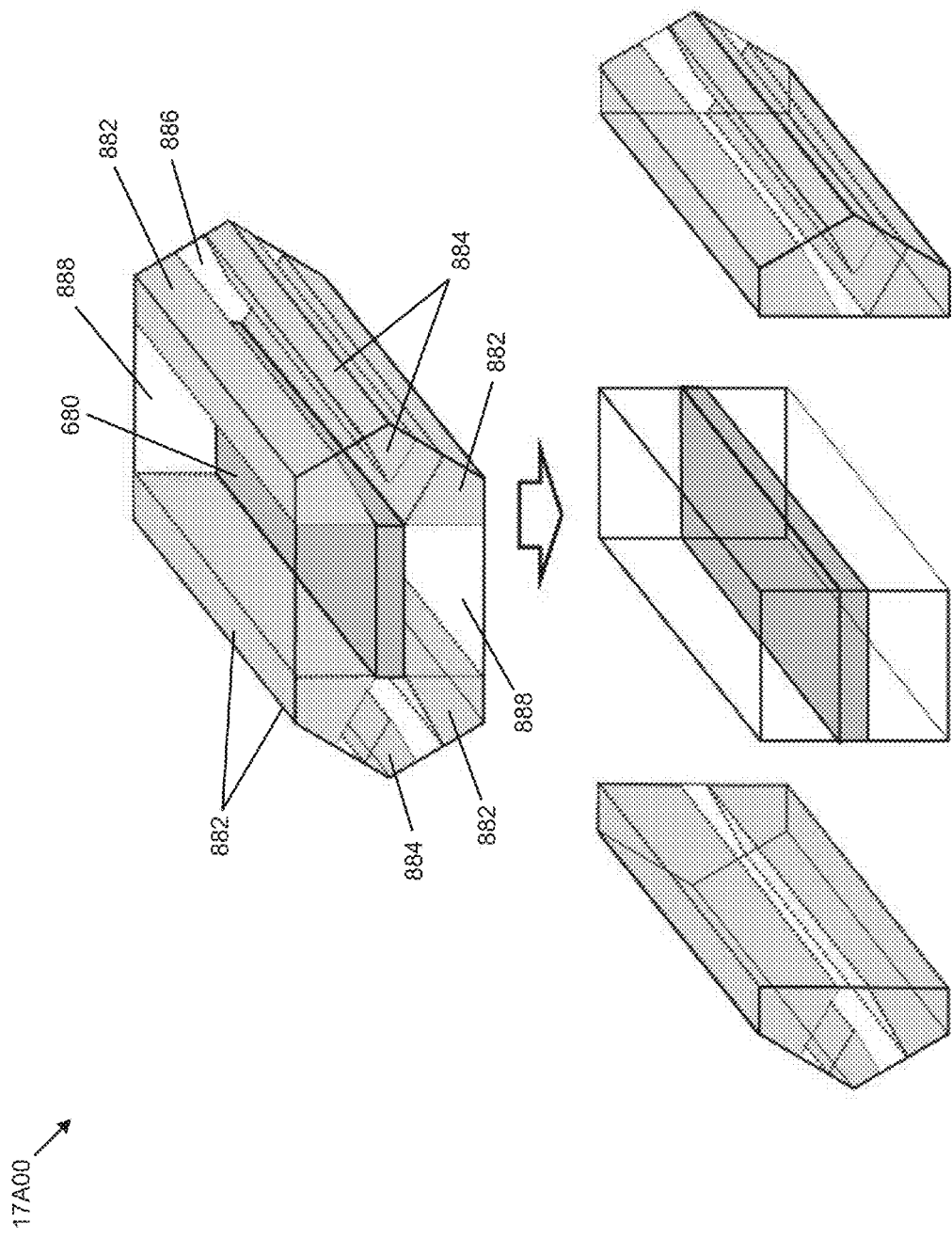

For example, referring to FIG. 17A, in a first step, an m/a-wing comprising sectors 882 and 884 and region 886 may be separated from the body of the crystal by sawing, cleaving, slicing, or the like. Then, referring to FIG. 17B, in a second step, sectors 882 and 884 may be separated from higher-defect concentration region 886 of the separated m/a-wing by sawing, cleaving, slicing, or the like.

Ultralow defect gallium-containing nitride crystals prepared by a two (or more) step separation from an ammonothermally grown gallium-containing nitride crystal may have a maximum dimension between about 1 millimeter and about 100 millimeters, between about 3 millimeters and about 25 millimeters, greater than about 5 millimeters, or between about 5 millimeters and about 15 millimeters, and a minimum dimension greater than about 0.1 millimeter.

In certain embodiments, an ultralow defect crystal is lapped, polished, electrochemically polished, photoelectrochemically polished, reactive-ion-etched, and/or chemical-mechanically polished according to methods that are known in the art. In another specific embodiment, an ultralow defect crystal is sliced along a predetermined crystallographic orientation to form one or more wafers. The wafers may be lapped, polished, electrochemically polished, photoelectrochemically polished, reactive-ion-etched, and/or chemical-mechanically polished according to methods that are known in the art.

Figure 9:
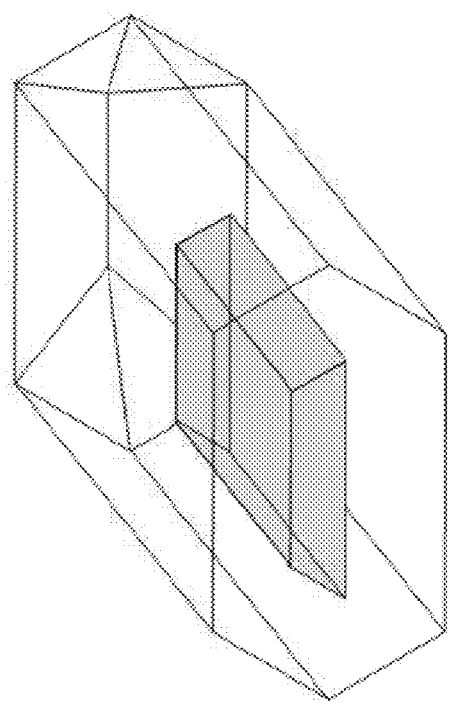
FIG. 9 and FIG. 10 are simplified diagrams showing a perspective view of a crystal growth process for forming crystals that have very low concentrations of stacking faults and have ultralow dislocation densities according to an embodiment of the present disclosure.
Figure 9:
Figure 9:
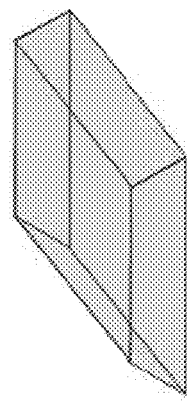
Figure 10:
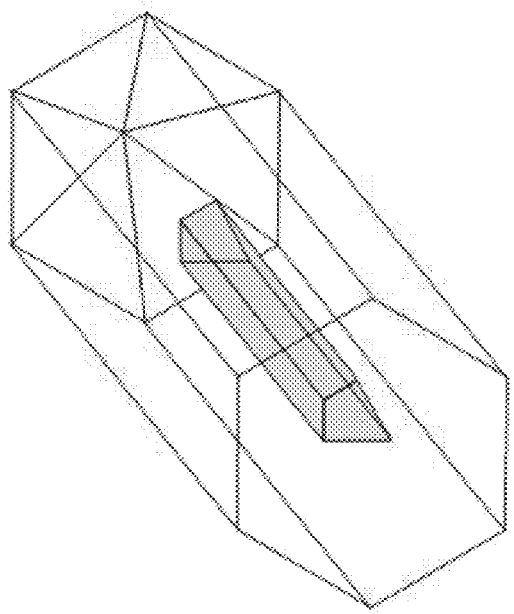
Figure 10:
Figure 10:
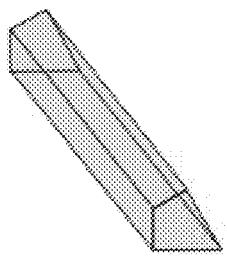

In certain embodiments, an ultralow defect crystal or a wafer formed therefrom is then used as a seed crystal or substrate for further bulk crystal growth, for example, for ammonothermal growth, for flux growth, or for HVPE growth. For example, FIG. 9 shows an illustration 900 of a process by which an ultralow defect crystal comprising a ±c-sector may be grown into an enlarged, 3-dimensional, ultralow defect boule. FIG. 10 shows an illustration 1000 of a process by which an ultralow defect crystal comprising a sector derived from an m/a-wing may be grown into an enlarged, 3-dimensional, ultralow defect boule. Some dislocations may form at or near the interface between the ultralow defect crystal and the newly grown GaN material and propagate in the growth direction. However, their concentration is relatively low, for example, below about $10^5$ cm$^{-2}$, below about $10^4$ cm$^{-2}$, below about $10^3$ cm$^{-2}$, below about $10^2$ cm$^2$, or below about 10 cm$^{-2}$. The three-dimensional, grown crystal retains the ultralow defect character of the seeds, having a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$. on each of the exposed faces, including c-plane, m-plane, {10-1-1}, and {10-11}, if present. This process may be repeated—the ultralow defect boule, or crystals or wafers prepared from it, may be used as a seed crystal for further bulk crystal growth to form a further-enlarged ultralow defect boule.

The ultralow crystal or boule may be terminated predominantly by two large m faces, by at least two smaller m faces, by at least one smaller c face, and by at least two semipolar {10-1±1} faces. The area of each of the two largest m faces may be larger, by a factor of at least 3, at least 5, at least 10, at least 20, or at least 30, than the at least one c face. The total area of each of two smaller m faces may be equal, to within a factor of 1.5, a factor of 2, or a factor of 3, to the total area of the +c and −c faces. The total area of the semipolar {10-1-1} faces may be larger, by a factor of at least 1.5, a factor of at least 2, or a factor of at least 3, than the total area of the {10-11} faces.

The ultralow defect boule may have a maximum dimension between about 5 millimeters and about 200 millimeters and a minimum dimension between about 1 millimeter and about 50 millimeters.

In certain embodiments, the enlarged, ultralow defect boule or crystal is then sliced into one or more wafers. The slicing may be performed by multi-wire sawing, multi-wire slurry sawing, slicing, inner-diameter sawing, outer-diameter sawing, cleaving, ion implantation followed by exfoliation, or the like. One or both large area surfaces of the ultralow defect wafers may be lapped, polished, and/or chemical-mechanically polished. The ultralow defect wafers may have a large-area crystallographic orientation within 5 degrees, within 2 degrees, or within 1 degree of (0001) +c-plane, (000-1) −c-plane, {10-10} m-plane, {11-2±2} semipolar, {60-6±1} semipolar, {50-5±1} semipolar, {40-4±1} semipolar, 30-3±1 semipolar, {50-5±2} semipolar, {70-7±3} semipolar, {20-2±1} semipolar, {30-3±2} semipolar, {40-4±3} semipolar, {50-5±4} semipolar, or {10-1±1}semipolar. The ultralow defect wafers may have an (h k i l) semipolar large-area surface orientation, where i=−(h+k) and l and at least one of h and k are nonzero. The large-area surfaces of the ultralow defect wafer may have a maximum dimension between about 5 millimeters and about 200 millimeters and a minimum dimension between about 1 millimeter and about 200 millimeters and the wafer may have a thickness between about 10 micrometers and about 10 millimeters, or between about 200 micrometers and about 2 millimeters.

The ultralow defect crystals or wafers disclosed herein may be essentially free of stacking faults and have a very low concentration of threading dislocations throughout their volume. The ultralow defect crystals or wafers may have a maximum dimension greater than about 25 millimeters, greater than about 50 millimeters, greater than about 75 millimeters, greater than about 100 millimeters, greater than about 150 millimeters, greater than about 200 millimeters, or greater than about 250 millimeters.

In certain embodiments, a large-area surface of an ultralow defect crystal or wafer has a crystallographic orientation that is miscut from {10-10} m-plane by between about −60 degrees and about +60 degrees toward [0001] +c-direction and by up to about 10 degrees toward an orthogonal <1-210> a-direction. In certain embodiments, a large-area surface of the ultralow defect crystal or wafer has a crystallographic orientation that is miscut from {10-10} m-plane by between about −30 degrees and about +30 degrees toward [0001] +c-direction and by up to about 5 degrees toward an orthogonal <1-210> a-direction. In certain embodiments, a large-area surface of the ultralow defect crystal or wafer has a crystallographic orientation that is miscut from {10-10} m-plane by between about −5 degrees and about +5 degrees toward [0001] +c-direction and by up to about 1 degree toward an orthogonal <1-210> a-direction. The ultralow defect wafer may have a stacking fault concentration below $10^2$ $cm^{-1}$, below 10 $cm^{-1}$, or below 1 $cm^{-1}$, and a very low dislocation density, below about $10^5$ $cm^{-2}$, below about $10^4$ $cm^{-2}$, below about $10^3$ $cm^{-2}$, below about $10^2$ $cm^{-2}$, or below about 10 $cm^{-2}$ on each of two large area surfaces.

In certain embodiments, a large-area surface of the ultralow defect crystal or wafer has a crystallographic orientation within about 5 degrees of (0001) +c-plane or within about 5 degrees of (000-1) −c-plane. An m-plane surface prepared from the ultralow defect c-plane crystal or wafer may have a stacking fault concentration below $10^2$ $cm^{-1}$, below 10 $cm^{-1}$, or below 1 $cm^{-1}$, and a very low dislocation density, below about $10^5$ $cm^{-2}$, below about $10^4$ $cm^{-2}$, below about $10^3$ $cm^{-2}$, below about $10^2$ $cm^{-2}$, or below about 10 $cm^{-2}$. An m-plane surface prepared from the ultralow-defect c-plane crystal or wafer may have a surface area of at least 3 square millimeters and may be entirely free of stacking faults.

In cases where the surface orientation of the ultralow defect wafer is m-plane or semipolar, miscut from m towards −c, the concentrations of threading dislocations and stacking faults may be quantified by subjecting the wafer to etching in $H_3PO_4$, in $H_3PO_4$ that has been conditioned by prolonged heat treatment to form polyphosphoric acid, in $H_2SO_4$, or in a solution comprising one or more of these species at temperatures between about 100 degrees Celsius and about 500 degrees Celsius for times between about 5 minutes and about 5 hours. The ultralow defect wafers may have a symmetric x-ray rocking curve full width at half maximum (FWHM) less than about 100 arc sec, less than about 50 arc sec, less than about 35 arc sec, less than about 25 arc sec, or less than about 15 arc sec. The ultralow defect wafers may have a crystallographic radius of curvature greater than 0.1 meter, greater than 1 meter, greater than 10 meters, greater than 100 meters, or greater than 1000 meters, in at least one, at least two, or in three independent or orthogonal directions. In certain embodiments, the top and bottom surfaces of the ultralow defect wafer may have impurity concentrations of O, H, C, Na, and K between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, below $1 \times 10^{16}$ $cm^{-3}$, and below $1 \times 10^{16}$ $cm^{-3}$, respectively, as quantified by calibrated secondary ion mass spectrometry (SIMS). In another embodiment, the top and bottom surfaces of the ultralow defect wafer may have impurity concentrations of O, H, C, and at least one of Na and K between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, and between about $3 \times 10^{15}$ $cm^{-3}$ and $1 \times 10^{18}$ $cm^{-3}$, respectively, as quantified by calibrated secondary ion mass spectrometry (SIMS). In still another embodiment, the top and bottom surfaces of the ultralow defect wafer may have impurity concentrations of O, H, C, and at least one of F and Cl between about $1 \times 10^{16}$ $cm^{-3}$ and $1 \times 10^{19}$ $cm^{-3}$, between about $1 \times 10^{16}$ $cm^{-3}$ and $2 \times 10^{19}$ $cm^{-3}$, below $1 \times 10^{17}$ $cm^{-3}$, and between about $1 \times 10^{15}$ $cm^{-3}$ and $1 \times 10^{17}$ $cm^{-3}$, respectively, as quantified by calibrated secondary ion mass spectrometry (SIMS). In some embodiments, the top and bottom surfaces of the ultralow defect wafer may have impurity concentrations of H between about $5 \times 10^{17}$ $cm^{-3}$ and $1 \times 10^{19}$ $cm^{-3}$, as quantified by calibrated secondary ion mass spectrometry (SIMS). In a specific embodiment, the ultralow defect wafer has an infrared absorption peak at about 3175 $cm^{-1}$, with an absorbance per unit thickness of greater than about 0.01 $cm^{-1}$.

Figure 11:
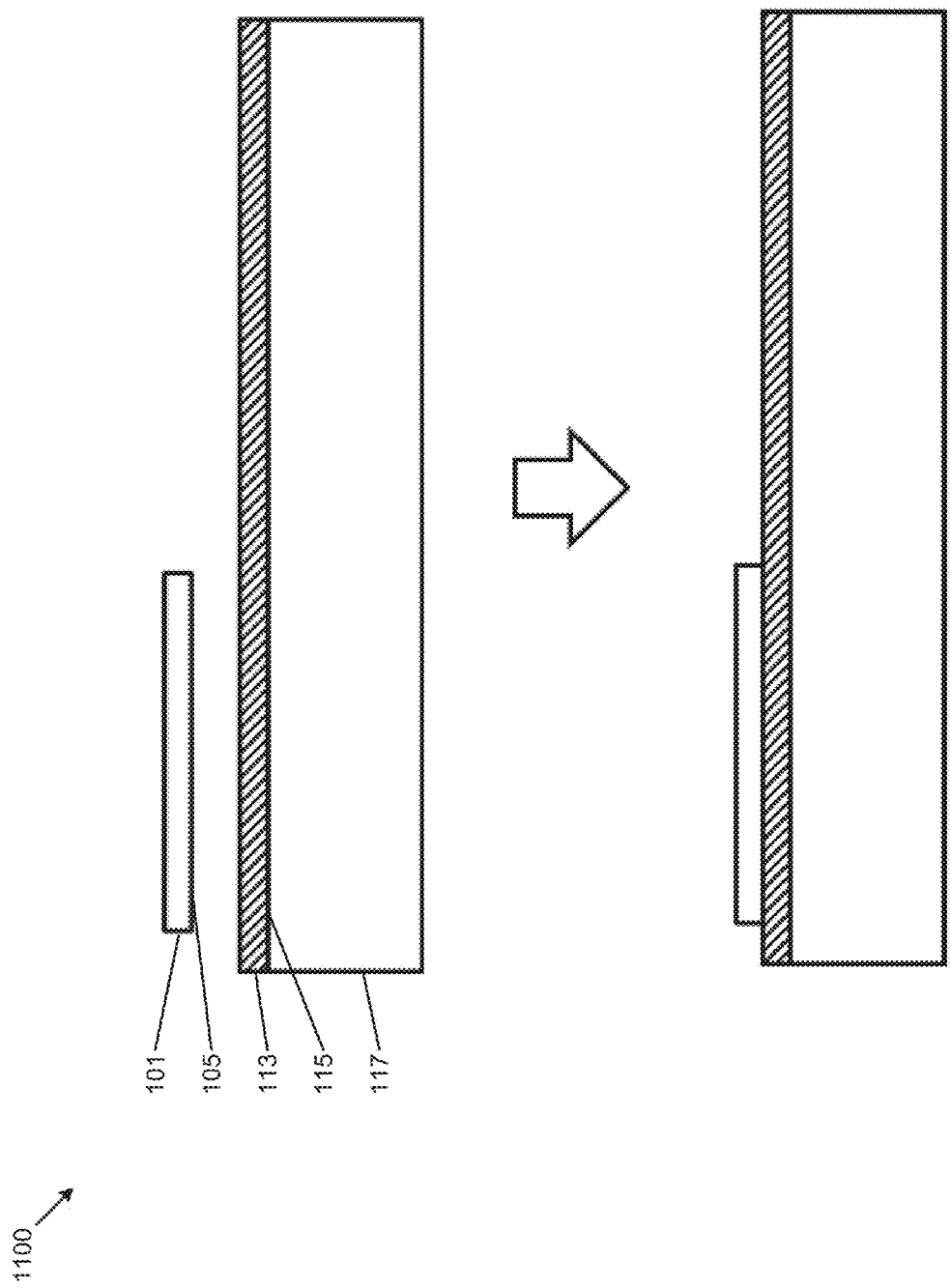
FIG. 11 is a simplified diagram illustrating a method for bonding of a crystal to a handle substrate according to an embodiment of the present disclosure.

In certain embodiments, two or more ultralow defect wafers or crystals are tiled to form a mosaic composite and then coalesced to form a larger, ultralow defect crystal. Referring to the simplified diagram 1100 of FIG. 11, in some embodiments, at least one edge, at least two edges, or at least three edges of ultralow defect wafer 101 are as-grown. In some embodiments, at least one edge, at least two edges, or at least three edges of ultralow defect wafer or crystal 101 are cleaved. In some embodiments, at least one edge, at least two edges, or at least three edges of ultralow defect wafer 101 are sawed, ground, lapped, polished, and/or etched, for example, by reactive ion etching (RIE) or inductively-coupled plasma (ICP). In one specific embodiment, one or more edges of the surface of ultralow defect wafer 101 are defined by etching one or more trenches in a larger crystal. In some embodiments, at least one edge, at least two edges, or at least three edges of ultralow defect wafer 101 have a {1 0 –1 0} m-plane orientation. In one specific embodiment, ultralow defect wafer 101 has a substantially hexagonal shape. In another specific embodiment, ultralow defect wafer 101 has a substantially rhombus or half-rhombus shape. In still other embodiments, ultralow defect wafer 101 is substantially rectangular. In one specific embodiment, ultralow defect wafer 101 has a (0 0 0 1) +c-plane edge and a (0 0 0 –1) –c-plane edge. In yet another specific embodiment, ultralow defect wafer 101 has two {1 0 –1 0} edges. In certain embodiments, surface 105 of ultralow defect wafer 101 has an orientation within about 0.5 degree, within about 0.2 degree, within about 0.1 degree, or within about 0.05 degree of (0001) +c-plane, (000-1) –c plane, {10-10} m-plane, {10-1-1} semipolar, or {10-11} semipolar. In certain embodiment first surface 105 of ultralow defect wafer 101 is prepared by chemical-mechanical polishing of an as-grown surface without grinding, lapping, or mechanical polishing with a hard abrasive such as diamond power, silicon carbide powder, or alumina powder.

Referring again to FIG. 11, a handle substrate 117 having a surface 115 is provided. Handle substrate 117 may comprise a single crystal, polycrystalline or amorphous material. Handle substrate 117 may comprise sapphire, aluminum oxide, mullite, silicon, silicon nitride, germanium, gallium arsenide, silicon carbide, $MgAl_2O_4$ spinel, zinc oxide, indium phosphide, gallium nitride, indium nitride, gallium aluminum indium nitride, or aluminum nitride. Handle substrate 117 may comprise substantially the same composition as crystal 101. In one specific embodiment, handle substrate 117 comprises crystals that have been merged or tiled together using another method. For example, handle substrate 117 may be formed using at least one of the tiling methods disclosed by Dwilinski et al., U.S. Patent Application No. 2008/0156254 or the method disclosed in U.S. patent application Ser. No. 12/635,645. In one specific embodiment, handle substrate 117 comprises substantially the same composition as crystal 101 and has a crystallographic orientation within about 10 degrees, within about 5 degrees, within about 2 degrees, or within about 1 degree of that of crystal 101. Handle substrate 117 may comprise a glass. Handle substrate 117 may comprise an oxide of at least one of Si, Ge, Sn, Pb, B, Al, Ga, In, Tl, P, As, Sb, Pb, Li, Na, K, Rb, Cs, Mg, Ca, Sr, Ba, Y, Ti, Zr, Hf, Mn, Zn, or Cd. In one specific embodiment, handle substrate 117 comprises borophosphosilicate glass. Handle substrate 117 may have a thermal expansion coefficient parallel to surface 115 between room temperature and about 700 degrees Celsius that is between about $2.5 \times 10^{-6}$ $K^{-1}$ and about $7 \times 10^{-6}$ $K^{-1}$. Handle substrate 117 may have a thermal expansion coefficient parallel to surface 115 between room temperature and about 700 degrees Celsius that is between about $5.5 \times 10^{-6}$ $K^{-1}$ and about $6.5 \times 10^{-6}$ $K^{-1}$. Handle substrate 117 may have a softening point, that is, where its viscosity has a value of about $10^8$ Poise, at a temperature between about 500 degrees Celsius and about 1400 degrees Celsius. Handle substrate 117 may have a glass transition temperature between about 600 degrees Celsius and about 1200 degrees Celsius. Handle substrate 117 may have a softening point, that is, where its viscosity has a value of about $10^8$ Poise, at a temperature between about 600 degrees Celsius and about 900 degrees Celsius. Surface 115 may be optically flat, with a deviation from flatness less than 1 micrometer, less than 0.5 micrometer, less than 0.2 micrometer, less than 0.1 micrometer, or less than 0.05 micrometer. Surface 115 may be very smooth, with a root-mean-square roughness less than 5 nanometers, less than 2 nanometers, less than 1 nanometer, less than 0.5 nanometer, less than 0.2 nanometer, less than 0.1 nanometer, or less than 0.05 nanometer, measured over an area of at least 10 micrometers×10 micrometers.

An adhesion layer 113 may be deposited on surface 115 of handle substrate 117. Adhesion layer 113 may comprise at least one of $SiO_2$, $GeO_2$, $SiN_x$, $AlN_x$, or B, Al, Si, P, Zn, Ga, Si, Ge, Au, Ag, Ni, Ti, Cr, Zn, Cd, In, Sn, Sb, Tl, or Pb, or an oxide, nitride, or oxynitride thereof. Adhesion layer 113 may further comprise hydrogen. The adhesion layer 113 may be deposited by thermal evaporation, electron-beam evaporation, sputtering, chemical vapor deposition, plasma-enhanced chemical vapor deposition, or the like, or by thermal oxidation of a deposited metallic film. The thickness of adhesion layer 113 may between about 1 nanometer and about 10 micrometers, or between about 10 nanometers and about 1 micrometer. Adhesion layer 113 may comprise a non-homogenous composition. In some embodiments, adhesion layer 113 comprises a stack of thin films of varying compositions or a film of graded or continuously-varying composition. In some embodiments, adhesion layer 113 or at least one thin film contained within is laterally non-uniform. In some embodiments, adhesion layer 113 or at least one thin film contained within comprises an array of dots, squares, rectangle, lines, a grid pattern, or the like. The composition of adhesion layer 113 may be chosen so as to undergo nascent melting at a temperature below about 300 degrees Celsius, below about 400 degrees Celsius, or below about 500 degrees Celsius. The composition of adhesion layer 113 may be chosen so as to have a melting point above about 600 degrees Celsius, above about 700 degrees Celsius, above about 800 degrees Celsius, or above about 900 degrees Celsius. The composition and structure of adhesion layer 113 may be chosen so as to undergo nascent melting at a temperature below about 300 degrees Celsius, below about 400 degrees Celsius, below about 500 degrees Celsius, or below about 600 degrees Celsius, then, following a thermal treatment at a temperature below the solidus temperature, to remain unmelted, or with a volume fraction of melt below about 20%, below about 10%, or below about 5%, at a temperature above about 600 degrees Celsius, above about 700 degrees Celsius, above about 800 degrees Celsius, or above about 900 degrees Celsius. In some embodiments, an adhesion layer is deposited on surface 105 of nitride crystal 101. The adhesion layer(s) may be annealed, for example, to a temperature between about 300 degrees Celsius and about 1000 degrees Celsius. In some embodiments, at least one adhesion layer is chemical-mechanically polished. In a specific embodiment, the root-mean-square surface roughness of at least one adhesion layer is below about 0.5 nanometer, or below about 0.3 nanometer over a 20×20 $\mu m^2$ area.

Referring again to FIG. 11, surface 105 of ultralow defect wafer 101, or an adhesion layer placed thereupon, is placed in contact with adhesion layer 113 and/or with the surface 115 of the handle substrate 117 and bonded. In one specific embodiment, the bonding comprises wafer bonding. In another specific embodiment, the bonding comprises a eutectic die attach or die bonding operation. In a specific embodiment, the bonding operation is performed in a clean room type environment, with less than 10,000, less than 1,000, less than 100, or less than 10 particles per cubic centimeter in the air. Particles may be removed from at least one of the surfaces immediately prior to bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, surface 105, or the surface of an adhesion layer placed thereupon, and surface 113 or surface 115 are brought into contact while immersed in a liquid. Optionally, at least one of the surfaces is exposed to a plasma to enhance bonding.

The positional and orientational accuracy of the placement of ultralow defect wafer 101 with respect to handle substrate 117 may be precisely controlled. In one specific embodiment ultralow defect wafer is placed on handle substrate 117 by a pick and place machine, or robot, or a die attach tool. Ultralow defect wafer 101 may be picked up by a vacuum chuck, translated to the desired position above handle substrate 117 by a stepper-motor-driven x-y stage, re-oriented, if necessary, by a digital-camera-driven rotational drive, and lowered onto the handle substrate. The positional accuracy of placement may be better than 50 micrometers, better than 30 micrometers, better than 20 micrometers, better than 10 micrometers, or better than 5 micrometers. The orientational accuracy of placement may be better than 5 degrees, better than 2 degrees, better than 1 degree, better than 0.5 degree, better than 0.2 degree, better than 0.1 degree, better than 0.05 degree, better than 0.02 degree, or better than 0.01 degree. In some embodiments, the azimuthal crystallographic orientations of ultralow defect wafer 101 and handle substrate 117 are equivalent to within about 10 degrees, within about 5 degrees, within about 2 degrees, or within about 1 degree.

Ultralow defect wafer or crystal 101 may be pressed against handle substrate 117 with a pressure between about 0.1 megapascals and about 100 megapascals. In some embodiments, van der Waals forces or capillarity associated with nascent melting of the adhesion layer(s) are sufficient to obtain a good bond and very little or no additional applied force is necessary. Ultralow defect wafer 101 and handle substrate 117 may be heated to a temperature between about 30 degrees Celsius and about 950 degrees Celsius, between about 30 degrees Celsius and about 400 degrees Celsius, between about 30 degrees Celsius and about 200 degrees Celsius to strengthen the bond. In some embodiments, heating of ultralow defect wafer 101 and handle substrate 117 is performed while they are placed in mechanical contact and/or mechanically loaded against one another.

Figure 12:
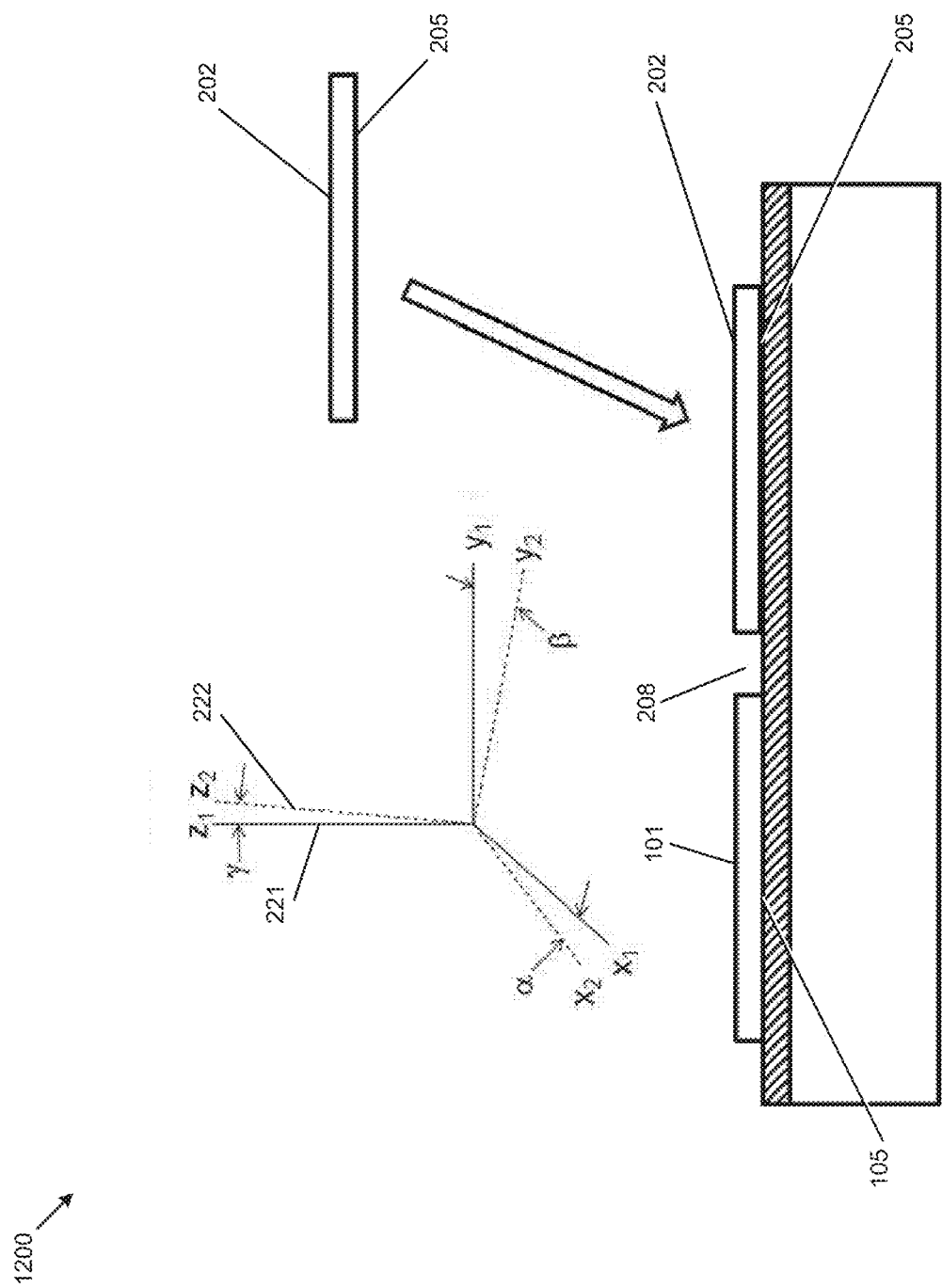
FIG. 12 is a diagram illustrating the crystallographic misorientation between two adjacent crystals bonded to a handle substrate according to an embodiment of the present disclosure.

Referring to the simplified diagram 1200 of FIG. 12, the wafer bonding process is repeated. A second ultralow defect wafer or crystal 202 is bonded in close proximity to the first ultralow defect wafer or crystal 101. The second crystal 202 has a surface 205 whose crystallographic orientation is essentially identical to that of surface 105 of the crystal 101. In some embodiments, accurate equality between the surface orientation of the first and second crystals is achieved by growing each crystal to an accurately flat on-axis orientation, for example, (0 0 0 1) Ga-polar, (0 0 0 −1) N-polar, {1 0 −1 0} non-polar, or {1 0 −1 ±1} semi-polar. If the first and/or second nitride crystals are polished, dry-etched, or chemical-mechanically polished, care is taken so as not to significantly alter the surface orientation of either. For example, the crystallographic orientations of first surfaces 105 and 205, respectively, of the outermost surfaces on the first and second crystals may be identical to less than 0.5 degree, less than 0.2 degree, less than 0.1 degree, less than 0.05 degree, less than 0.02 degree, or less than 0.01 degree. In still other embodiments, accurate equality between the surface orientation of the first and second nitride crystals is achieved by very careful crystallographic orientation and grinding and/or polishing, for example, using a high-precision goniometer. Gap 208 between the edges of two or more adjacent nitride crystals or proximate portions thereof may be less than 1 millimeter, less than 100 micrometers, less than 50 micrometers, less than 20 micrometers, less than 10 micrometers, less than 5 micrometers, less than 2 micrometers, or less than 1 micrometer. The wafer bonding process may be repeated more than two, more than 4, more than 8, more than 16, more than 32, or more than 64 times.

The placement of the second nitride crystal is performed in such a way that the crystallographic orientations of the first crystal and the second crystal are very nearly identical. Referring again to FIG. 12, coordinate system 221 ($x_1$ $y_1$ $z_1$) represents the crystallographic orientation of the first crystal 101, where $z_1$ is the negative surface normal of the nominal orientation of surface 105 and $x_1$ and $y_1$ are vectors that are orthogonal to $z_1$. For example, if surface 105 has a (0 0 0 1) orientation, then $z_1$ is a unit vector along [0 0 0 −1], and $x_1$ and $y_1$ may be chosen to be along [1 0 −1,0] and [1 −2 1 0], respectively. If surface 105 has a (1 0 −1 0) orientation, then $z_1$ is a unit vector along [−1 0 1 0] and $x_1$ and $y_1$ may be chosen to be along [1-2 1 0] and [0 0 0 1], respectively. Similarly, coordinate system 222 ($x_2$ $y_2$ $z_2$) represents the crystallographic orientation of the second crystal 202, where $z_2$ is the negative surface normal of the nominal orientation of surface 205 (cf. FIG. 1) and $x_2$ and $y_2$ are vectors that are orthogonal to $z_2$, where the same convention is used for the crystallographic directions corresponding to ($x_2$ $y_2$ $z_2$) as for ($x_1$ $y_1$ $z_1$). The crystallographic misorientation between the first crystal 101 and the second crystal 202 may be specified by the three angles $\alpha$, $\beta$, and $\gamma$, where $\alpha$ is the angle between $x_1$ and $x_2$, $\beta$ is the angle between $y_1$ and $y_2$, and $\gamma$ is the angle between $z_1$ and $z_2$. Because the surface orientations of the first and second nitride crystals are nearly identical, the polar misorientation angle $\gamma$ is very small, for example, less than 0.5 degree, less than 0.2 degree, less than 0.1 degree, less than 0.05 degree, less than 0.02 degree, or less than 0.01 degree. Because of the precise control in the orientation of the nitride crystal during placement, the misorientation angles $\alpha$ and $\beta$ are also very small, for example, less than 1 degree, less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The crystallographic misorientation between additional, adjacent crystals is similarly very small.

Figure 13:
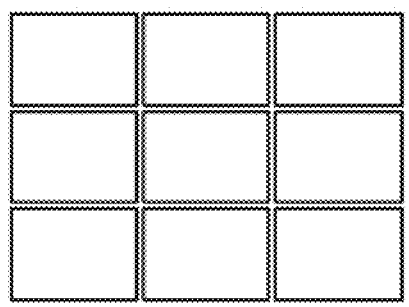
FIG. 13 is a simplified diagram illustrating arrangements of tiled crystals according to an embodiment of the present disclosure.
Figure 13:
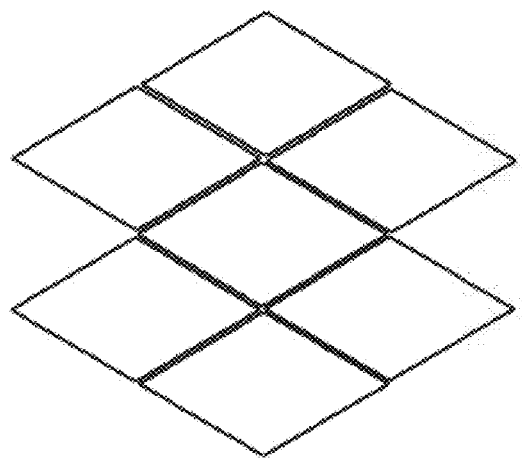
Figure 13:
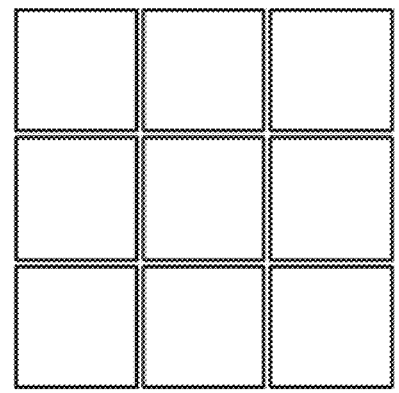
Figure 13:
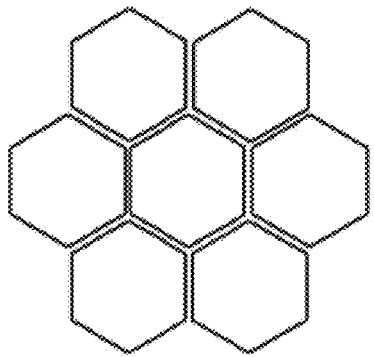

Referring to the simplified diagram 1300 of FIG. 13, after placing and wafer bonding a number of similarly-sized and similarly-shaped crystals, a tiled arrangement of ultralow defect crystals or wafers may be formed, with each adjacent pair on the handle substrate being accurately aligned crystallographically with its neighbor(s). The tiling pattern may be (a) square, (b) rectangular, (c) hexagonal, (d) rhombal, or (e) irregular. Other arrangements are also possible. For example, crystals may be tiled to form a one-dimensional mosaic pattern, for example, with tiling performed along the ±c direction, the m-direction, or the a-direction, rather than a two-dimensional array as in FIG. 13. The gaps between the edges of two or more adjacent crystals may be less than 1 millimeter, less than 100 micrometers, less than 50 micrometers, less than 20 micrometers, less than 10 micrometers, less than 5 micrometers, less than 2 micrometers, or less than 1 micrometer.

The two or more tiled crystals bonded to the handle substrate may be prepared for fusion of the tiled crystals into a single larger crystal. The lateral crystal growth may be achieved by techniques such as metallorganic chemical vapor deposition (MOCVD), hydride vapor phase epitaxy (HVPE), ammonothermal crystal growth, or crystal growth from a flux.

Figure 14:
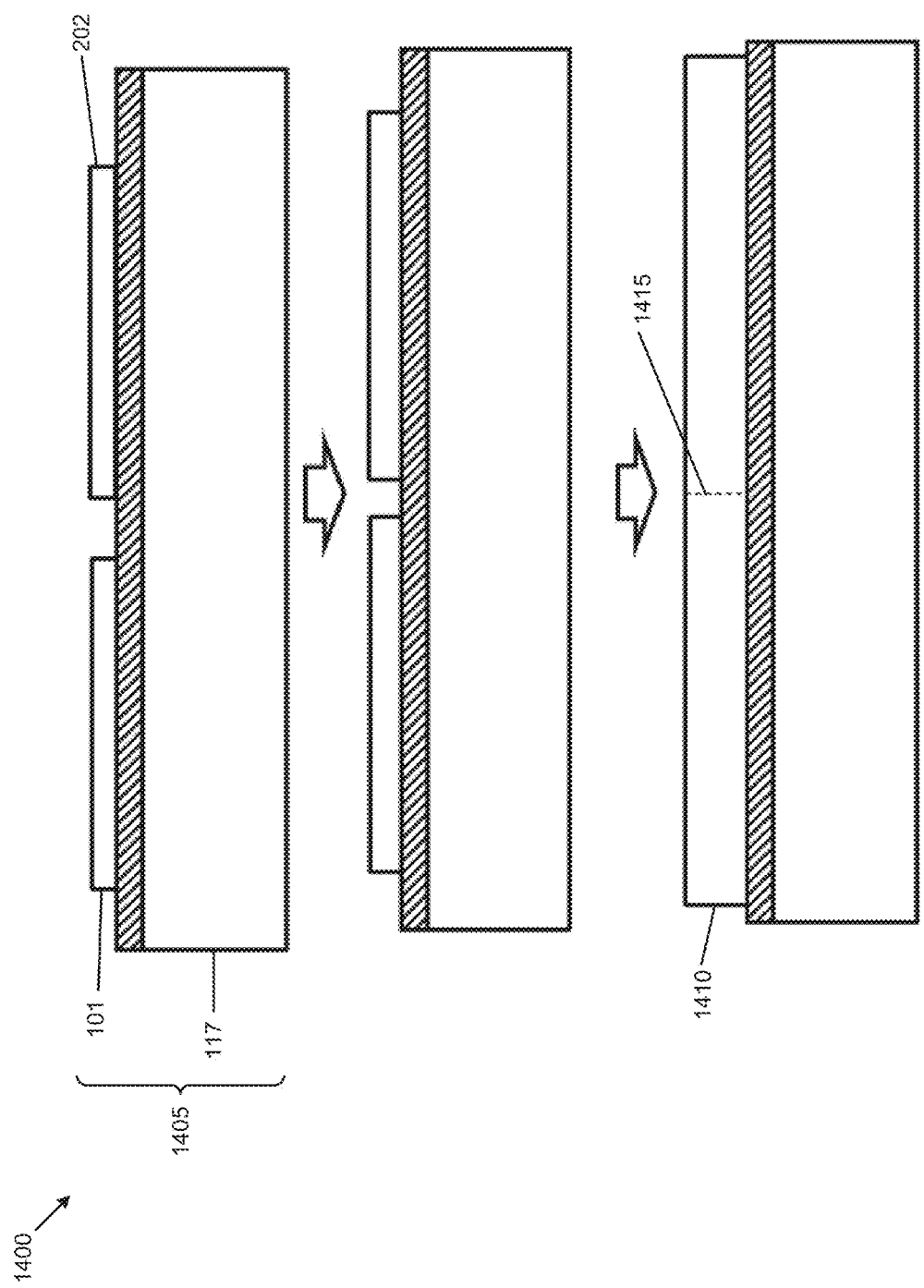
FIG. 14 is a simplified diagram illustrating a method for coalescence of bonded crystals according to an embodiment of the present disclosure.

In some embodiments, the handle substrate is suitable for exposure to the epitaxial growth environment without further treatment. In some embodiments, a thermal treatment may be applied to increase the melting point of the adhesion layer(s). Referring to the simplified diagram 1400 of FIG. 14, mosaic substrate 1405 may be used as a substrate for epitaxial nitride growth by MOCVD, HVPE, ammonothermal growth, or flux growth. Growth is performed as known in the art, and the at least two nitride crystals 101 and 202 grow both laterally and vertically to form a merged nitride crystal 1410. Because of the very low crystallographic misorientation between nitride crystals 101 and 202, the coalescence front 1415 may have a modest concentration of dislocations but a classical low angle grain boundary or tilt boundary may be difficult to detect.

The merged crystal 1410 may be grown to a thickness greater than 5 micrometers, greater than 50 micrometers, greater than 0.5 millimeters, greater than 5 millimeters, or greater than 10 millimeters. After cooling and removal from the reactor, the merged crystal may be separated from the handle substrate. The handle substrate may be dissolved or etched away, for example, by placing in contact with an acid, a base, or a molten flux, preferably in a way that produces negligible etching or other damage to the merged nitride crystal. Alternatively, the handle substrate may be sawed off of the merged crystal. After removal of the handle substrate, one or more surface of the merged nitride crystal may be lapped, polished, and/or chemical-mechanically polished. The merged nitride crystal may be sliced (sawed, polished, and/or chemical-mechanically polished) into one or more wafers.

Figure 15:
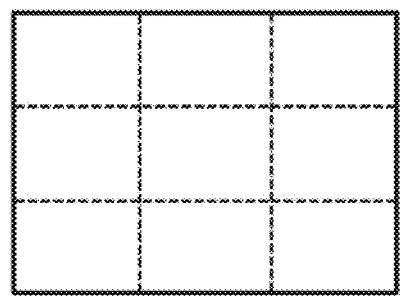
FIG. 15A, FIG. 15B, FIG. 15C, and FIG. 15D are a simplified diagrams illustrating a merged crystal according to an embodiment of the present disclosure.
Figure 15:
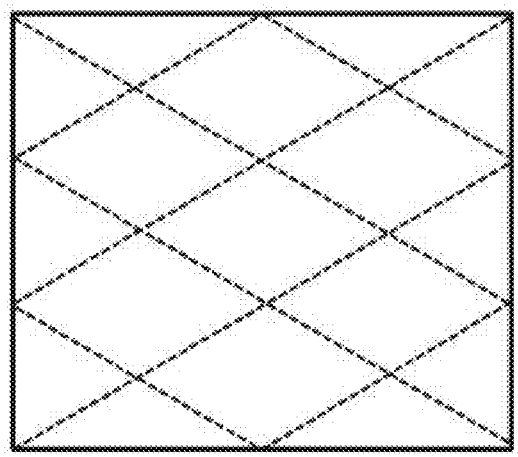
Figure 15:
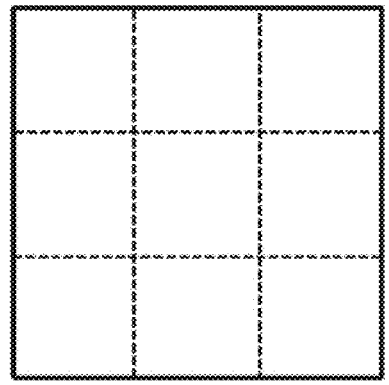
Figure 15:
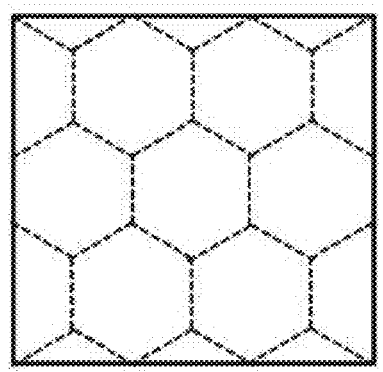

Referring to the simplified diagram 1500 of FIG. 15, the merged ultralow defect crystal, or wafers prepared from it, may comprise two or more domains separated by one or more lines of dislocations. Depending on the geometry of the original crystals, the pattern of domains may be (a) square, (b) rectangular, (c) hexagonal, or (d) rhombal. Other patterns are also possible. The polar misorientation angle $\gamma$ between adjacent domains may be less than 0.5 degree, less than 0.2 degree, less than 0.1 degree, less than 0.05 degree, less than 0.02 degree, or less than 0.01 degree. The misorientation angles $\alpha$ and $\beta$ between adjacent domains may be less than 1 degree, less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The density of dislocations along the lines between adjacent domains may be less than $5\times10^5$ cm$^{-1}$, less than $2\times10^5$ cm$^{-1}$, less than $1\times10^5$ cm$^{-1}$, less than $5\times10^4$ cm$^{-1}$, less than $2\times10^4$ cm$^{-1}$, less than $1\times10^3$ cm$^{-1}$, less than $5\times10^3$ cm$^{-1}$, less than $2\times10^3$ cm$^{-1}$, or less than $1\times10^3$ cm$^{-1}$. The density of dislocations along the lines between adjacent domains may be greater than 50 cm$^{-1}$, greater than 100 cm$^{-1}$, greater than 200 cm$^{-1}$, greater than 500 cm$^{-1}$, greater than 1000 cm$^{-1}$, greater than 2000 cm$^{-1}$, or greater than 5000 cm$^{-1}$.

Within individual domains, the merged ultralow defect crystal, or wafers prepared from it, may have a surface dislocation density less than about $10^4$ cm$^{-2}$, less than about $10^3$ cm$^{-2}$, or less than about $10^2$ cm$^{-2}$. The domains may have a stacking-fault concentration below $10^3$ cm$^{-1}$, below $10^2$ cm$^{-1}$, below 10 cm$^{-1}$ or below 1 cm$^{-1}$. The merged ultralow defect crystal, or wafers prepared from it, may have a symmetric x-ray rocking curve full width at half maximum (FWHM) less than about 100 arc sec, less than about 50 arc sec, less than about 35 arc sec, less than about 25 arc sec, or less than about 15 arc sec. The merged ultralow defect crystal, or wafers prepared from it, may have a thickness between about 100 micrometers and about 100 millimeters, or between about 1 millimeter and about 10 millimeters. The merged ultralow defect crystal, or wafers prepared from it, may have a diameter of at least about 5 millimeters, at least about 10 millimeters, at least about 15 millimeters, at least about 20 millimeters, at least about 25 millimeters, at least about 35 millimeters, at least about 50 millimeters, at least about 75 millimeters, at least about 100 millimeters, at least about 150 millimeters, at least about 200 millimeters, or at least about 400 millimeters. A large-area surface of the merged ultralow defect crystal, or wafers prepared from it, may have a crystallographic orientation within 5 degrees, within 2 degrees, within 1 degree, within 0.5 degree, within 0.2 degree, within 0.1 degree, within 0.05 degree, within 0.02 degree, or within 0.01 degree of (0 0 0 1) Ga-polar, (0 0 0 –1) N-polar, {1 0 –1 0} non-polar, or {1 1 –2 0} non-polar a-plane. The surface of the merged ultralow defect crystal, or wafers prepared from it, may have a (h k i l) semi-polar orientation, where i=–(h+k) and l and at least one of h and k are nonzero. In a specific embodiment, the crystallographic orientation of the merged nitride crystal is within 5 degrees, within 2 degrees, within 1 degree, within 0.5 degree, within 0.2 degree, within 0.1 degree, within 0.05 degree, within 0.02 degree, or within 0.01 degree of {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0 –1 ±2}, {1 0 –1 ±3}, {2 1 –3 ±1}, or {3 0 –3 ±4}. A large-area surface of merged ultralow defect crystal, or wafers prepared from it, may have a crystallographic orientation that is miscut from {10-10} m-plane by between about –60 degrees and about +60 degrees toward [0001] +c-direction and by up to about 10 degrees toward an orthogonal <1-210> a-direction. A large-area surface of merged ultralow defect crystal, or wafers prepared from it, may have a crystallographic orientation that is miscut from {10-10} m-plane by between about –30 degrees and about +30 degrees toward [0001]+c-direction and by up to about 5 degrees toward an orthogonal <1-210> a-direction. A large-area surface of merged ultralow defect crystal, or wafers prepared from it, may have a crystallographic orientation that is miscut from {10-10} m-plane by between about –5 degrees and about +5 degrees toward [0001] +c-direction and by up to about 1 degree toward an orthogonal <1-210> a-direction. The merged ultralow defect crystal, or a wafer prepared from it, has a minimum lateral dimension of at least four millimeters. In some embodiments, the merged ultralow defect crystal, or a wafer prepared from it, has a minimum lateral dimension of at least one centimeter, at least two centimeters, at least three centimeters, at least four centimeters, at least five centimeters, at least six centimeters, at least eight centimeters, at least ten centimeters, or at least twenty centimeters.

Additional details of the tiling process may be found in U.S. Application Publication No. 2012/0000415, which is incorporated by reference in its entirety.

The ultralow defect crystal or wafer may be characterized by a wurtzite structure substantially free from any cubic entities or other crystal structures, the other structures being less than about 0.1% in volume in reference to the substantially wurtzite structure. In certain embodiments, a substantially wurtzite crystal structure comprises greater than about 98% volume wurzite structure, greater than about 99% volume wurzite structure, and in certain embodiments, greater than about 99.5% volume wurtzite structure. The ultralow defect crystal or wafer may have impurity concentrations of O, H, C, Na, and K below about $1\times10^{17}$ cm$^{-3}$, $2\times10^{17}$ cm$^{-3}$, $1\times10^{17}$ cm$^{-3}$, $1\times10^{16}$ cm$^{-3}$, and $1\times10^{16}$ cm$^{-3}$, respectively, as quantified by calibrated secondary ion mass spectrometry (SIMS), glow discharge mass spectrometry (GDMS), interstitial gas analysis (IGA), or the like. The ultralow defect crystal or wafer may have impurity concentrations of O, H, C, Na, and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, the ultralow defect crystal or wafer may have impurity concentrations of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS).

In still another embodiment, the ultralow defect crystal or wafer may have impurity concentrations of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS).

In some embodiments, the ultralow defect crystal or wafer is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, polished, and/or chemically-mechanically polished into wafers by methods that are known in the art. The surface of the ultralow defect wafer may be characterized by a root-mean-square surface roughness measured over a 10-micrometer by 10-micrometer area that is less than about 1 nanometer.

The ultralow defect wafer may be incorporated into a semiconductor structure. The semiconductor structure may comprise at least one $Al_xIn_yGa_{(1-x-y)}N$ epitaxial layer, where $0 \leq x, y, x+y \leq 1$. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ cm$^{-2}$, a substantial fraction of $0.1\times0.1$ mm$^2$ devices could be expected to be free of dislocations. At a dislocation density of $10^2$ cm$^{-2}$, a substantial fraction of $1\times1$ mm$^2$ devices could be expected to be free of dislocations. The gallium-nitride-based electronic or optoelectronic device may be entirely free of stacking faults throughout its volume. For example, at a stacking fault density of 1 cm$^{-1}$, a substantial fraction of $10\times1$ mm$^2$ stripe-shaped devices, such as laser diodes with nonpolar or semipolar large area surfaces and c-plane facets, could be expected to be free of stacking faults.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A c-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 41.8 grams of polycrystalline GaN nutrient, 2.6 grams of NH$_4$F mineralizer, and 30.0 grams of ammonia and the capsule was sealed. The capsule was placed in an internally-heated high pressure apparatus and heated to temperatures of approximately 647 degrees Celsius for the upper, nutrient zone and approximately 665 degrees Celsius for the lower, crystal growth zone, maintained at these temperatures for approximately 45 hours, and then cooled and removed. The crystal, which grew to a thickness of approximately 1.6 millimeters, was then examined under a microscope. The crystal was then etched in conditioned H$_3$PO$_4$ in a beaker, stirred at 130 revolutions per minute, at a hot plate temperature of approximately 350 degrees Celsius for 30 minutes. The conditioned H$_3$PO$_4$ was prepared by heating 150 milliliters of reagent-grade (85%) H$_3$PO$_4$ in a beaker, stirred at 70 revolutions per minute, at a hot plate temperature of approximately 450 degrees Celsius for one hour. The etched crystal was then examined under a microscope. The c-plane surface of the a-wings were very smooth, with very few etch pits, indicating a very low dislocation density, in agreement with FIG. 4A and FIG. 4B. However, inspection of the m-plane edges of the crystal revealed an etch pit density of approximately $5\times10^5$ cm$^{-2}$ to $1\times10^6$ cm$^{-2}$, indicating a significant dislocation density, in agreement with FIG. 4B.

Example 2

An m-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 49.0 grams of polycrystalline GaN nutrient, 2.6 grams of NH$_4$F mineralizer, and 29.2 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 45 hours, and then cooled and removed. The crystal, which grew to a thickness of approximately 1.4 millimeters, was then lapped at an angle of approximately 3.7 degrees to allow for examination of the GaN material properties as a function of thickness above the interface with the HVPE seed crystal, and the freshly prepared surface, mis-oriented by 3.7 degrees from (10-10) toward [000-1], was chemical-mechanically polished. The crystal was then etched in conditioned $H_3PO_4$ in a beaker, stirred at 130 revolutions per minute, at a hot plate temperature of approximately 350 degrees Celsius for 60 minutes. The conditioned $H_3PO_4$ was prepared by heating 150 milliliters of reagent-grade (85%) $H_3PO_4$ in a beaker, stirred at 70 revolutions per minute, at a hot plate temperature of approximately 450 degrees Celsius for one hour. The etched crystal was then examined under a microscope.

The exposed surface of the seed crystal had a dislocation (etch pit) density of approximately $5 \times 10^5$ $cm^{-2}$ and no observable stacking faults. The dislocation (etch pit) density of the ammonothermally-grown layer varied from approximately $2 \times 10^5$ over much of its thickness to a high of approximately $2 \times 10^6$ $cm^{-2}$ at the thickest point above the seed, which occurred near the +c edge of the miscut sample. Since the thickness of the grown layer varies with lateral position above the seed crystal in an experiment such as this, it is possible or likely that the observed variation in dislocation density in the ammonothermally grown layer resulted principally from variations in the dislocation density in the seed crystal as a function of lateral position rather than from a systematic variation in dislocation density with layer thickness.

The stacking fault concentration in the ammonothermally grown layer increased from zero in the seed crystal to about 10 $cm^{-1}$ at a thickness of about 100 micrometers to about 50 $cm^{-1}$ at a thickness of about 400 micrometers. The average length of the faulted regions, which could readily be measured from the length of the linear etch features, increased from about 10 micrometers at a thickness of about 100 micrometers to about 100 micrometers at a thickness of about 400 micrometers. The number density of the stacking faults, without regard to their length, was approximately constant, at about $1.4 \times 10^4$ $cm^{-2}$, throughout the thickness of the ammonothermally grown layer. This constancy indicates that most or all of the stacking faults nucleated near the seed/layer interface and that the length of the stacking faults increased with growth thickness, with the half-angle between the surface normal and the partial dislocations that bound the stacking fault varying from about 0.6 degree to about 10 degrees.

Example 3

An m-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 35.9 grams of polycrystalline GaN nutrient, 2.6 grams of $NH_4F$ mineralizer, and 30.4 grams of ammonia and the capsule was sealed. The capsule was placed in an internally-heated high pressure apparatus and heated to temperatures of approximately 645 degrees Celsius for the upper, nutrient zone and approximately 665 degrees Celsius for the lower, crystal growth zone, maintained at these temperatures for approximately 40 hours, and then cooled and removed. The crystal grew to a thickness of approximately 0.8 millimeters. The crystal was then etched in conditioned $H_3PO_4$ in a beaker, stirred at 130 revolutions per minute, at a hot plate temperature of approximately 350 degrees Celsius for 60 minutes. The conditioned $H_3PO_4$ was prepared by heating 150 milliliters of reagent-grade (85%) $H_3PO_4$ in a beaker, stirred at 70 revolutions per minute, at a hot plate temperature of approximately 450 degrees Celsius for one hour. The etched crystal was then examined under a microscope.

The dislocation (etch pit) density in the central portion of the m-plane facets above the seed was above $1 \times 10^5$ $cm^{-2}$. The m-plane surfaces of the +c sector of the crystal had areas of approximately 479 square micrometers and approximately 764 square micrometers and had low concentrations of etch pits and were free of etch grooves. Excluding a region with a relatively high etch pit density, the etch pit density over much of the m-plane surfaces in the +c sector was below about $10^4$ $cm^{-2}$. Upper bounds to the stacking fault concentrations on the two m-plane surfaces in the +c sector are calculated as approximately 0.06 $cm^{-1}$ and 0.04 $cm^{-1}$, respectively.

Example 4

An m-plane oriented bulk GaN crystal grown by HVPE, approximately 0.3 millimeters thick, was provided for use as a seed crystal for ammonothermal growth. The seed crystal was placed inside a silver capsule along with a 15%-open-area baffle, approximately 38.6 grams of polycrystalline GaN nutrient, 2.6 grams of $NH_4F$ mineralizer, and 29.1 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The crystal grew to a thickness of approximately 1.1 millimeters. The crystal was then sawed with a diamond wire to separate a wafer of m-plane, ammonothermally-grown GaN from the HVPE seed crystal. The ammonothermally-grown GaN wafer was cleaned with HCl and with isopropanol.

The m-plane, ammonothermally-grown GaN wafer, approximately 0.23 millimeter thick, was provided for use as a seed crystal for further ammonothermal growth. The seed crystal was placed inside a silver capsule along with a 33%-open-area baffle, approximately 35.1 grams of polycrystalline GaN nutrient, 2.6 grams of $NH_4F$ mineralizer, and 30.4 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The crystal grew to a thickness of approximately 0.7 millimeters. The crystal was then etched in conditioned $H_3PO_4$ in a beaker, stirred at 130 revolutions per minute, at a hot plate temperature of approximately 350 degrees Celsius for 60 minutes. The conditioned $H_3PO_4$ was prepared by heating 150 milliliters of reagent-grade (85%) $H_3PO_4$ in a beaker, stirred at 70 revolutions per minute, at a hot plate temperature of approximately 450 degrees Celsius for one hour. The etched crystal was then examined under a microscope.

The dislocation (etch pit) density in the central portion of the m-plane facets above the original seed was approximately $2\text{-}3 \times 10^6$ $cm^{-2}$. The m-plane surfaces of the +c sector of the crystal had areas of approximately 615 square micrometers and approximately 487 square micrometers and had low concentrations of etch pits and were free of etch grooves. The dislocation densities on the two m-plane surfaces in the +c sector are calculated as approximately $6 \times 10^3$ $cm^{-2}$ and 1.2×

$10^4$ cm$^{-2}$, respectively. Upper bounds to the stacking fault concentrations on the two m-plane surfaces in the +c sector are calculated as approximately 0.03 cm$^{-1}$ and 0.04 cm$^{-1}$, respectively.

Example 5

An m-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 41.3 grams of polycrystalline GaN nutrient, 2.6 grams of NH$_4$F mineralizer, and 29.8 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 45 hours, and then cooled and removed. The crystal grew to a thickness of approximately 1.4 millimeters. The crystal was then etched in conditioned H$_3$PO$_4$ in a beaker, stirred at 130 revolutions per minute, at a hot plate temperature of approximately 350 degrees Celsius for 60 minutes. The conditioned H$_3$PO$_4$ was prepared by heating 150 milliliters of reagent-grade (85%) H$_3$PO$_4$ in a beaker, stirred at 70 revolutions per minute, at a hot plate temperature of approximately 450 degrees Celsius for one hour. The etched crystal was then examined under a microscope.

The dislocation (etch pit) density in the central portion of the m-plane facets above the seed was approximately $4 \times 10^5$ cm$^{-2}$. The dislocation (etch pit) density in the central portion of the newly-formed m-planes, located laterally from the a-edge of the seed, ranged from about $5 \times 10^5$ cm$^{-2}$ to about $3 \times 10^6$ cm$^{-2}$. The stacking-fault density in the central portion of central portion of the newly-formed m-planes, located laterally from the a-edge of the seed, ranged from about 20 cm$^{-1}$ to about 300 cm$^{-1}$. The stacking-fault density near the intersection between two m-planes (m-m' or m'-m' sectors) ranged from about 0.7 cm$^{-1}$ to about 4 cm$^{-1}$.

Example 6

An m-plane oriented bulk GaN crystal grown by HVPE, approximately 0.3 millimeters thick, was provided for use as a seed crystal for ammonothermal growth. The seed crystal was placed inside a silver capsule along with a 33%-open-area baffle, approximately 46.8 grams of polycrystalline GaN nutrient, 1.8 grams of NH$_4$F mineralizer, and 30.0 grams of ammonia and the capsule was sealed. The capsule was placed in an internally-heated high pressure apparatus and heated to temperatures of approximately 650 degrees Celsius for the upper, nutrient zone and approximately 680 degrees Celsius for the lower, crystal growth zone, maintained at these temperatures for approximately 80 hours, and then cooled and removed. The crystal grew to a thickness of approximately 2.1 millimeters. The crystal was then etched in conditioned H$_3$PO$_4$ in a beaker, stirred at 130 revolutions per minute, at a hot plate temperature of approximately 350 degrees Celsius for 30 minutes. The conditioned H$_3$PO$_4$ was prepared by heating 150 milliliters of reagent-grade (85%) H$_3$PO$_4$ in a beaker, stirred at 70 revolutions per minute, at a hot plate temperature of approximately 450 degrees Celsius for one hour. The etched crystal was then examined under a microscope.

The dislocation (etch pit) density in the central portion of the m-plane facets above the seed was approximately $4 \times 10^5$ cm$^{-2}$. The dislocation (etch pit) density in the central portion of the newly-formed m-planes, located laterally from the a-edge of the seed, ranged from about $4 \times 10^5$ cm$^{-2}$ to about $7 \times 10^5$ cm$^{-2}$. The stacking-fault density in the central portion of the newly-formed m-planes, located laterally from the a-edge of the seed, ranged from about 50 cm$^{-1}$ to about 100 cm$^{-1}$. The dislocation (etch pit) density near the intersection between two m-planes (m-m' or m'-m' sectors) was between about $3 \times 10^4$ cm$^{-2}$ to about $3 \times 10^5$ cm$^{-2}$. The stacking-fault density near the intersection between two m-planes (m-m' or m'-m' sectors) was between about 0.01 cm$^{-1}$ to about 40 cm$^{-1}$.

Still further embodiments support method of making and method of use. Certain of the embodiments disclosed herein may be practiced in a variety of variations including, for example:

Embodiment 1. A method for forming an ultralow defect gallium-containing nitride crystal, comprising: providing a proto-seed, the proto-seed comprising a gallium-containing nitride crystal with a maximum length of at least 5 mm and a first thickness substantially orthogonal to a first direction of the maximum length and a second thickness orthogonal to the first direction of the maximum length, each of the first thickness and the second thickness being at least 0.1 mm; subjecting the proto-seed to an ammonothermal growth of a gallium based crystalline material to cause the proto-seed to grow in a second direction lateral to the first direction of maximum length by a distance of at least 1 mm to form at least one of an a-wing, a +c sector, a -c sector, an m-m' sector, and an m'-m' sector by lateral growth, the laterally-grown wing or sector being characterized by a dislocation density below about $10^4$ cm$^{-2}$ and a stacking fault concentration below about 10 cm$^{-1}$; performing a first operation to separate the laterally-grown wing or sector from a portion of the crystal comprising a dislocation density and/or stacking fault density that is higher than that of the laterally-grown wing or sector; performing a second operation to remove residual material containing a higher concentration of threading dislocations and/or stacking faults than the laterally-grown wing or sector.

Embodiment 2. The method of embodiment 1, wherein the ultralow defect gallium-containing nitride crystal has a maximum dimension greater than about 5 millimeters and a minimum dimension greater than about 0.1 millimeter Embodiment 3. The method of embodiment 1, wherein the ultralow defect gallium-containing nitride crystal has a dislocation density below about $10^3$ cm$^{-2}$.

Embodiment 4. The method of embodiment 1, wherein the ultralow defect gallium-containing nitride crystal has a stacking fault concentration below about 1 cm$^{-1}$.

Embodiment 5. The method of embodiment 1, wherein the ultralow defect gallium-containing nitride crystal has impurity concentrations of oxygen (O), hydrogen (H), and at least one of fluorine (F) and chlorine (Cl) between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, and between about $1 \times 10^{15}$ cm$^{-3}$ and $1 \times 10^{17}$ cm$^{-3}$, respectively.

Embodiment 6. The method of embodiment 1, wherein the ultralow defect gallium-containing nitride crystal has impurity concentrations of oxygen (O), hydrogen (H), and at least one of sodium (Na) and potassium (K) between about $1 \times 10^{16}$ cm$^{-3}$ and $1 \times 10^{19}$ cm$^{-3}$, between about $1 \times 10^{16}$ cm$^{-3}$ and $2 \times 10^{19}$ cm$^{-3}$, and between about $3 \times 10^{15}$ cm$^{-3}$ and $1 \times 10^{17}$ cm$^{-3}$, respectively.

Embodiment 7. The method of embodiment 1, further comprising forming at least one ultralow defect wafer from the ultralow defect gallium-containing nitride crystal.

Embodiment 8. The method of embodiment 7, further comprising: providing at least a second ultralow defect wafer; providing a handle substrate; bonding at least two ultralow defect wafers to the handle substrate, wherein the polar misorientation angle γ between the first crystal and the second crystal is less than 0.5 degree and azimuthal misorientation angles α and β are less than 1 degree; and growing the at least two ultralow defect wafers to cause a coalescence into a merged crystal.

Embodiment 9. The method of embodiment 1, further comprising:
using the ultralow defect crystal, or a wafer or portion prepared therefrom as a seed crystal for further bulk crystal growth; forming an enlarged, ultralow defect gallium-containing nitride crystal; and forming at least one ultralow defect wafer from the enlarged, ultralow defect gallium-containing nitride crystal.

Embodiment 10. The method of embodiment 9, further comprising incorporating the ultralow defect wafer into a semiconductor structure, wherein the semiconductor structure comprises at least one $Al_xIn_yGa_{(1-x-y)}N$ epitaxial layer, where $0 \le x, y, x+y \le 1$, and forms a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof.

Embodiment 11. A gallium-nitride-based electronic device or optoelectronic device, having lateral dimensions of at least 0.1 millimeter by 0.1 millimeter, that is free of stacking faults within its volume, as determined by etching one or more of a pre-existing m-plane surface and an m-plane surface prepared from the device in a solution comprising one or more of $H_3PO_4$, $H_3PO_4$ that has been conditioned by prolonged heat treatment to form polyphosphoric acid, and $H_2SO_4$, at temperatures between about 100 degrees Celsius and about 500 degrees Celsius for times between about 5 minutes and about 5 hours; wherein the processing temperature and time for the second etching process are selected so as to cause formation of m-plane etch pits with diameters between about 0.1 micrometer and about 25 micrometers with minimal overlap between etch features, and a (000-1) −c surface, if present, is protected by contact with an etch-resistant material such as, for example, Teflon®, during the etching process.

Embodiment 12. The gallium-nitride-based electronic device or optoelectronic device of embodiment 11, wherein the device has a maximum dimension of at least 8 millimeters and comprises a laser diode While the above is a full description of the specific embodiments, various modifications, alternative constructions and equivalents may be used. Therefore, the above description and illustrations should not be taken as limiting the scope of the present disclosure which is defined by the appended claims.

What is claimed is:

1. An ultralow defect gallium-containing nitride crystal comprising:
    gallium and nitrogen and having a wurtzite crystal structure;
    a first large area surface and a second large area surface being on the opposite sides of the crystal, and the first large area surface and the second large area surface being substantially parallel to one another and having a maximum dimension greater than about 10 millimeters; wherein
    the first large-area surface comprises a crystallographic orientation that is miscut from a {10-10} m-plane by between about −60 degrees and about +60 degrees toward a [0001]+c-direction and by up to about 10 degrees toward an orthogonal <1-210>a-direction;
    at least one of the first large area surface and the second large area surface is characterized by a dislocation density below about $10^4$ cm$^{-2}$ and by a stacking fault concentration below about 10 cm$^{-1}$, as determined by etching, in a solution comprising one or more of $H_3PO_4$, $H_3PO_4$ that has been conditioned by prolonged heat treatment to form polyphosphoric acid, and $H_2SO_4$, at a temperature between about 100 degrees Celsius and about 500 degrees Celsius for a time between about 5 minutes and about 5 hours; wherein the temperature and the time are selected so as to cause formation of etch pits with diameters between about 1 micrometer and about 25 micrometers; and
    the crystal comprises at least two single crystal domains having a gallium-containing nitride composition, wherein the at least two single crystal domains comprise a dislocation density within the domain less than about $10^4$ cm$^{-2}$, are separated by a line of dislocations with a linear density less than about $1 \times 10^5$ cm$^{-1}$, a polar misorientation angle γ between the first domain and the second domain is between about 0.01 degree and about 0.5 degree, and azimuthal misorientation angles α and β are between about 0.01 degree and about 1 degree.

2. The crystal of claim 1, wherein the second large-area surface comprises a crystallographic orientation that is miscut from a {10-10} m-plane by between about −60 degrees and about +60 degrees toward a [0001] +c-direction and by up to about 10 degrees toward an orthogonal <1-210>a-direction.

3. The crystal of claim 1, wherein the crystallographic orientation of the first large-area surface has a crystallographic orientation that is miscut form a {10-10} m-plane by between about −30 degrees and about +30 degrees toward a [0001] +c-direction and by up to about 5 degrees toward an orthogonal <1-210>a-direction.

4. The crystal of claim 1, wherein the crystallographic orientation of the first large-area surface is miscut from a {10-10} m-plane by between about −5 degrees and about +5 degrees toward a [0001] +c-direction and by up to about 1 degree toward an orthogonal <1-210>a-direction.

5. The crystal of claim 1, wherein the crystallographic orientation of the first large-area surface is within about 5 degrees of a semipolar orientation selected form a {60-6±1} plane, a {50-5±1} plane, a {40-4±1} plane, a {30-3±1} plane, a {50-5±2} plane, a {70-7±3} plane, a {20-2±1} plane, a {30-3±2} plane, a {40-4±3} plane, a {50-5±4} plane, a {10-1±1} plane, a {10-1±2} plane, and a {10-1±3} plane.

6. The crystal of claim 1, wherein the first large-area surface is characterized by an impurity concentration of oxygen (O) between about $1\times10^{16}$ cm$^{-3}$ and $1\times10^{19}$ cm$^{-3}$; an impurity concentration of hydrogen (H) between $1\times10^{16}$ cm$^{-3}$ and $2\times10^{19}$ cm$^{-3}$; and an impurity concentration of at least one of fluorine (F) and chlorine (Cl) between $1\times10^{15}$ cm$^{-3}$ and $1\times10^{17}$ cm$^{-3}$.

7. The crystal of claim 1, wherein the first large-area surface is characterized by an impurity concentration of oxygen (O) between about $1\times10^{16}$ cm$^{-3}$ and $1\times10^{19}$ cm$^{-3}$; an impurity concentration of hydrogen (H) between $1\times10^{16}$ cm$^{-3}$ and $2\times10^{19}$ cm$^{-3}$; and an impurity concentration of at least one of sodium (Na) and potassium (K) between about $3\times10^{15}$ cm$^{-3}$ and $1\times10^{18}$ cm$^{-3}$.

8. The crystal of claim 1, wherein the crystal comprises a substantially wurtzite structure that is substantially free of other crystal structures, the other crystal structures being less than about 1% in volume than a volume of the substantially wurzite structure.

9. The crystal of claim 1, wherein the first large-area surface comprises a root-mean-square surface roughness measured over a 10-micrometer by 10-micrometer area that is less than about 1 nanometer.

10. The crystal of claim 1, wherein at least one of the first large area surface and second large area surface is characterized by a dislocation density below about $10^3$ cm$^{-2}$ and by a stacking fault concentration below about 1 cm$^{-1}$.

11. The crystal of claim 1, further comprising a semiconductor structure fabricated on the first large area surface, the semiconductor structure comprising at least one $Al_xIn_yGa_{(1-x-y)}N$ epitaxial layer, wherein $0 \leq x, y, x+y \leq 1$.

\* \* \* \* \*